US008221906B2

(12) United States Patent
Schäfer et al.

(10) Patent No.: US 8,221,906 B2

(45) Date of Patent: Jul. 17, 2012

(54) ELECTROLUMINESCENT POLYMERS FOR ELECTRONIC APPLICATIONS

(75) Inventors: Thomas Schäfer, Liestal (CH); Peter Murer, Oberwil (CH); Tobias Hintermann, Therwil (CH); Beat Schmidhalter, Bubendorf (CH)

(73) Assignee: BASF SE, Ludwigshafen (DE)

( * ) Notice: Subject to any disclaimer, the term of this patent is extended or adjusted under 35 U.S.C. 154(b) by 443 days.

(21) Appl. No.: 12/309,090

(22) PCT Filed: Jul. 4, 2007

(86) PCT No.: PCT/EP2007/056702

§ 371 (c)(1), (2), (4) Date: Jan. 6, 2009

(87) PCT Pub. No.: WO2008/006743

PCT Pub. Date: Jan. 17, 2008

(65) Prior Publication Data

US 2009/0309068 A1 Dec. 17, 2009

(30) Foreign Application Priority Data

Jul. 14, 2006 (EP) .................................... 06117196

(51) Int. Cl.
*H01L 51/54* (2006.01)

(52) U.S. Cl. ........ 428/690; 428/917; 313/504; 313/505; 313/506; 257/40; 257/E51.05; 548/440; 564/426; 564/434; 544/234

(58) Field of Classification Search .................. 428/690, 428/917; 548/152, 440; 257/40, E51.05; 313/504, 505, 506; 564/426, 434; 544/234
See application file for complete search history.

(56) References Cited

U.S. PATENT DOCUMENTS 4,215,135 A 7/1980 Cherkofsky et al. .......... 424/273
5,281,489 A * 1/1994 Mori et al. .................... 428/690
2004/0077860 A1* 4/2004 Herron et al. ................ 544/353
2004/0209117 A1* 10/2004 Aziz et al. ..................... 428/690
2004/0234809 A1 11/2004 Chen et al. .................... 428/690
2007/0060736 A1 3/2007 Becker et al. ................... 528/86
2007/0205714 A1 9/2007 Busing et al. ................. 313/504

FOREIGN PATENT DOCUMENTS

JP 5-273618 10/1993
SU 1001855 2/1983
WO 2004/030029 4/1984
WO WO2004/099285 * 11/2004
WO 2005/014689 2/2005
WO 2005/104264 11/2005

OTHER PUBLICATIONS

Kwong et. al., Thermally Stable Hole-Transporting Material for Organic Light-Emitting Diode: an Isoindol Derivative, 2003, Chemical Materials, vol. 15, pp. 3148-3151.*
Patent Abstracts of Japan Pub. No. 05273618.
Sircar et al., Dyes derived from phenantraquinone. Part III, J. Chem. Soc., vol. 123, (1923) pp. 1559-1656.

* cited by examiner

*Primary Examiner* — Jennifer Chriss
*Assistant Examiner* — Gregory Clark
(74) *Attorney, Agent, or Firm* — Qi Zhuo

(57) ABSTRACT

The present invention relates to novel polymers comprising a repeating unit(s) of the formula (I) wherein at least one of the substituents $R^1$, $R^2$, $R^3$, $R^4$, $R^5$, $R^6$, and $R^7$ is a group -$(Sp)_x$ 1-HEI, wherein Sp is a spacer unit, HE1 is a group ($HE1^I$), which increases the hole-injection and/or hole-transport properties of the polymers; or a group ($HE1^{II}$), which increases the electron-injection and/or electron-transport properties of the polymers, or a group ($HE1^{III}$), which increases the hole-injection and/or hole-transport properties of the polymers and the electron-injection and/or electron-transport properties of the polymers, x1 is 0, or 1, and their use in electronic devices. The polymers according to the invention have excellent solubility in organic solvents and excellent film-forming properties. In addition, high charge carrier mobilities and high temperature stability of the emission color can be observed, if the polymers according to the invention are used in polymer light emitting diodes (PLEDs).

(I)

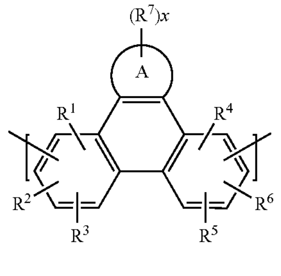

7 Claims, No Drawings

ELECTROLUMINESCENT POLYMERS FOR ELECTRONIC APPLICATIONS

The present invention relates to novel polymers comprising a repeating unit of the formula (I) and their use in electronic devices. The polymers according to the invention have excellent solubility in organic solvents and excellent film-forming properties. In addition, high charge carrier mobilities and high temperature stability of the emission color can be observed, if the polymers according to the invention are used in polymer light emitting diodes (PLEDs).

JP05273618 discloses phenanthroimidazole compounds which where used as antiinflammants. WO04016086 relates to the preparation of 2,4,5-trisubstituted imidazoles and their use as antibacterial and/or antifungal agents. Among others the following compound is explicitly mentioned in WO04016086:

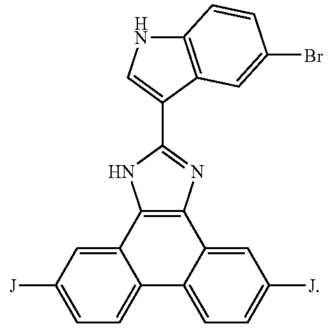

U.S. Pat. No. 4,215,135 relates to 2-substituted-1H-phenanthro[9,10-d]-imidazoles, which are useful as antiinflammatory agents. Among others the following compound is explicitly mentioned in U.S. Pat. No. 4,215,135:

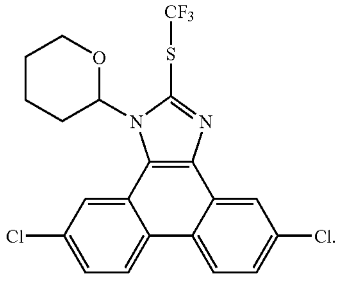

U.S. Pat. No. 3,635,544 relates to a photochromic polymer matrix, comprising the following compound

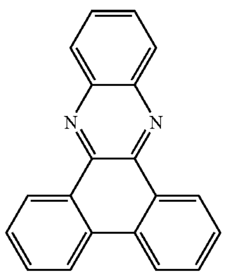

as light absorbing compound. JP09188874, JP09013025, JP07026255, JP06207169, US2004076853, WO2004043937, U.S. Pat. No. 6,713,781, WO2004006352, WO2003058667 and WO2004006355 disclose phenanthrene-fused or phenathroline-fused phenazines and their use in EL devices.

US2004209117 relates to an EL device, comprising an azole compound of the formula

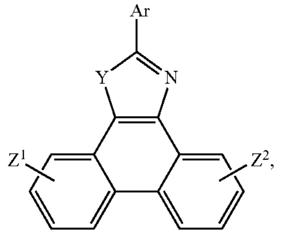

wherein Y is an atom or a group selected from the group consisting of O, S, and —N(R)—, wherein R is a hydrocarbyl group of from 1 to about 30 carbons; $Z^1$ and $Z^2$ are each a substituent selected from the group consisting of hydrogen, an alkyl group of from 1 to about 25 carbon atoms, an aryl group of about 6 to about 30 carbon atoms, an alkoxy group of from 1 to about 25 carbon atoms, a halogen, and a cyano group; and Ar is an aromatic component. JP2004161892, JP2002050473 and JP2001023777 disclose phenanthroimidazol compounds and their use in EL devices.

WO04/030029 relates to a photovoltaic EL cell, comprising polymers containing end chain groups:

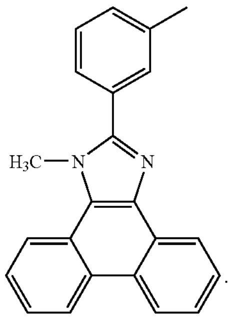

WO03/020790 relates to conjugated polymers comprising spirobifluorene units. The polymers can comprise repeating units derived from the following compound

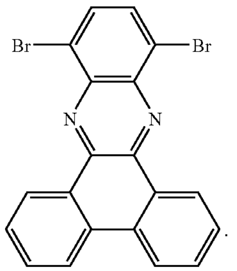

EP0757035A1 relates to phenanthrylenediamine derivatives represented by the general formula

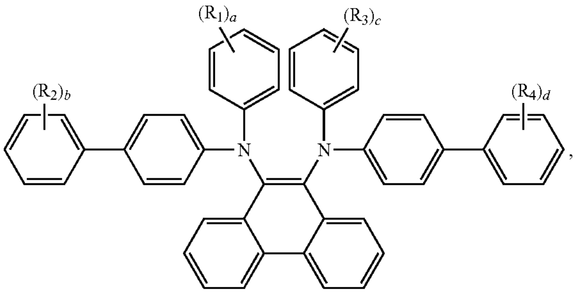

which are excellent in the electric charge transferring capability, the compatibility with a binding resin and the stability, thereby providing a photosensitive material which is highly sensitive and excellent in the durability.

US2001008711 relates to an organic light-emitting device comprising a light-emitting layer or a plurality of organic compound thin layers including a light-emitting layer formed between a pair of electrodes, wherein at least one layer comprises at least one kind of compound represented by the following formula $NR_{11}R_{12}R_{13}$: wherein $R_{11}$, $R_{12}$ and $R_{13}$ each represents a group having a cyclocondensed polycyclic hydrocarbon structure in which three or more rings are cyclocondensed; and a novel cyclocondensed polycyclic hydrocarbon compound.

US2004/0028944 relates to organic electroluminescent devices comprising a triarylamine derivative represented by the general formula $N(Ar_1)(Ar_2)(Ar_3)$, wherein $Ar_1$ to $Ar_3$ are substituted or unsubstituted aryl groups and at least one of $Ar_1$ to $Ar_3$ is a 9-phenanthryl group.

EP1440959A1 relates to a novel soluble compound of formula

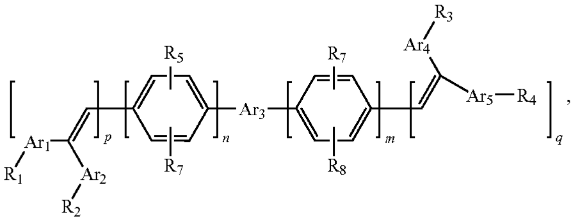

wherein $Ar_3$ represents a substituted or unsubstituted anthracendiyl group, or a substituted or unsubstituted fluorendiyl group and to its use in an electroluminescent device.

WO03/064373 relates to triarylamine derivatives and the use thereof as hole transport material in organic electroluminescent and electrophotographic devices.

US2004234809 relates to an organic light-emitting device comprising an anode, a cathode and at least one functional layer sandwiched between the anode and the cathode, said functional layer comprising a phenanthroline molecule which is fused with at least one of thiazole, and imidazole. Said phenanthroline molecule has the following structure:

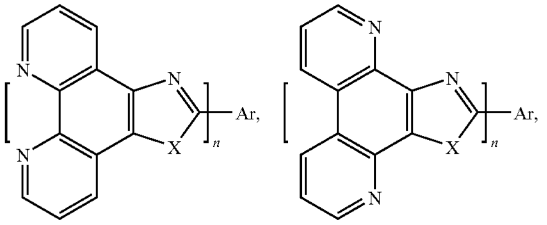

or

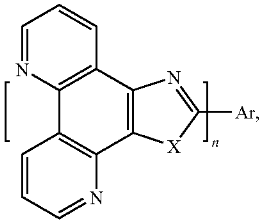

wherein X is S, or NR, with R being H, an alkyl group, or an aromatic group; n is a number from 1 to 10; and Ar is an aromatic group.

WO04/005288 relates to charge transport compositions comprising a phenanthroline derivative having formula

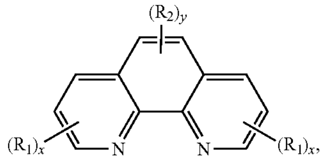

wherein: $R_1$ and $R_2$ are the same or different at each occurrence and are selected from H, F, Cl, Br, alkyl, heteroalkyl, alkenyl, alkynyl, aryl, heteroaryl, $C_nH_aF_b$, $OC_nH_aF_b$, $C_6H_cF_d$, and $OC_6H_cF_d$; a, b, c, and d are 0 or an integer such that a+b=2n+1, and c+d=5, n is an integer; x is 0 or an integer from 1 through 3; y is 0, 1 or 2; with the proviso that there is at least one substituent on an aromatic group selected from F, $C_nH_aF_b$, $OC_nH_aF_b$, $C_gH_cF_d$, and $OC_6H_cF_d$.

WO05/014689 relates to conjugated polymers containing dihydrophenanthrene units of formula

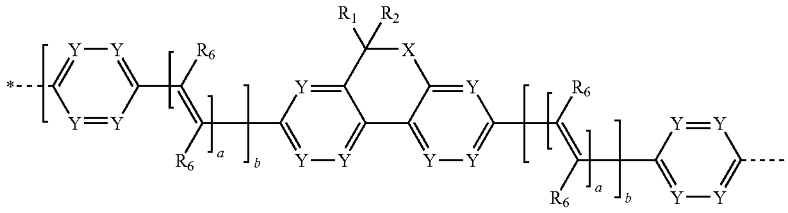

and their use in polymer organic light emitting diodes.

WO05/104264 relates to polymers comprising structural units of formula

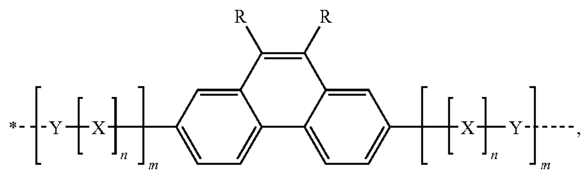

wherein both groups R among others can form together a mono- or polycyclic, aliphatic ring system.

WO06/097419 which enjoys an earlier priority date than the present invention, but will be published after the priority date of the present invention, relates to polymers, comprising repeating units of formula I, which do not comprise a group $-(Sp)_{x1}$-HEI.

PCT/EP2007/050934, which enjoys an earlier priority date than the present invention, but will be published after the priority date of the present invention, relates to polymers, comprising repeating units of formula I, comprising a group $-(Sp)_{x1}$-[PG']<, wherein Sp is a spacer unit, PG' is a group derived from a polymerisable group, and x1 is 0, or 1.

There are a number of challenges faced with the introduction of organic EL displays when their performance is compared with existing technologies. Obtaining the exact color coordinates required by specific guidelines (i.e. NTSC) has been problematic. The operational lifetime of the EL device is still lower when contrasted to the existing inorganic technology for cathode ray tubes (CRTs) and liquid crystal displays (LCDs). In addition, producing a material with a pure blue color and a long lifetime is one of the greatest problems for this industry.

Accordingly, it is the object of the present invention to provide novel materials, which show significant advantages in color purity, device efficiency and/or operational lifetime, when incorporated in electro-optical devices.

Said object is solved by the polymers of the present invention comprising repeating units of formula I. Organic light emitting devices (OLEDs), comprising the polymers of the present invention, can show significant advantages in color purity, device efficiency and/or operational lifetime. In addition, the polymers can have good solubility characteristics and relatively high glass transition temperatures, which facilitates their fabrication into coatings and thin films, that are thermally and mechanically stable and relatively free of defects. If the polymers contain end groups which are capable of being crosslinked, the crosslinking of such groups after the films or coating is formed increases the solvent resistance thereof, which is beneficial in applications wherein one or more solvent-based layers of material are deposited thereon.

Hence, the present invention relates to polymers comprising a repeating unit(s) of the formula (I)

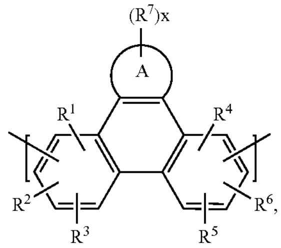

especially (Ia)

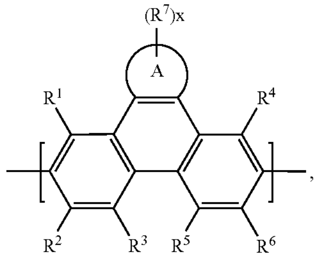

, or (Ib)

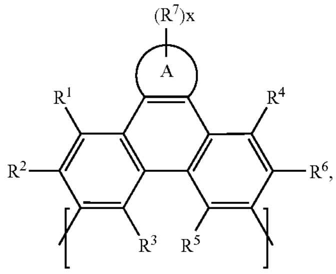

wherein A is a 5-, 6-, or 7-membered heteroaromatic ring, containing at least one heteroatom selected from nitrogen, oxygen and sulfur, especially one nitrogen atom and at least one further heteroatom selected from nitrogen, substituted nitrogen, oxygen and sulfur, $R^1$, $R^2$, $R^3$, $R^4$, $R^5$ and $R^6$ are independently of each other hydrogen, halogen, or an organic substituent, or two substituents $R^1$, $R^2$, $R^3$, $R^4$, $R^5$ and $R^6$, especially $R^1$ and $R^2$, $R^4$ and $R^6$, $R^2$ and $R^3$, $R^5$ and $R^3$ and/or $R^5$ and $R^6$, which are adjacent to each other, together form an aromatic, or heteroaromatic ring, or ring system, which can optionally be substituted, $R^7$ is an organic substituent, wherein two or more substituents $R^7$ in the same molecule may have different meanings, or can form together an aromatic, or heteroaromatic ring, or ring system, and x is 0, or an integer of 1 to 5, or $R^1$, $R^2$, $R^3$, $R^4$, $R^5$, $R^6$, or $R^7$ are a group $-(Sp)_{x1}$-HEI, wherein Sp is a spacer unit, HEI is a group ($HEI^{I}$), which increases the hole-injection and/or hole-transport properties of the polymers; or a group ($HEI^{II}$), which increases the electron-injection and/or electron-transport properties of the polymers, or a group ($HEI^{III}$), which increases the hole-injection and/or hole-transport properties of the polymers and the electron-injection and/or electron-transport properties of the polymers, x1 is 0, or 1; with the proviso that at least one of the substituents $R^1$, $R^2$, $R^3$, $R^4$, $R^5$, $R^6$ and $R^7$ is, or comprises a group $-(Sp)_{x1}$-HEI, with the proviso that the polymers obtained according to Examples 104, 105, 106, 109 and 110 of WO06/097419 are excluded:

Example 104:
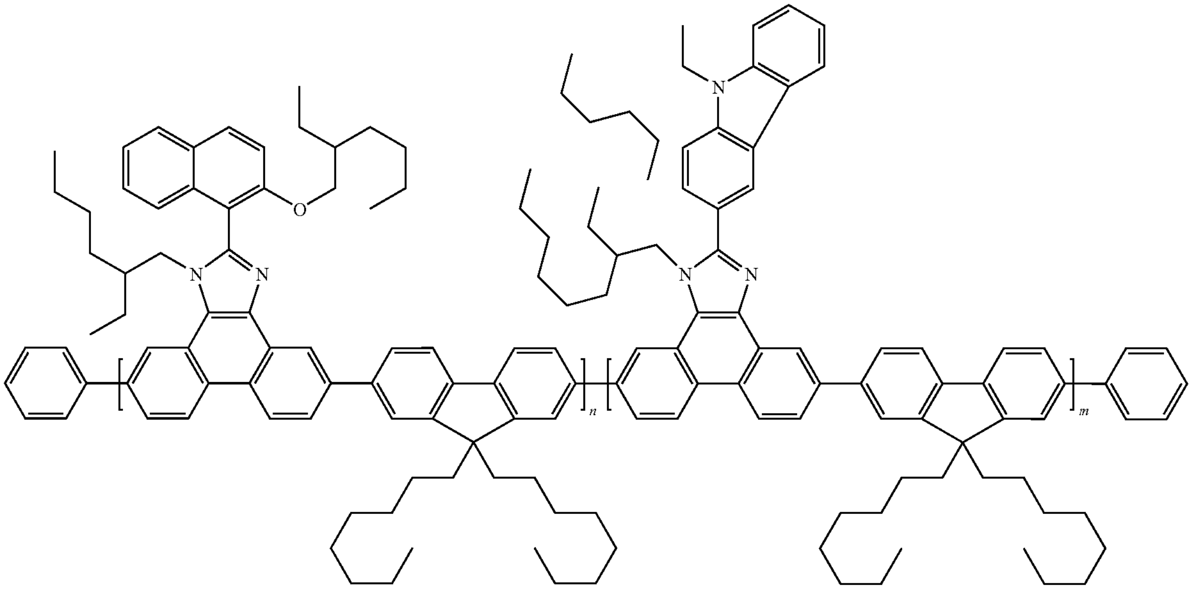
GPC (polystyrene standard): $M_w$=84 101, PD=3.38. Photoluminescent emission maximum at 446 nm.
Example 105
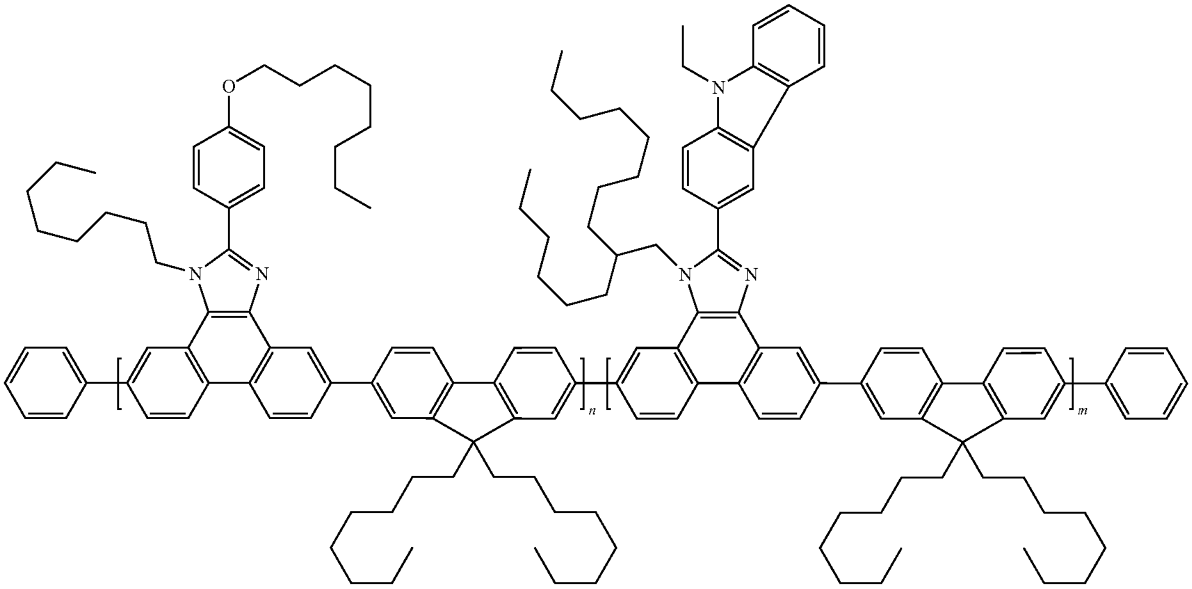
GPC (polystyrene standard): $M_w$=49 177, PD=3.10. Photoluminescent emission maximum at 430 nm.

Example 106
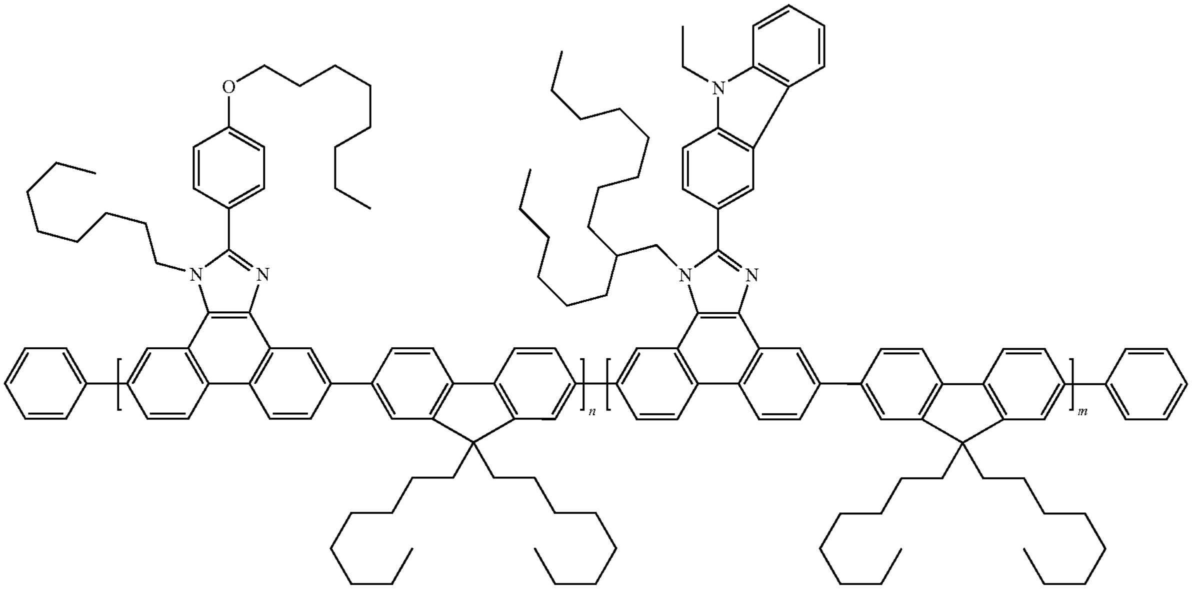
GPC (polystyrene standard): $M_w$=77 760, PD=3.41.
Example 109
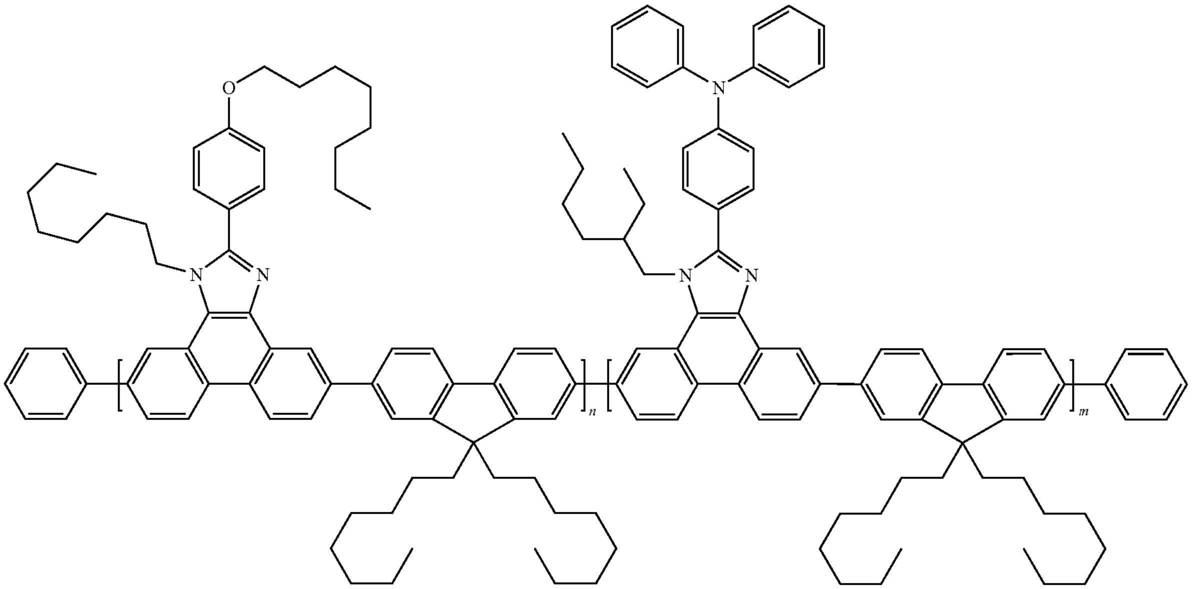
GPC (polystyrene standard): $M_w$=143 595, PD=3.42.

EXAMPLE 110

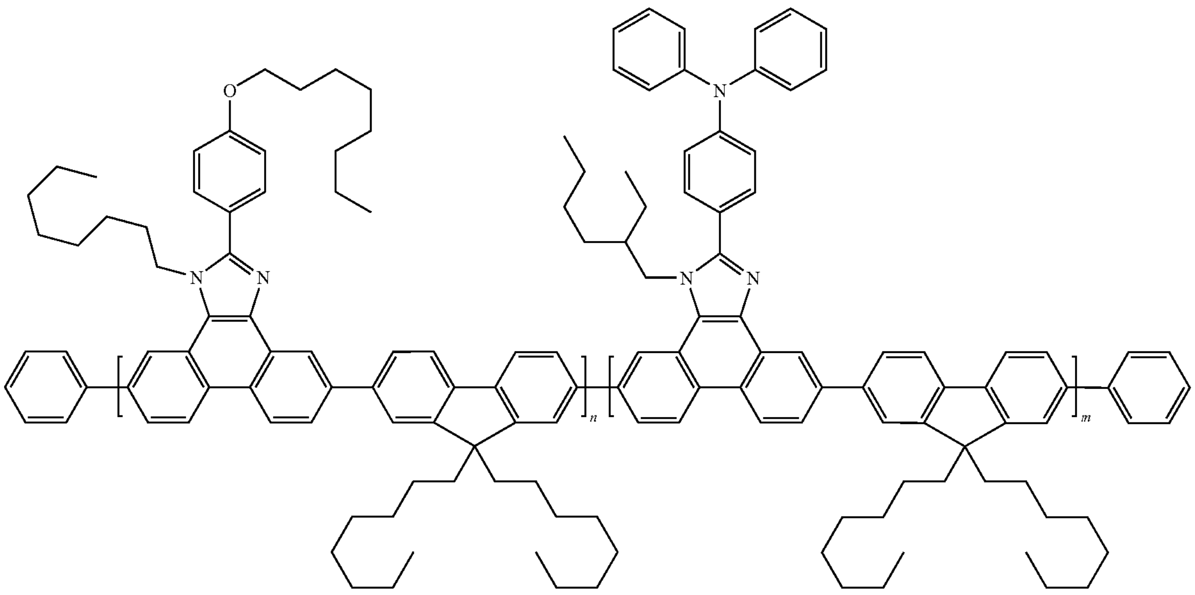

GPC (polystyrene standard): $M_w$=87 924, PD=3.23.

A nitrogen atom as heteroatom comprises a group =N—, or —NR$^{10}$, wherein R$^{10}$ is as defined below.

A is a 5-, 6-, or 7-membered heteroaromatic ring, containing one heteroatom selected from nitrogen, oxygen and sulphur, which can be substituted and/or can be part of a fused aromatic or heteroaromatic ring system. Non-limiting examples of A are:

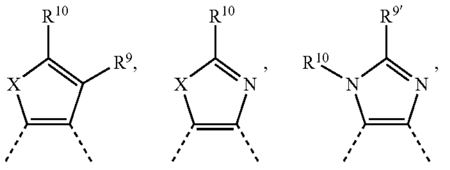

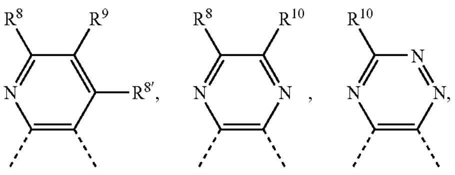

-continued

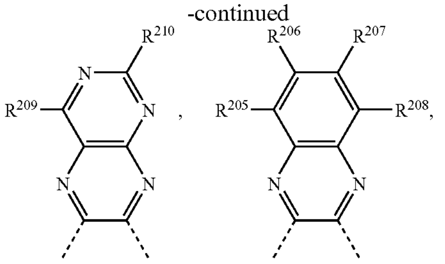

or

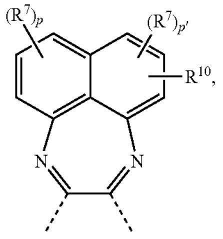

wherein R$^7$ has the meaning of R$^8$, R$^{8'}$ has the meaning of R$^8$, X is O, S, N—R$^{17}$, wherein R$^{205}$, R$^{206}$, R$^{207}$, R$^{208}$, R$^{209}$, R$^{210}$, R$^8$, R$^9$, R$^{9'}$, R$^{10}$ and R$^{17}$ are as defined below, p' is 0, 1, or 2, p' is 0, 1, 2, or 3 and the dotted line - - - indicates the bonding to the benzene ring.

Preferably, A is one of the above 5-, 6-, or 7-membered heteroaromatic rings, containing one nitrogen atom and at least one further heteroatom selected from nitrogen, oxygen and sulphur. If the heteroatom is nitrogen, it can be a group =N—, or —NR—, especially —N—R$^{17}$, or —NR$^{10}$—, wherein R is an organic substituent, R$^{17}$ and R$^{10}$ are as defined below.

The polymers of the present invention should have a glass transition temperature above 100° C.

Preferably, the polymers of the present invention comprise repeating units of the formula (X)

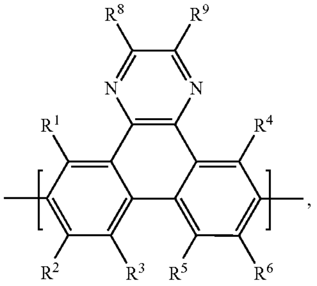

(XI)

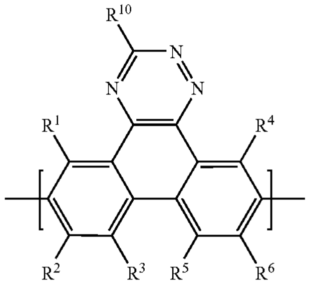

and/or (XII)

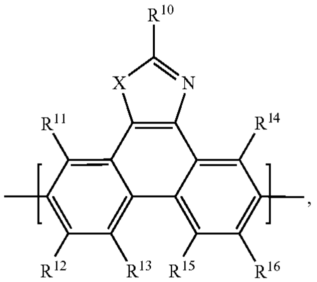

(XVI)

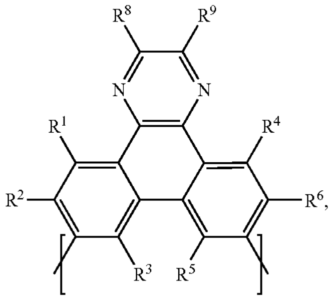

(XVII)

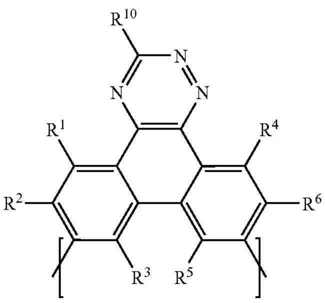

and/or

-continued (XVIII)

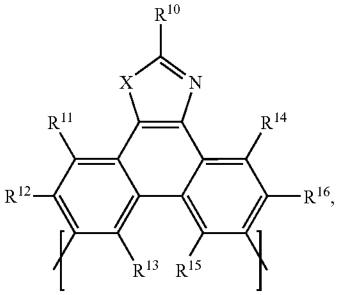

wherein $R^1$ and $R^4$ are independently of each other hydrogen, halogen, $C_1$-$C_{18}$alkyl, $C_1$-$C_{18}$alkyl which is substituted by E and/or interrupted by D, $C_1$-$C_{18}$perfluoroalkyl, $C_2$-$C_{18}$alkenyl, $C_2$-$C_{18}$alkynyl, $C_1$-$C_{18}$alkoxy, $C_1$-$C_{18}$alkoxy which is substituted by E and/or interrupted by D, CN, or —CO—$R^{28}$, $R^2$, $R^3R^5$ and $R^6$ are independently of each other H, halogen, $C_1$-$C_{18}$alkyl, $C_1$-$C_{18}$alkyl which is substituted by E and/or interrupted by D, $C_1$-$C_{18}$perfluoroalkyl, $C_6$-$C_{24}$aryl, $C_6$-$C_{24}$aryl which is substituted by G, $C_2$-$C_{20}$heteroaryl, $C_2$-$C_{20}$heteroaryl which is substituted by G, $C_2$-$C_{18}$alkenyl, $C_2$-$C_{18}$alkynyl, $C_1$-$C_{18}$alkoxy, $C_1$-$C_{18}$alkoxy which is substituted by E and/or interrupted by D, $C_7$-$C_{25}$aralkyl, CN, or —CO—$R^{28}$, $R^8$ and $R^9$ are independently of each other H, $C_1$-$C_{18}$alkyl, $C_1$-$C_{18}$alkyl which is substituted by E and/or interrupted by D, $C_1$-$C_{18}$perfluoroalkyl, $C_6$-$C_{24}$aryl, $C_6$-$C_{24}$aryl which is substituted by G, $C_2$-$C_{20}$heteroaryl, $C_2$-$C_{20}$heteroaryl which is substituted by G, $C_2$-$C_{18}$alkenyl, $C_2$-$C_{18}$alkynyl, $C_1$-$C_{18}$alkoxy, $C_1$-$C_{18}$alkoxy which is substituted by E and/or interrupted by D, $C_7$-$C_{25}$aralkyl, CN, or —CO—$R^{28}$, or $R^8$ and $R^9$ together form a group

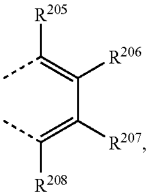

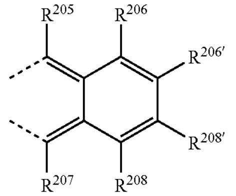

or

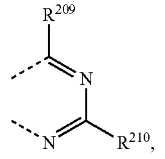

wherein $R^{206'}$, $R^{208'}$, $R^{205}$, $R^{206}$, $R^{207}$, $R^{208}$, $R^{209}$ and $R^{210}$ are independently of each other H, $C_1$-$C_{18}$alkyl, $C_1$-$C_{18}$alkyl which is substituted by E and/or interrupted by D, $C_1$-$C_{18}$alkoxy, or $C_1$-$C_{18}$alkoxy which is substituted by E and/or interrupted by D, $C_1$-$C_{18}$perfluoroalkyl, $C_6$-$C_{24}$aryl, $C_6$-$C_{24}$aryl which is substituted by G, $C_2$-$C_{20}$heteroaryl, $C_2$-$C_{20}$heteroaryl which is substituted by G, $C_2$-$C_{18}$alkenyl, $C_2$-$C_{18}$alkynyl, $C_7$-$C_{25}$aralkyl, CN, or —CO—$R^{28}$, $R^{10}$ is H, $C_1$-$C_{18}$alkyl, $C_1$-$C_{18}$alkyl which is substituted by E and/or interrupted by D, $C_1$-$C_{18}$perfluoroalkyl, $C_6$-$C_{24}$aryl, $C_6$-$C_{24}$aryl which is substituted by G, $C_2$-$C_{20}$heteroaryl, $C_2$-$C_{20}$heteroaryl which is substituted by G, $C_2$-$C_{18}$alkenyl, $C_2$-$C_{18}$alkynyl, $C_1$-$C_{18}$alkoxy, $C_1$-$C_{18}$alkoxy which is substituted by E and/or interrupted by D, $C_7$-$C_{25}$aralkyl, or —CO—$R^{28}$ $R^{11}$ and $R^{14}$ are independently of each other hydrogen, halogen, $C_1$-$C_{18}$alkyl, $C_1$-$C_{18}$alkyl which is substituted by E and/or interrupted by D, $C_1$-$C_{18}$perfluoroalkyl, $C_2$-$C_{18}$alkenyl, $C_2$-$C_{18}$alkynyl, $C_1$-$C_{18}$alkoxy, $C_1$-$C_{18}$alkoxy which is substituted by E and/or interrupted by D, CN, or —CO—$R^{28}$, $R^{12}$, $R^{13}R^{15}$ and $R^{16}$ are independently of each other H, halogen, $C_1$-$C_{18}$alkyl, $C_1$-$C_{18}$alkyl which is substituted by E and/or interrupted by D, $C_1$-$C_{18}$perfluoroalkyl, $C_6$-$C_{24}$aryl, $C_6$-$C_{24}$aryl which is substituted by G, $C_2$-$C_{20}$heteroaryl, $C_2$-$C_{20}$heteroaryl which is substituted by G, $C_2$-$C_{18}$alkenyl, $C_2$-$C_{18}$alkynyl, $C_1$-$C_{18}$alkoxy, $C_1$-$C_{18}$alkoxy which is substituted by E and/or interrupted by D, $C_7$-$C_{25}$aralkyl, CN or —CO—$R^{28}$, X is O, S, or $NR^{17}$, wherein $R^{17}$ is H; $C_6$-$C_{18}$aryl; $C_2$-$C_{20}$heteroaryl; $C_6$-$C_{18}$aryl, or $C_2$-$C_{20}$heteroaryl, which are substituted by $C_1$-$C_{18}$alkyl, $C_1$-$C_{18}$perfluoroalkyl, or $C_1$-$C_{18}$alkoxy; $C_1$-$C_{18}$alkyl; or $C_1$-$C_{18}$alkyl which is interrupted by —O—;

or two substituents $R^1$ and $R^2$, $R^4$ and $R^6$, $R^{11}$ and $R^{12}$ and/or $R^{14}$ and $R^{16}$, $R^2$ and $R^3$, $R^5$ and $R^6$, $R^{12}$ and $R^{13}$ and/or $R^{15}$ and $R^{16}$, which are adjacent to each other, together form a group

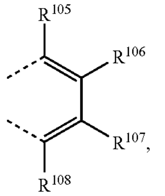

or

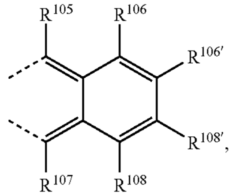

or two substituents $R^{15}$ and $R^{13}$, and/or $R^5$ and $R^3$, which are adjacent to each other, together form a group

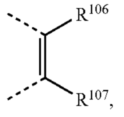

or

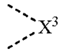

wherein $X^3$ is O, S, $C(R^{119})(R^{120})$, or $NR^{17}$, wherein $R^{17}$ is as defined above, $R^{105}$, $R^{106}$, $R^{107}$, $R^{108}$, $R^{106'}$ and $R^{108'}$ are independently of each other H, $C_1$-$C_{18}$alkyl, $C_1$-$C_{18}$alkyl which is substituted by E and/or interrupted by D, $C_1$-$C_{18}$alkoxy, or $C_1$-$C_{18}$alkoxy which is substituted by E and/or interrupted by D, $R^{119}$ and $R^{120}$ together form a group of formula $=CR^{121}R^{122}$, wherein $R^{121}$ and $R^{122}$ are independently of each other H, $C_1$-$C_{18}$alkyl, $C_1$-$C_{18}$alkyl which is substituted by E and/or interrupted by D, $C_6$-$C_{24}$aryl, $C_6$-$C_{24}$aryl which is substituted by G, or $C_2$-$C_{20}$heteroaryl, or $C_2$-$C_{20}$heteroaryl which is substituted by G, or $R^{119}$ and $R^{120}$ together form a five or six membered ring, which optionally can be substituted by $C_1$-$C_{18}$alkyl, $C_1$-$C_{18}$alkyl which is substituted by E and/or interrupted by D, $C_6$-$C_{24}$aryl, $C_6$-$C_{24}$aryl which is substituted by G, $C_2$-$C_{20}$heteroaryl, $C_2$-$C_{20}$heteroaryl which is substituted by G, $C_2$-$C_{18}$alkenyl, $C_2$-$C_{18}$alkynyl, $C_1$-$C_{18}$alkoxy, $C_1$-$C_{18}$alkoxy which is substituted by E and/or interrupted by D, $C_7$-$C_{25}$aralkyl, or —C(=O)—$R^{127}$, and $R^{127}$ is H; $C_6$-$C_{18}$aryl; $C_6$-$C_{18}$aryl which is substituted by $C_1$-$C_{18}$alkyl, or $C_1$-$C_{18}$alkoxy; $C_1$-$C_{18}$alkyl; or $C_1$-$C_{18}$alkyl which is interrupted by —O—, D is —CO—; —COO—; —S—; —SO—; —$SO_2$—; —O—; —$NR^{25}$—; —$SiR^{30}R^{31}$—; —$POR^{32}$—; —$CR^{23}$=$CR^{24}$—; or —C≡C—; and E is —$OR^{29}$; —$SR^{29}$; —$NR^{25}R^{26}$; —$COR^{28}$; —$COOR^{27}$; —$CONR^{25}R^{26}$; —CN; or halogen; G is E, $C_1$-$C_{18}$alkyl, $C_1$-$C_{18}$alkyl which is interrupted by D, $C_1$-$C_{18}$perfluoroalkyl, $C_1$-$C_{18}$alkoxy, or $C_1$-$C_{18}$alkoxy which is substituted by E and/or interrupted by D, wherein $R^{23}$, $R^{24}$, $R^{25}$ and $R^{26}$ are independently of each other H; $C_6$-$C_{18}$aryl; $C_6$-$C_{18}$aryl which is substituted by $C_1$-$C_{18}$alkyl, or $C_1$-$C_{18}$alkoxy; $C_1$-$C_{18}$alkyl; or $C_1$-$C_{18}$alkyl which is interrupted by —O—; or $R^{25}$ and $R^{26}$ together form a five or six membered ring, in particular

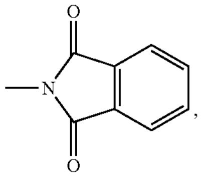

,

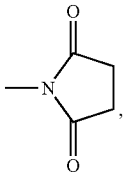

, or

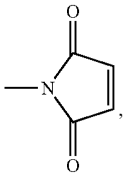

, $R^{27}$ and $R^{28}$ are independently of each other H; $C_6$-$C_{18}$aryl; $C_6$-$C_{18}$aryl which is substituted by $C_1$-$C_{18}$alkyl, or $C_1$-$C_{18}$alkoxy; $C_1$-$C_{18}$alkyl; or $C_1$-$C_{18}$alkyl which is interrupted by —O—, $R^{29}$ is H; $C_6$-$C_{18}$aryl; $C_6$-$C_{18}$aryl, which is substituted by $C_1$-$C_{18}$alkyl, or $C_1$-$C_{18}$alkoxy; $C_1$-$C_{18}$alkyl; or $C_1$-$C_{18}$alkyl which is interrupted by —O—, $R^{30}$ and $R^{31}$ are independently of each other $C_1$-$C_{18}$alkyl, $C_6$-$C_{18}$aryl, or $C_6$-$C_{18}$aryl, which is substituted by $C_1$-$C_{18}$alkyl, and $R^{32}$ is $C_1$-$C_{18}$alkyl, $C_6$-$C_{18}$aryl, or $C_6$-$C_{18}$aryl, which is substituted by $C_1$-$C_{18}$alkyl, or $R^1$, $R^2$, $R^3$, $R^4$, $R^5$, $R^6$, $R^{11}$, $R^{12}$, $R^{13}$, $R^{14}$, $R^{15}$, $R^{16}$, $R^{206'}$, $R^{208'}$, $R^{205}$, $R^{206}$, $R^{207}$, $R^{208}$, $R^{209}$, $R^{210}$, $R^{105}$, $R^{106}$, $R^{107}$, $R^{108}$, $R^{106'}$, $R^{108'}$, $R^8$, $R^9$, $R^{10}$, and/or $R^{17}$ are a group -$(Sp)_{x1}$-HEI, wherein Sp, x1 and HEI are as defined above, with the proviso that at least one of the substituents $R^1$, $R^2$, $R^3$, $R^4$, $R^5$, $R^6$, $R^{11}$, $R^{12}$, $R^{13}$, $R^{14}$, $R^{15}$, $R^{16}$, $R^{206'}$, $R^{208'}$, $R^{205}$, $R^{206}$, $R^{207}$, $R^{208}$, $R^{209}$, $R^{210}$, $R^{105}$, $R^{106}$, $R^{107}$, $R^{108}$, $R^{106'}$, $R^{108'}$, $R^8$, $R^9$, $R^{10}$, or $R^{17}$ is a group -$(Sp)_{x1}$-HEI.

In an embodiment of the present invention polymers are preferred, comprising repeating units of the formula X, or XI, wherein $R^1$ and $R^4$ are hydrogen, $R^2$, $R^3R^5$ and $R^6$ are independently of each other H, $C_1$-$C_{18}$alkyl, $C_1$-$C_{18}$alkyl which is interrupted by D, $C_1$-$C_{18}$perfluoroalkyl, $C_1$-$C_{18}$alkoxy, $C_1$-$C_{18}$alkoxy which is interrupted by D, $C_7$-$C_{25}$aralkyl, or a group —$X^2$—$R^{18}$, $R^8$ and $R^9$ are independently of each other H, $C_1$-$C_{18}$alkyl, $C_1$-$C_{18}$alkyl which is interrupted by D, $C_1$-$C_{18}$perfluoroalkyl, $C_1$-$C_{18}$alkoxy, $C_1$-$C_{18}$alkoxy which is interrupted by D, or a group —$X^2$—$R^{18}$, or two substituents $R^2$ and $R^3$ and/or $R^5$ and $R^6$, which are adjacent to each other, together form a group

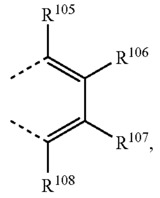

or two substituents $R^5$ and $R^3$, which are adjacent to each other, together form a group

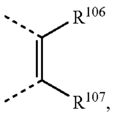

wherein $R^{105}$, $R^{106}$, $R^{107}$ and —$R^{108}$ are independently of each other H, or $C_1$-$C_8$alkyl, or $R^8$ and $R^9$ together form a group

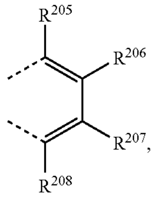

or

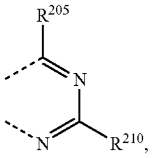

wherein $R^{205}$, $R^{206}$, $R^{207}$, $R^{208}$, $R^{209}$ and $R^{210}$ are independently of each other H, $C_1$-$C_{18}$alkyl, $C_1$-$C_{18}$alkyl which is substituted by E and/or interrupted by D, $C_1$-$C_{18}$alkoxy, or $C_1$-$C_{18}$alkoxy which is substituted by E and/or interrupted by D, $C_1$-$C_{18}$perfluoroalkyl, $R^{10}$ is H, $C_6$-$C_{18}$aryl, which can be substituted by G, $C_2$-$C_{18}$heteroaryl, which can be substituted by G, $C_1$-$C_{18}$alkyl, $C_1$-$C_{18}$alkyl which is interrupted by D, $C_1$-$C_{18}$perfluoroalkyl, $C_1$-$C_{18}$alkoxy, $C_1$-$C_{18}$alkoxy which is substituted by E and/or interrupted by D, or a group —$X^2$—$R^{18}$, wherein $X^2$ is a spacer, such as $C_6$-$C_{12}$aryl, or $C_6$-$C_{12}$heteroaryl, especially phenyl, or naphthyl, which can be substituted one, or more times, especially one to two times with $C_1$-$C_{18}$alkyl, $C_1$-$C_{18}$alkyl which is interrupted by D, $C_1$-$C_{18}$perfluoroalkyl, $C_1$-$C_{18}$alkoxy, or $C_1$-$C_{18}$alkoxy which is substituted by E and/or interrupted by D, and $R^{18}$ is H, $C_1$-$C_{18}$alkyl, $C_1$-$C_{18}$alkyl which is interrupted by D, $C_1$-$C_{18}$perfluoroalkyl, $C_1$-$C_{18}$alkoxy, $C_1$-$C_{18}$alkoxy which is interrupted by D, or —$NR^{25}R^{26}$;

D is —CO—; —COO—; —S—; —SO—; —$SO_2$—; —O—; —$NR^{25}$—; —$CR^{23}$=$CR^{24}$—; or —C≡C—; wherein $R^{23}$, $R^{24}$, $R^{25}$ and $R^{26}$ are independently of each other H; $C_6$-$C_{18}$aryl; $C_6$-$C_{18}$aryl which is substituted by $C_1$-$C_8$alkyl, or $C_1$-$C_8$alkoxy; $C_1$-$C_8$alkyl; or $C_1$-$C_8$alkyl which is interrupted by—O—, or $R^{25}$ and $R^{26}$ together form a five or six membered ring, in particular

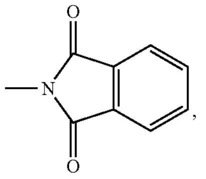

,

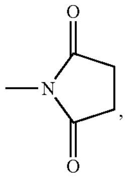

, or

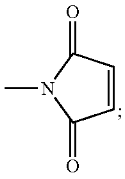

; or $R^{105}$, $R^{106}$, $R^{107}$, $R^{108}$, $R^{205}$, $R^{206}$, $R^{207}$, $R^{20}$, $R^{209}$, $R^{210}$, $R^8$, $R^9$, and/or $R^{10}$ is a group -$(Sp)_{x1}$-HEI, wherein Sp, x1 and HEI are as defined above, with the proviso that at least one of the substituents $R^{105}$, $R^{106}$, $R^{107}$, $R^{108}$, $R^{205}$, $R^{206}$, $R^{207}$, $R^{208}$, $R^{209}$, $R^{210}$, $R^8$, $R^9$, or $R^{10}$ is a group -$(Sp)_{x1}$-HEI.

In an embodiment of the present invention polymers are preferred, comprising repeating units of the formula (XIIa)

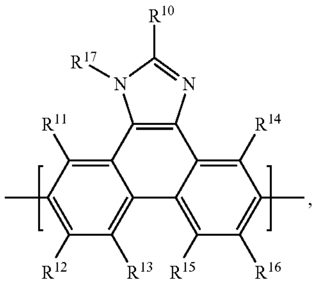

, and/or (XIIb)

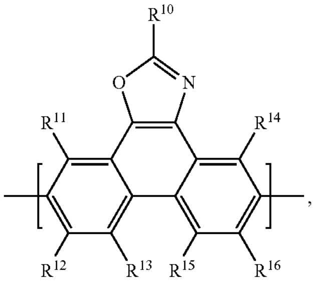

, wherein $R^{10}$ is H, $C_6$-$C_{18}$aryl, which can be substituted by G, $C_2$-$C_{18}$heteroaryl, which can be substituted by G, $C_1$-$C_{18}$alkyl, $C_1$-$C_{18}$alkyl which is interrupted by D, $C_1$-$C_{18}$perfluoroalkyl, $C_1$-$C_{18}$alkoxy, $C_1$-$C_{18}$alkoxy which is substituted by E and/or interrupted by D, or a group —$X^2$—$R^{18}$, wherein $X^2$ is a spacer, such as $C_6$-$C_{12}$aryl, or $C_6$-$C_{12}$heteroaryl, especially phenyl, or naphthyl, which can be substituted one more, especially one to two times with $C_1$-$C_{18}$alkyl, $C_1$-$C_{18}$alkyl which is interrupted by D, $C_1$-$C_{18}$perfluoroalkyl, $C_1$-$C_{18}$alkoxy, or $C_1$-$C_{18}$alkoxy which is substituted by E and/or interrupted by D, and $R^{18}$ is H, $C_1$-$C_{18}$alkyl, $C_1$-$C_{18}$alkyl which is interrupted by D, $C_1$-$C_{18}$perfluoroalkyl, $C_1$-$C_{18}$alkoxy, $C_1$-$C_{18}$alkoxy which is interrupted by D, or —$NR^{25}R^{26}$—;

$R^{11}$ and $R^{14}$ are hydrogen, $R^{12}$, $R^{13}$, $R^{15}$ and $R^{16}$ are hydrogen, $R^{17}$ is $C_6$-$C_{18}$aryl; $C_6$-$C_{18}$aryl which is substituted by $C_1$-$C_{18}$alkyl, $C_1$-$C_{18}$perfluoroalkyl, or $C_1$-$C_{18}$alkoxy; $C_1$-$C_{18}$alkyl; or $C_1$-$C_{18}$alkyl which is interrupted by —O—; or two substituents $R^{12}$ and $R^{13}$ and/or $R^{15}$ and $R^{16}$, which are adjacent to each other, together form a group

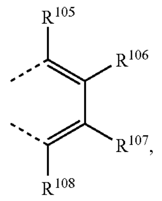

or two substituents $R^{15}$ and $R^{13}$, which are adjacent to each other, together form a group

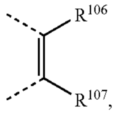

wherein $R^{105}$, $R^{106}$, $R^{107}$ and $R^{108}$ are independently of each other H, or $C_1$-$C_8$alkyl, D is —S—; —O—; or —$NR^{25}$—;

E is —$OR^{29}$; —$SR^{29}$; —$NR^{25}R^{26}$; —CN; or F; G is E, $C_1$-$C_{18}$alkyl, $C_1$-$C_{18}$alkyl which is interrupted by D, $C_1$-$C_{18}$perfluoroalkyl, $C_1$-$C_{18}$alkoxy, or $C_1$-$C_{18}$alkoxy which is substituted by E and/or interrupted by D, wherein $R^{25}$ and $R^{26}$ are independently of each other H; $C_6$-$C_{18}$aryl; $C_6$-$C_{18}$aryl which is substituted by $C_1$-$C_8$alkyl, or $C_1$-$C_8$alkoxy; $C_1$-$C_8$alkyl; or $C_1$-$C_8$alkyl which is interrupted by —O—, or $R^{25}$ and $R^{26}$ together form a five or six membered ring, in particular

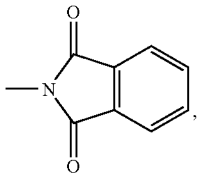,
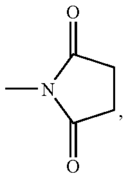, or
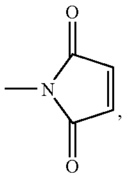, and $R^{29}$ is $C_6$-$C_{18}$aryl; $C_6$-$C_{18}$aryl, which is substituted by $C_1$-$C_{18}$alkyl, or $C_1$-$C_{18}$alkoxy; $C_1$-$C_{18}$alkyl; or $C_1$-$C_{18}$alkyl which is interrupted by —O—; or $R^{10}$, and/or $R^{17}$ is a group -$(Sp)_{x1}$-HEI, wherein Sp, x1 and HEI are as defined above, with the proviso that at least one of the substituents $R^{10}$, or $R^{17}$ is a group -$(Sp)_{x1}$-HEI.

Preferred groups $HEI^I$, which increase the hole-injection and/or hole-transport properties of the polymers, are:

(IIa)

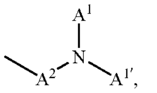

(IIb)

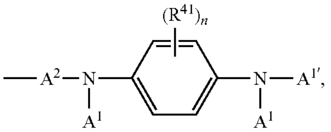

-continued (IIc)

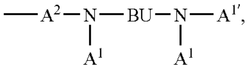

wherein BU is a bridging unit, such as

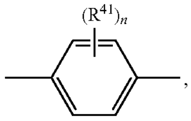,
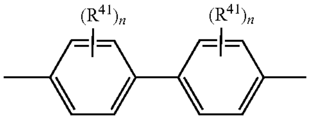, or
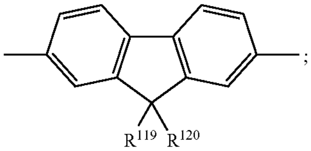;

(IId)

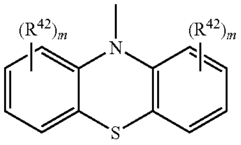

(IIe)

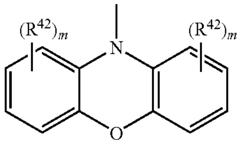

(IIf)

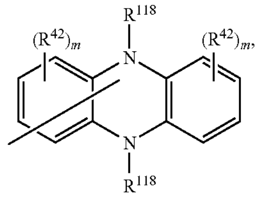

(IIg)

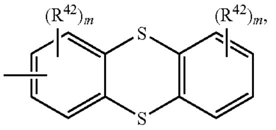

(IIh)

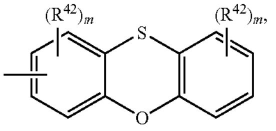

(IIi)

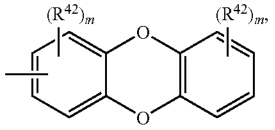

(IIj)

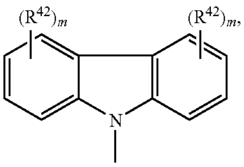

-continued (IIk)

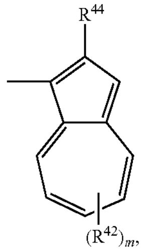

or (IIk)

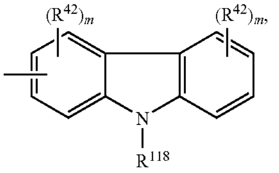

wherein $R^{41}$ can be the same or different at each occurrence and is Cl, F, CN, $N(R^{45})_2$, a $C_1$-$C_{25}$alkyl group, a $C_4$-$C_{18}$cycloalkyl group, a $C_1$-$C_{25}$alkoxy group, in which one or more carbon atoms which are not in neighbourhood to each other could be replaced by —$NR^{45}$—, —O—, —S—, —C(═O)—O—, or —O—C(═O)—O—, and/or wherein one or more hydrogen atoms can be replaced by F, a $C_6$-$C_{24}$aryl group, or a $C_6$-$C_{24}$aryloxy group, wherein one or more carbon atoms can be replaced by O, S, or N, and/or which can be substituted by one or more non-aromatic groups $R^{41}$, or two or more groups $R^{41}$ form a ring system;

$R^{42}$ can be the same or different at each occurrence and is CN, a $C_1$-$C_{25}$alkyl group, a $C_4$-$C_{18}$cycloalkyl group, a $C_1$-$C_{25}$alkoxy group, in which one or more carbon atoms which are not in neighbourhood to each other could be replaced by —$NR^{45}$—, —O—, —S—, —C(═O)—O—, or —O—C(═O)—O—, and/or wherein one or more hydrogen atoms can be replaced by F, a $C_6$-$C_{24}$aryl group, or a $C_6$-$C_{24}$aryloxy group, wherein one or more carbon atoms can be replaced by O, S, or N, and/or which can be substituted by one or more non-aromatic groups $R^{41}$, or two or more groups $R^{42}$ form a ring system;

$R^{44}$ can be the same or different at each occurrence and are a hydrogen atom, a $C_1$-$C_{25}$alkyl group, a $C_4$-$C_{18}$cycloalkyl group, a $C_1$-$C_{25}$alkoxy group, in which one or more carbon atoms which are not in neighbourhood to each other could be replaced by —$NR^{45}$—, —O—, —S—, —C(═O)—O—, or, —O—C(═O)—O—, and/or wherein one or more hydrogen atoms can be replaced by F, a $C_6$-$C_{24}$aryl group, or a $C_6$-$C_{24}$aryloxy group, wherein one or more carbon atoms can be replaced by O, S, or N, and/or which can be substituted by one or more non-aromatic groups $R^{41}$, or CN, or two or more groups $R^{44}$, which are in neighbourhood to each other, form a ring;

$R^{118}$ is H, a $C_1$-$C_{25}$alkyl group, a $C_1$-$C_{25}$alkoxy group, a $C_4$-$C_{18}$cycloalkyl group, a $C_1$-$C_{25}$alkoxy group, in which one or more carbon atoms which are not in neighbourhood to each other could be replaced by —$NR^{45}$—, —O—, —S—, —C(═O)—O—, or, —O—C(═O)—O—, and/or wherein one or more hydrogen atoms can be replaced by F, a $C_6$-$C_{24}$aryl group, or a $C_6$-$C_{24}$aryloxy group, wherein one or more carbon atoms can be replaced by O, S, or N, and/or which can be substituted by one or more non-aromatic groups $R^{41}$;

m can be the same or different at each occurrence and is 0, 1, 2, or 3, especially 0, 1, or 2, very especially 0 or 1;

n can be the same or different at each occurrence and is 0, 1, 2, or 3, especially 0, 1, or 2, very especially 0 or 1;

$R^{45}$ is H, a $C_1$-$C_{25}$alkyl group, a $C_4$-$C_{18}$cycloalkyl group, in which one or more carbon atoms which are not in neighbourhood to each other could be replaced by —$NR^{45}$—, —O—, —S—, —C(═O)—O—, or, —O—C(═O)—O—, and/or wherein one or more hydrogen atoms can be replaced by F, a $C_6$-$C_{24}$aryl group, or a $C_6$-$C_{24}$aryloxy group, wherein one or more carbon atoms can be replaced by O, S, or N, and/or which can be substituted by one or more non-aromatic groups $R^{41}$; $R^{45'}$ is H, a $C_1$-$C_{25}$alkyl group, or a $C_4$-$C_{18}$cycloalkyl group;

$A^1$ and $A^{1'}$ are independently of each other a $C_6$-$C_{24}$aryl group, a $C_2$-$C_{30}$heteroaryl group, which can be substituted by one or more non-aromatic groups $R^{41}$, or $NO_2$, especially phenyl, naphthyl, anthryl, biphenylyl, 2-fluorenyl, phenanthryl, or perylenyl, which can be substituted by one or more non-aromatic groups $R^{41}$, such as

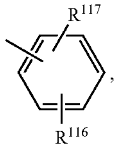

,

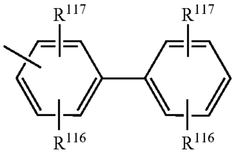

,

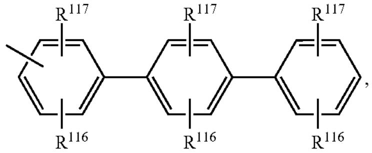

,

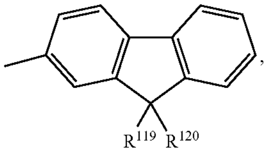

,

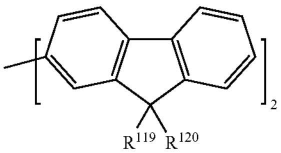

,

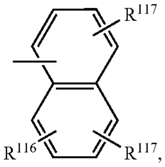

,

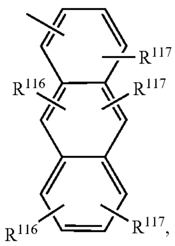

,

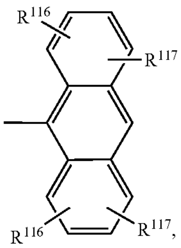

,

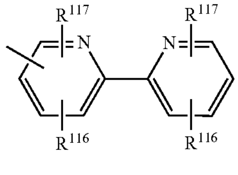

,

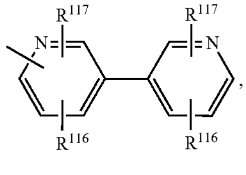

,

-continued

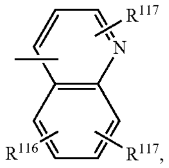
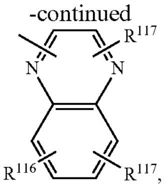
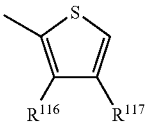
,

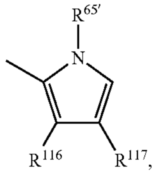
and
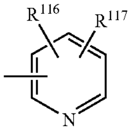
, $A^2$ is a $C_6$-$C_{30}$arylene group, or a $C_2$-$C_{24}$heteroarylene group, which can optionally be substituted, especially

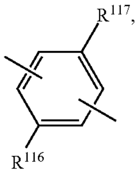
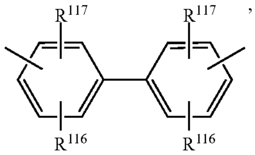
,

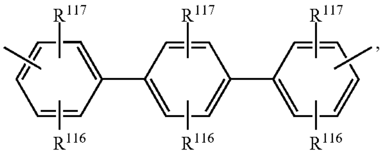

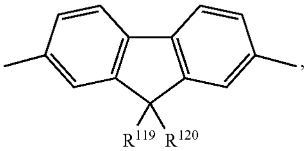

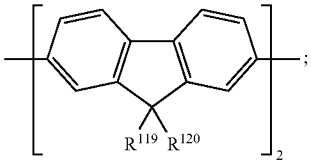

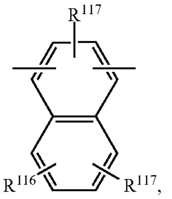

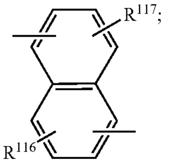

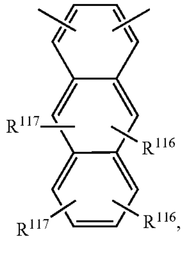
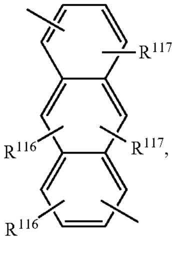
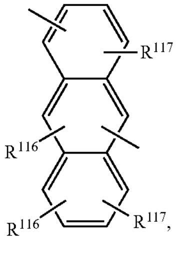

-continued

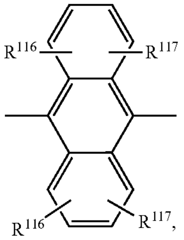
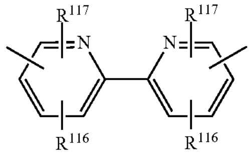
,

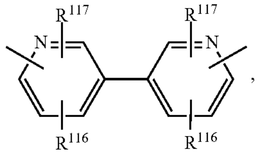
,
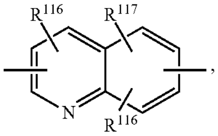

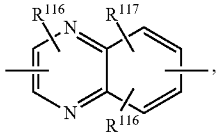
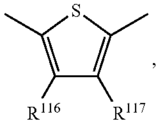
,

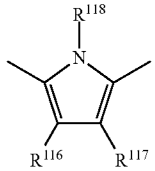
, or
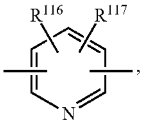

or $A^1$ and $A^{1'}$ together with the nitrogen atom to which they are bonded form a heteroaromatic ring, or ring system, such as

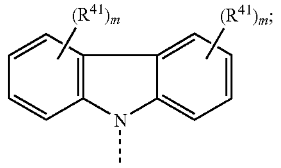

or $A^1$ and $A^2$ together with the nitrogen atom to which they are bonded form a heteroaromatic ring, or ring system, such as

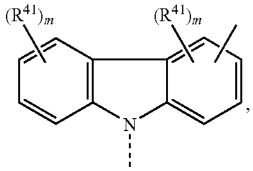
, wherein $R^{116}$ and $R^{117}$ are independently of each other H, halogen, —CN, $C_1$-$C_{18}$alkyl, $C_1$-$C_{18}$alkyl which is substituted by E and/or interrupted by D, $C_6$-$C_{24}$aryl, $C_6$-$C_{24}$aryl which is substituted by G, $C_2$-$C_{20}$heteroaryl, $C_2$-$C_{20}$heteroaryl which is substituted by G, $C_2$-$C_{18}$alkenyl, $C_2$-$C_{18}$alkynyl, $C_1$-$C_{18}$alkoxy, $C_1$-$C_{18}$alkoxy which is substituted by E and/or interrupted by D, $C_7$-$C_{25}$aralkyl, —C(═O)—$R^{127}$, —C(═O)O$R^{127}$ or —C(═O)N$R^{127}R^{126}$, $R^{119}$ and $R^{120}$ are independently of each other $C_1$-$C_{18}$alkyl, $C_1$-$C_{18}$alkyl which is substituted by E and/or interrupted by D, $C_6$-$C_{24}$aryl, $C_6$-$C_{24}$aryl which is substituted by G, $C_2$-$C_{20}$heteroaryl, $C_2$-$C_{20}$heteroaryl which is substituted by G, $C_2$-$C_{18}$alkenyl, $C_2$-$C_{18}$alkynyl, $C_1$-$C_{18}$alkoxy, $C_1$-$C_{18}$alkoxy which is substituted by E and/or interrupted by D, or $C_7$-$C_{25}$aralkyl, or $R^{119}$ and $R^{120}$ together form a group of formula $=CR^{121}R^{122}$, wherein $R^{121}$ and $R^{122}$ are independently of each other H, $C_1$-$C_{18}$alkyl, $C_1$-$C_{18}$alkyl which is substituted by E and/or interrupted by D, $C_6$-$C_{24}$aryl, $C_6$-$C_{24}$aryl which is substituted by G, or $C_2$-$C_{20}$heteroaryl, or $C_2$-$C_{20}$heteroaryl which is substituted by G, or $R^{119}$ and $R^{120}$ together form a five or six membered ring, which optionally can be substituted by $C_1$-$C_{18}$alkyl, $C_1$-$C_{18}$alkyl which is substituted by E and/or interrupted by D, $C_6$-$C_{24}$aryl, $C_6$-$C_{24}$aryl which is substituted by G, $C_2$-$C_{20}$heteroaryl, $C_2$-$C_{20}$heteroaryl which is substituted by G, $C_2$-$C_{18}$alkenyl, $C_2$-$C_{18}$alkynyl, $C_1$-$C_{18}$alkoxy, $C_1$-$C_{18}$alkoxy which is substituted by E and/or interrupted by D, $C_7$-$C_{25}$aralkyl, or $-C(=O)-R^{127}$, and $R^{126}$ and $R^{127}$ are independently of each other H; $C_6$-$C_{18}$aryl; $C_6$-$C_{18}$aryl which is substituted by $C_1$-$C_{18}$alkyl, or $C_1$-$C_{18}$alkoxy; $C_1$-$C_{18}$alkyl; or $C_1$-$C_{18}$alkyl which is interrupted by —O—, D is —CO—, —COO—, —S—, —SO—, —$SO_2$—, —O—, —$NR^{65}$, —$SiR^{70}R^{71}$—$POR^{72}$—, —$CR^{63}$═$CR^{64}$—, or —C≡C—, and E is —$OR^{69}$, —$SR^{69}$, —$NR^{65}R^{66}$, —$COR^{68}$, —$COOR^{67}$—$CONR^{65}R^{66}$—CN, or halogen, G is E, or $C_1$-$C_{18}$alkyl, $R^{63}$, $R^{64}$, $R^{65}$ and $R^{66}$ are independently of each other H; $C_6$-$C_{18}$aryl; $C_6$-$C_{18}$aryl which is substituted by $C_1$-$C_{18}$alkyl, $C_1$-$C_{18}$alkoxy; $C_1$-$C_{18}$alkyl; or $C_1$-$C_{18}$alkyl which is interrupted by —O—; or $R^{65}$ and $R^{66}$ together form a five or six membered ring, in particular

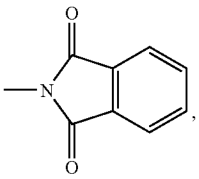, 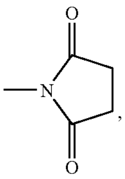, or 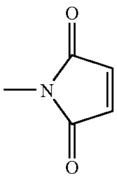, $R^{65'}$ is $R^{65}$, $R^{67}$ and $R^{68}$ are independently of each other H; $C_6$-$C_{18}$aryl; $C_6$-$C_{18}$aryl which is substituted by $C_1$-$C_{18}$alkyl, or $C_1$-$C_{18}$alkoxy; $C_1$-$C_{18}$alkyl; or $C_1$-$C_{18}$alkyl which is interrupted by —O—, $R^{69}$ is H; $C_6$-$C_{18}$aryl; $C_6$-$C_{18}$aryl, which is substituted by $C_1$-$C_{18}$alkyl, $C_1$-$C_{18}$alkoxy; $C_1$-$C_{18}$alkyl; or $C_1$-$C_{18}$alkyl which is interrupted by —O—, $R^{70}$ and $R^{71}$ are independently of each other $C_1$-$C_{18}$alkyl, $C_6$-$C_{18}$aryl, or $C_6$-$C_{18}$aryl, which is substituted by $C_1$-$C_{18}$alkyl, and $R^{72}$ is $C_1$-$C_{18}$alkyl, $C_6$-$C_{18}$aryl, or $C_6$-$C_{18}$aryl, which is substituted by $C_1$-$C_{18}$alkyl.

$A^1$ is preferably a phenyl group, which is substituted by $C_1$-$C_4$alkyl, or $NO_2$, in particular

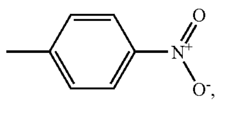, 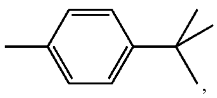, or an anthryl group, in particular an anthr-2-yl group.

Preferably, $R^{116}$ and $R^{117}$ are independently of each other H, $C_1$-$C_{12}$alkyl, such as methyl, ethyl, n-propyl, iso-propyl, n-butyl, isobutyl, sec-butyl, t-butyl, 2-methylbutyl, n-pentyl, isopentyl, n-hexyl, 2-ethylhexyl, or n-heptyl, $C_1$-$C_{12}$alkyl which is substituted by E and/or interrupted by D, such as —$CH_2OCH_3$, —$CH_2OCH_2CH_3$, —$CH_2OCH_2CH_2OCH_3$, or —$CH_2OCH_2CH_2OCH_2CH_3$, $C_6$-$C_{14}$aryl, such as phenyl, naphthyl, or biphenylyl, $C_5$-$C_{12}$cycloalkyl, such as cyclohexyl, $C_6$-$C_{14}$aryl which is substituted by G, such as —$C_6H_4OCH_3$, —$C_6H_4OCH_2CH_3$, —$C_6H_3(OCH_3)_2$, or —$C_6H_3(OCH_2CH_3)_2$, —$C_6H_4CH_3$, —$C_6H_3(CH_3)_2$, —$C_6H_2(CH_3)_3$, or —$C_6H_4$tBu.

$R^{65'}$ is preferably H, $C_1$-$C_{12}$alkyl, such as methyl, ethyl, n-propyl, iso-propyl, n-butyl, isobutyl, sec-butyl, t-butyl, 2-methylbutyl, n-pentyl, isopentyl, n-hexyl, 2-ethylhexyl, n-heptyl, or $C_6$-$C_{14}$aryl, such as phenyl, naphthyl, or biphenylyl.

Preferably, $R^{119}$ and $R^{120}$ are independently of each other $C_1$-$C_{12}$alkyl, such as methyl, ethyl, n-propyl, iso-propyl, n-butyl, sec-butyl, hexyl, octyl, or 2-ethyl-hexyl, $C_1$-$C_{12}$alkyl which is substituted by E and/or interrupted by D, such as —$CH_2(OCH_2CH_2)_wOCH_3$, w=1, 2, 3, or 4, $C_6$-$C_{14}$aryl, such as phenyl, naphthyl, or biphenylyl, $C_6$-$C_{14}$aryl which is substituted by G, such as —$C_6H_4OCH_3$, —$C_6H_4OCH_2CH_3$, —$C_6H_3(OCH_3)_2$, —$C_6H_3(OCH_2CH_3)_2$, —$C_6H_4CH_3$, —$C_6H_3(CH_3)_2$, —$C_6H_2(CH_3)_3$, or —$C_6H_4$tBu, or $R^{119}$ and $R^{120}$ together form a 4 to 8 membered ring, especially a 5 or 6 membered ring, such as cyclohexyl, or cyclopentyl, which can optionally be substituted by $C_1$-$C_8$alkyl.

D is preferably —CO—, —COO—, —S—, —SO—, —$SO_2$—, —O—, —$NR^{65}$—, wherein $R^{65}$ is $C_1$-$C_{12}$alkyl, such as methyl, ethyl, n-propyl, iso-propyl, n-butyl, isobutyl, or sec-butyl, or $C_6$-$C_{14}$aryl, such as phenyl, naphthyl, or biphenylyl.

E is preferably —$OR^{69}$; —$SR^{69}$; —$NR^{65}R^{65}$; —$COR^{68}$; —$COOR^{67}$; —$CONR^{65}R^{65}$; or —CN; wherein $R^{65}$, $R^{67}$, $R^{68}$ and $R^{69}$ are independently of each other $C_1$-$C_{12}$alkyl, such as methyl, ethyl, n-propyl, iso-propyl, n-butyl, isobutyl, sec-butyl, hexyl, octyl, or 2-ethyl-hexyl, or $C_6$-$C_{14}$aryl, such as phenyl, naphthyl, or biphenylyl.

G has the same preferences as E, or is $C_1$-$C_{18}$alkyl, especially $C_1$-$C_{12}$alkyl, such as methyl, ethyl, n-propyl, iso-propyl, n-butyl, isobutyl, sec-butyl, hexyl, octyl, or 2-ethyl-hexyl.

In a preferred embodiment of the present invention the group $HEI^I$ has the formula IIc, wherein BU is a group of formula

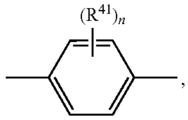, 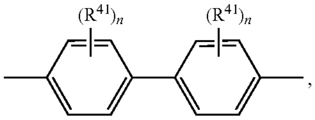, or

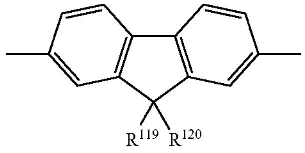;

$A^2$ is a group

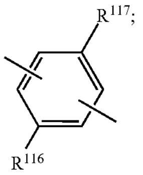

$A^1$ and $A^{1'}$ are independently of each other

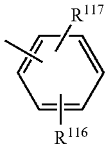
,
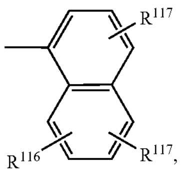
or
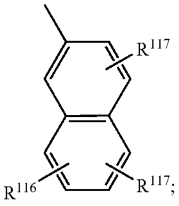

or $A^1$ and $A^{1'}$ together with the nitrogen atom to which they are bonded form a group of formula

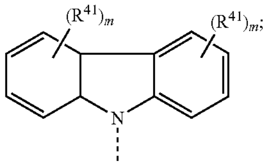

or $A^1$ and $A^2$ together with the nitrogen atom to which they are bonded form a group of formula

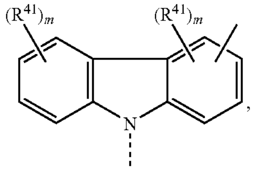

wherein $R^{41}$, m, n, $R^{116}$, $R^{117}$, $R^{119}$ and $R^{120}$ are as defined above.

The following groups $HEI^I$ are especially preferred:

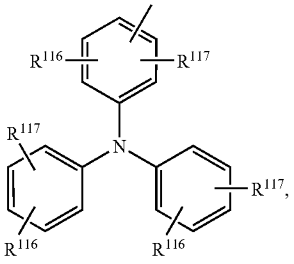

-continued

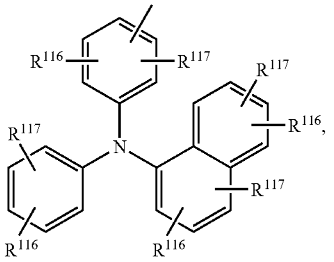

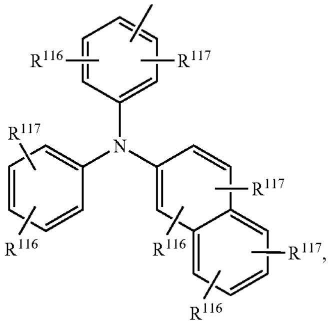

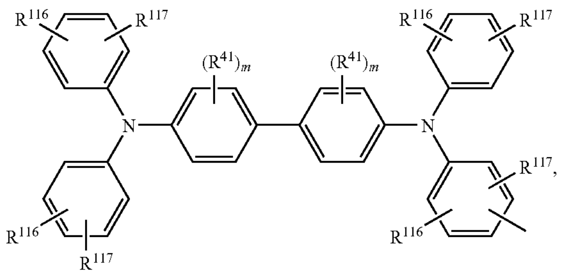

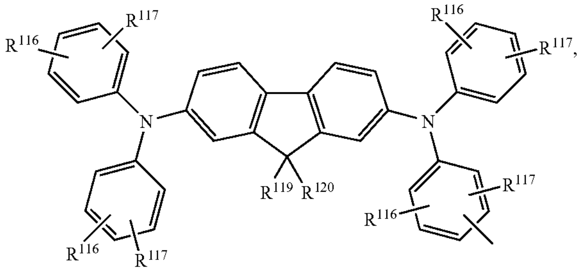

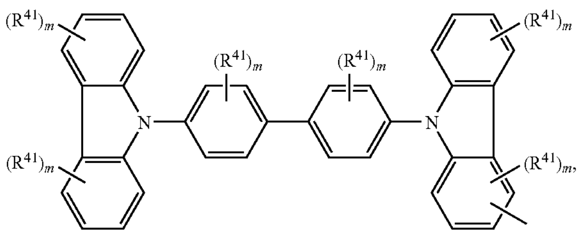

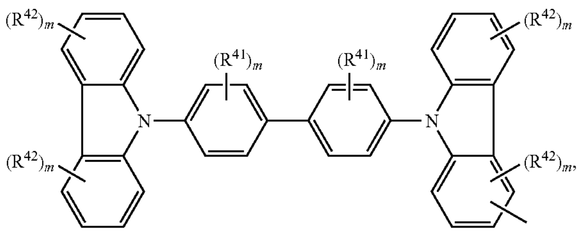

-continued

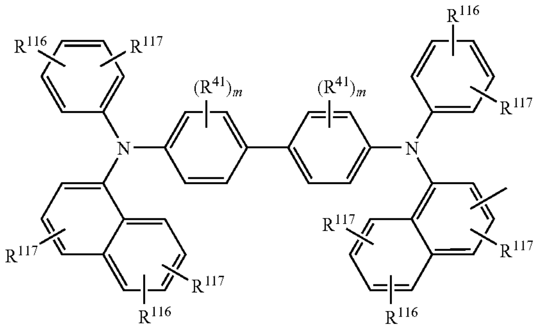

and

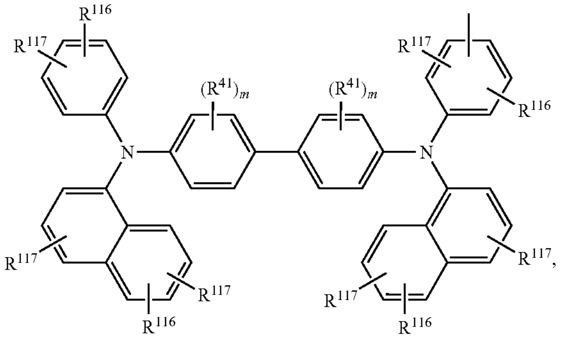

wherein $R^{41}$, $R^{42}$, $R^{116}$, $R^{117}$, $R^{119}$, $R^{120}$ and m are as defined above.

Preferred groups $HEI^{II}$, which increase the electron-injection and/or electron-transport properties of the polymers, are:

(IIIa)

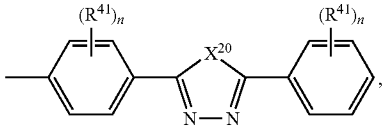

(IIIb)

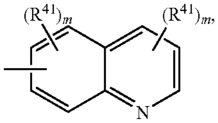

(IIIc)

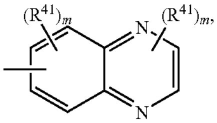

(IIId)

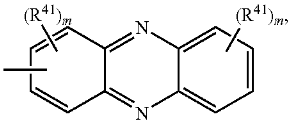

(IIIe)

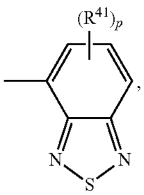

, or

-continued (IIIf)

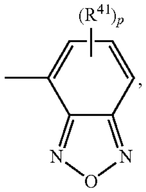

(IIIg)

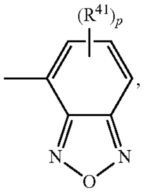

(IIIh)

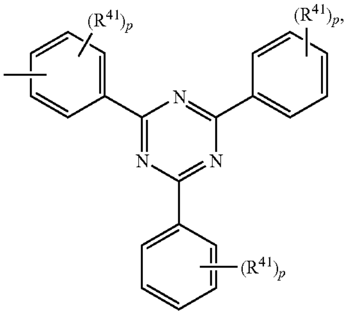

(IIIi)

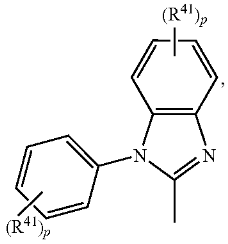

(IIIj)

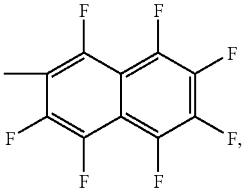

(IIIk)

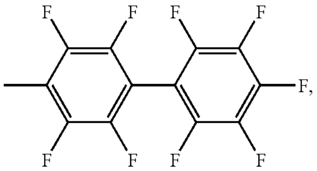

and (IIIl)

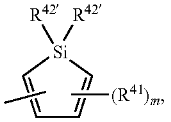

wherein $X^{20}$ is O, S, or $NR^{118}$; $R^{118}$, $R^{41}$ and m and n are as defined above and p is 0, 1, or 2, especially 0 or 1, $R^{42'}$ is H, or $R^{42}$.

$R^{41}$ and $R^{42}$ are preferably H, $C_1$-$C_{18}$alkyl, which may optionally be interrupted by —O—; $C_1$-$C_{18}$alkoxy, $C_6$-$C_{12}$aryl, which may optionally be substituted by $C_1$-$C_{12}$alkoxy, or $C_1$-$C_{12}$alkyl. Among the above groups $HEI^{II}$ the units of formula IIIa, IIIc, and IIIi are more preferred, wherein the following groups group $HEI^{II}$ are especially preferred:

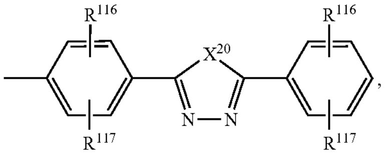

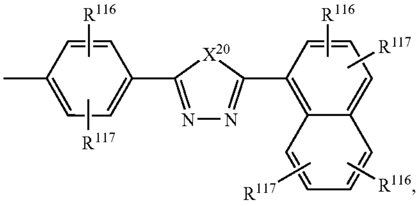

and

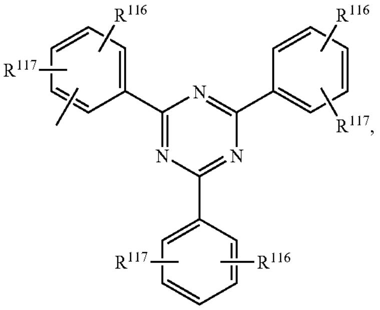

wherein $X^{20}$ is O, or

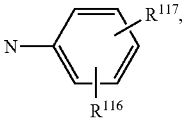

wherein $R^{116}$ and $R^{117}$ are as defined above.

Preferred groups $HEI^{III}$, which increases the hole-injection and/or hole-transport properties of the polymers and the electron-injection and/or electron-transport properties of the polymers, are:

(IVa)

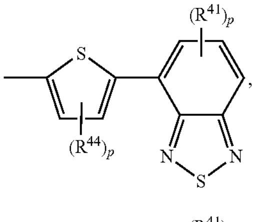

(IVb)

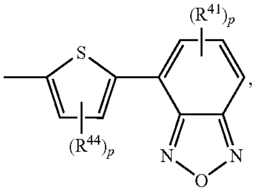

-continued (IVc)

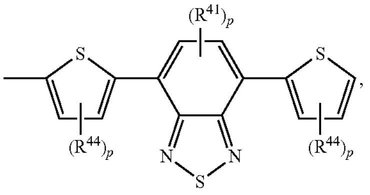

(IVd)

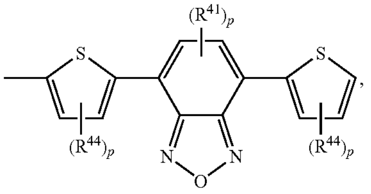

(IVe)

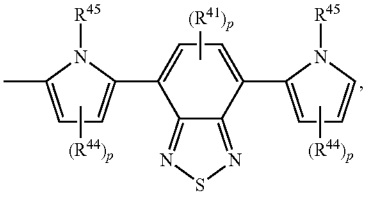

(IVf)

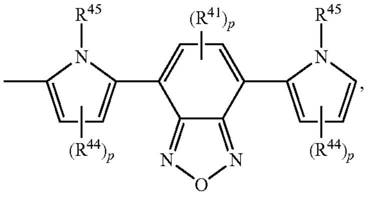

(IVg)

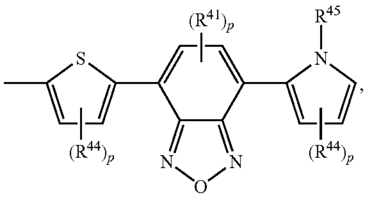

(IVh)

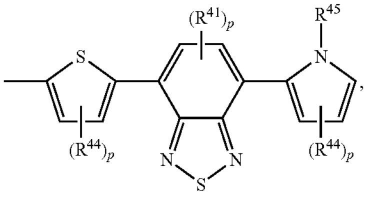

(IVi)

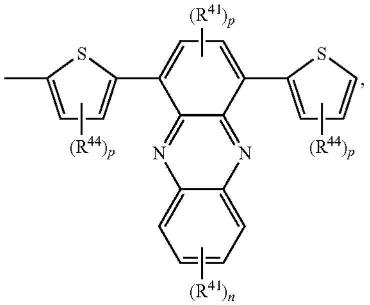

-continued (IVj)

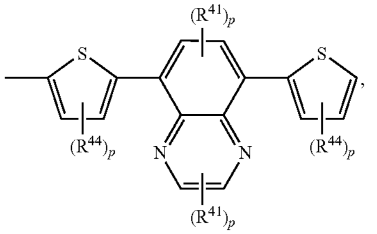

(IVk)

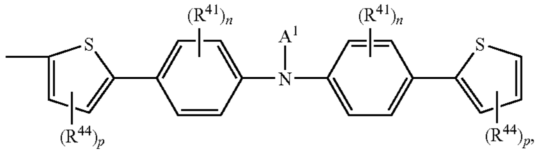

(IVl)

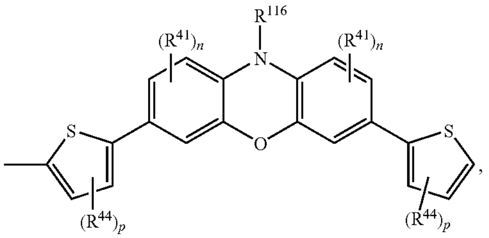

(IVm)

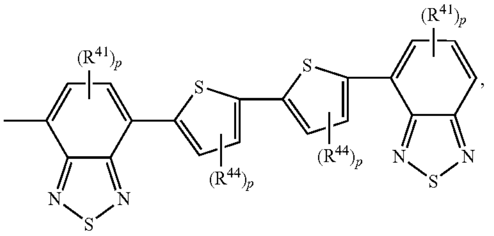

(IVn)

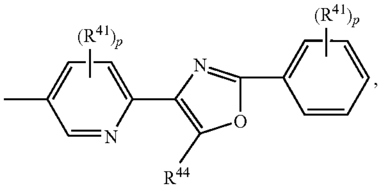

(IVo)

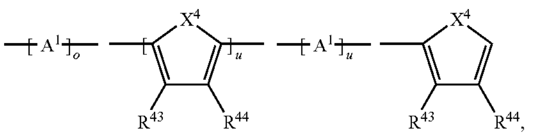

(IVp)

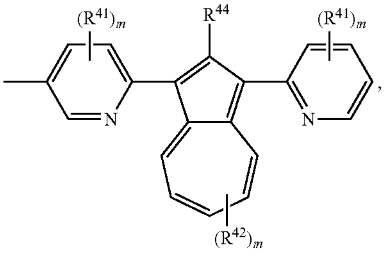

-continued (IVq)

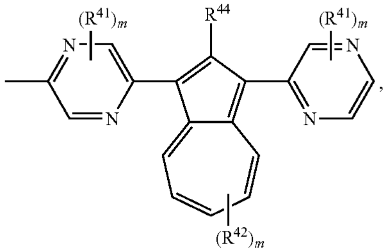

(IVr)

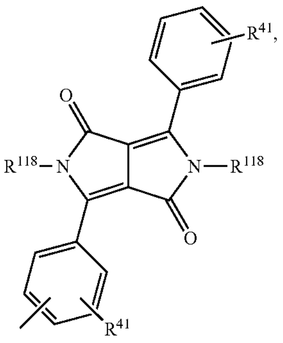

or (IVs)

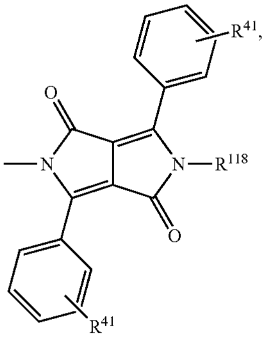

wherein $X^4$ is O, S, or $NR^{45}$, $R^{43}$ is a hydrogen atom, a $C_1$-$C_{25}$alkyl group, a $C_4$-$C_{18}$cycloalkyl group, a $C_1$-$C_{25}$alkoxy group, in which one or more carbon atoms which are not in neighbourhood to each other could be replaced by —$NR^{45}$—, —O—, —S—, —C(═O)—O—, or, —O—C(═O)—O—, and/or wherein one or more hydrogen atoms can be replaced by F, a $C_6$-$C_{24}$aryl group, or a $C_6$-$C_{24}$aryloxy group, wherein one or more carbon atoms can be replaced by O, S, or N, and/or which can be substituted by one or more non-aromatic groups $R^{41}$, or CN, or two or more groups $R^{43}$ and/or $R^{44}$, which are in neighbourhood to each other, form a ring;

o is 1, 2, or 3, especially 1, or 2, u is 1, 2, 3, or 4, and $A^1$, $R^{41}$, $R^{42}$, $R^{44}$, $R^{45}$, m, n and p are as defined above.

Among the repeating units of formula X, XI, XII, XVI, XVII and XVIII compounds of formula
(Xa)
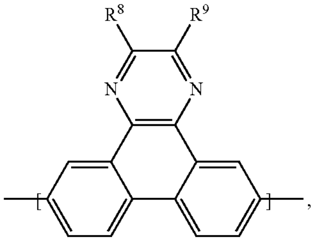
(Xb)
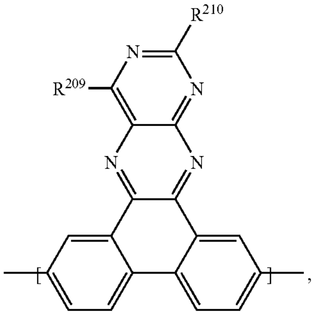
(Xc)
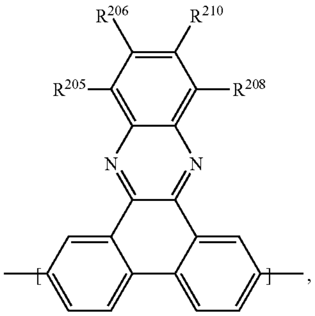
(XIa)
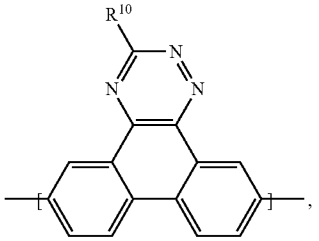
(XIIa)
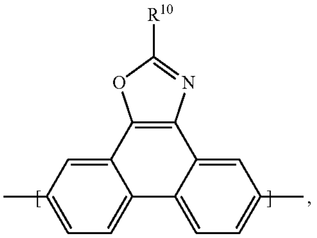
-continued
(XIIb)
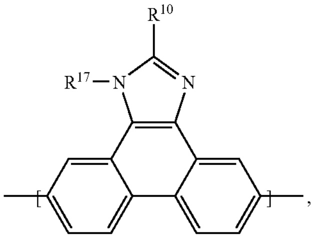
, or
(XIIc)
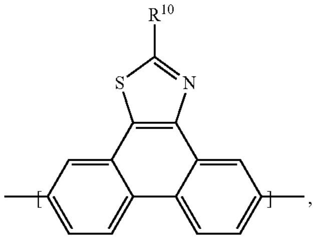
(XVIa)
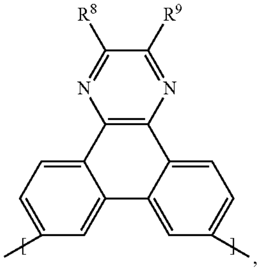
(XVIb)
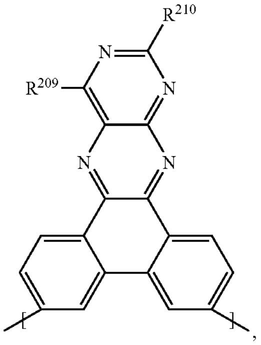
(XVIc)
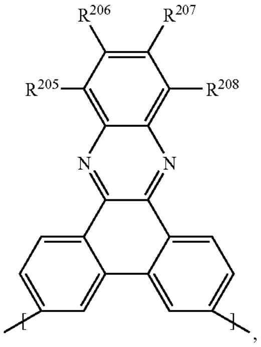

-continued (XVIIa)

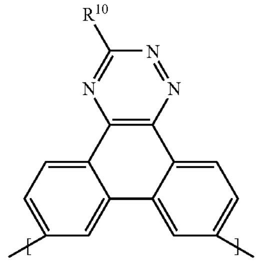

, (XVIIIa)

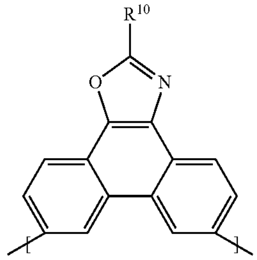

, (XVIIIb)

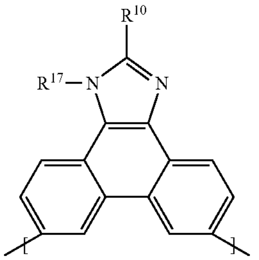

, or (XVIIIc)

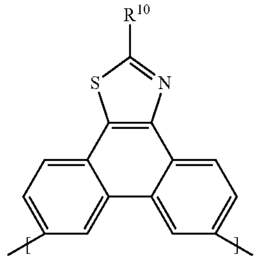

, are most preferred, wherein $R^8$ and $R^9$ are independently of each other H, $C_1$-$C_{18}$alkyl, $C_1$-$C_{18}$alkyl which is interrupted by D, $C_1$-$C_{18}$perfluoroalkyl, $C_1$-$C_{18}$alkoxy, $C_1$-$C_{18}$alkoxy which is interrupted by D, or a group —$X^2$—$R^{18}$, or $R^{10}$ is H, $C_6$-$C_{18}$aryl, which can be substituted by G, $C_2$-$C_{18}$heteroaryl, which can be substituted by G, $C_1$-$C_{18}$alkyl, $C_1$-$C_{18}$alkyl which is interrupted by D, $C_1$-$C_{18}$perfluoroalkyl, $C_1$-$C_{18}$alkoxy, $C_1$-$C_{18}$alkoxy which is substituted by E and/or interrupted by D, or a group —$X^2$—$R^{18}$, wherein $X^2$ is a spacer, such as $C_6$-$C_{12}$aryl, or $C_6$-$C_{12}$heteroaryl, especially phenyl, or naphthyl, which can be substituted one, or more times, especially one to two times with $C_1$-$C_{18}$alkyl, $C_1$-$C_{18}$alkyl which is interrupted by D, $C_1$-$C_{18}$perfluoroalkyl, $C_1$-$C_{18}$alkoxy, or $C_1$-$C_{18}$alkoxy which is substituted by E and/or interrupted by D, $R^{17}$ is $C_6$-$C_{18}$aryl; $C_6$-$C_{18}$aryl which is substituted by $C_1$-$C_{18}$alkyl, $C_1$-$C_{18}$perfluoroalkyl, or $C_1$-$C_{18}$alkoxy; $C_1$-$C_{18}$alkyl; or $C_1$-$C_{18}$alkyl which is interrupted by —O—; and $R^{18}$ is H, $C_1$-$C_{18}$alkyl, $C_1$-$C_{18}$alkyl which is interrupted by D, $C_1$-$C_{18}$perfluoroalkyl, $C_1$-$C_{18}$alkoxy, $C_1$-$C_{18}$alkoxy which is interrupted by D, $R^{205}$, $R^{206}$, $R^{207}$, $R^{208}$, $R^{209}$ and $R^{210}$ are independently of each other H, $C_1$-$C_{18}$alkyl which is interrupted by D, $C_1$-$C_{18}$perfluoroalkyl, $C_1$-$C_{18}$alkoxy, $C_1$-$C_{18}$alkoxy which is interrupted by D; with the proviso that at least one of $R^8$, $R^9$, $R^{10}R^{17}$, $R^{205}$, $R^{206}$, $R^{207}$, $R^{208}$, $R^{209}$ and $R^{210}$ is a group -$(Sp)_{x1}$-HEI.

Preferably at least one of $R^8$, $R^9$, $R^{10}$, $R^{17}$, $R^{206}$, $R^{207}$, $R^{209}$ and $R^{210}$ is a group -$(Sp)_{x1}$-HEI.

Sp is selected from —Ar—, —ArY—, —YAr—, —YAr$(CR^{147}R^{148})_{n20}$—, -Alk-, such as —$(CR^{147}R^{148})_{n20}$—, —$(Y(CR^{147}R^{148})_{n21})_{n20}$—, or —$((CR^{147}R^{148})_{n21}Y)_{n20}$—, —Ar-Alk-, -Alk-Ar—, or -Alk-Ar-Alk-, wherein Y is $NR^{149}$, O, S, C═O, C(═O)O, wherein $R^{149}$ is H; $C_6$-$C_{18}$aryl; $C_6$-$C_{18}$aryl which is substituted by $C_1$-$C_{18}$alkyl, or $C_1$-$C_{18}$alkoxy; $C_1$-$C_{18}$alkyl; or $C_1$-$C_{18}$alkyl which is interrupted by —O—;

$R^{147}$ and $R^{148}$ are independently of each other hydrogen, fluorine, or $C_1$-$C_{20}$alkyl, n20 is an integer of 1 to 20, n21 is 1, 2, or 3;

Ar is cycloalkylen, arylen, aralkylene, or heteroarylen, which can optionally be substituted, Alk is alkylen.

Preferred arylene radicals are 1,4-phenylene, 2,5-tolylene, 1,4-naphthylene, 1,9antracylene, 2,7-phenantrylene and 2,7-dihydrophenantrylene, which can optionally be substituted.

Preferred heteroarylene radicals are 2,5-pyrazinylene, 3,6-pyridazinylene, 2,5-pyridinylene, 2,5-pyrimidinylene, 1,3,4-thiadiazol-2,5-ylene, 1,3-thiazol-2,4-ylene, 1,3-thiazol-2,5-ylene, 2,4-thiophenylene, 2,5-thiophenylene, 1,3-oxazol-2,4-ylene, 1,3-oxazol-2,5-ylene and 1,3,4-oxadiazol-2,5-ylene, 2,5-indenylene and 2,6-indenylene, which can optionally be substituted.

The term "alkylene (spacer)" is typically $C_1$-$C_{30}$alkylene, preferably $C_1$-$C_{18}$alkylene, and embraces the linear as well as the branched representatives and can be, for example, —$CH_2$— and $C_2$-$C_{30}$alkylene, such as —$(CH_2)_2$—, —CH(Me)-, —$(CH_2)_3$—, —$CH_2$—CH(Me)-, —$C(Me)_2$-, —$(CH_2)_4$—, —$(CH_2)_5$—, —$(CH_2)_6$—, —$(CH_2)_7$—, —$(CH_2)_8$—, —$(CH_2)_9$—, —$(CH_2)_{10}$—, —$(CH_2)_{11}$—, —$(CH_2)_{12}$—, —$(CH_2)_{13}$—, —$(CH_2)_{14}$—, —$(CH_2)_{15}$—, —$(CH_2)_{16}$—, —$(CH_2)_{17}$—, —$(CH_2)_{18}$—, —$(CH_2)_{19}$—, —$(CH_2)_{20}$, —$(CH_2)_{21}$—, —$(CH_2)_{22}$—, —$(CH_2)_{23}$—, —$(CH_2)_{24}$—, —$(CH_2)_{25}$—, —$(CH_2)_{26}$—, —$(CH_2)_{27}$—, —$(CH_2)_{28}$—, —$(CH_2)_{29}$—, —$(CH_2)_{30}$—, preferably —$CH_2$—, —$(CH_2)_2$—, —$(CH_2)_3$—, —$(CH_2)_4$—, —$(CH_2)_5$—, —$(CH_2)_6$—, —$(CH_2)_7$—, —$(CH_2)_8$—, —$(CH_2)_9$—, —$(CH_2)_{10}$—, —$(CH_2)_{11}$—, —$(CH_2)_{12}$—, —$(CH_2)_{13}$—, —$(CH_2)_{14}$—, —$(CH_2)_{15}$—, —$(CH_2)_{16}$—, —$(CH_2)_{17}$—, —$(CH_2)_{18}$—, and also —CH($C_2$-$C_{30}$alkylene)-. The "alkylene spacer" can optionally comprise one or more, in particular one or two groups selected from —O—, —S—, —$NR^{45}$—, —CO—, —CONH—, —$CONR^{45}$—, or —COO— as linking group, such as —O—$(X_{14})_{n3}$—, especially —$OCH_2CH_2O$—, $O(CH_2CH_2O)_2$—, $O(CH_2CH_2O)_3$—; or —$O(CH_2)_{n4}$—$CHX_{15}$—$(CH_2)_{n4}O$—, wherein n4 is an integer from 1 to 10, preferably 1 to 5, and $X_{15}$ is $C_1$-$C_{18}$alkoxy. $C_1$-$C_{30}$alkylene can, for example, be interrupted several times by —O—, —S—, —NH— or —C(O)NH—, such as —$(CH_2)_2$—O—$(CH_2)$—, —$(CH_2)_2$—O—$(CH_2)_2$—, —$(CH_2)_2$—S—$(CH_2)_2$—, —$CH_2$—CH—$CH_2$—O—$(CH_2)_{p1}$—, wherein p1 is an integer from 1 to 10; or —$CHX_{13}CH_2$—$(X_{14})_{n3}$—O—, wherein $X_{13}$ is $C_1$-$C_8$alkyl, $X_{14}$ is an alkylene oxide monomer, preferably ethylene oxide or propylene oxide, or alkylene amino monomer, preferably amino ethylene or amino propylene, and n3 is an integer from 1 to 10, preferably 1 to 5; or $-(CH_2)_2-NH-(CH_2)_2-$ or $-(CH_2)_2-C(O)NH-(CH_2)_2-$.

"Arylene (spacer)" is an unsubstituted or substituted carbocylic or heterocyclic arylene group, preferably containing 6 to 14 carbon atoms, typically phenylene, naphthylene, anthracenylene, anthraquinonylene, pyridinylene, quinolinylene, preferably a group

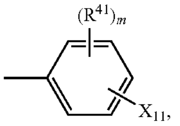
or
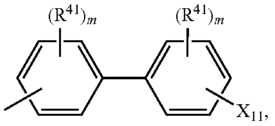

wherein $R^{41}$ and m are as defined above, $X_{11}$ is a single bond in ortho-, meta- or para-position, or —O—, —S—, $-NR^{43}-$, —CO—, —CONH—, $-CONR^{43}-$, or —COO— in ortho-, meta- or para-position; para-phenylene and para-phenylenoxy are preferred.

"Aralkylene (spacer)" is an unsubstituted or substituted carbocylic or heterocyclic aralkylene group, preferably containing 6 to 14 carbon atoms, preferably a group

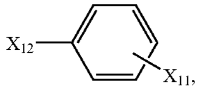

wherein $X_{11}$ is a single bond in ortho-, meta- or para-position, or —O—, —S—, $-NR^{43}-$, —CO—, —CONH—, $-CONR^{43}-$, or —COO— in ortho-, meta- or para-position, and $X_{12}$ is alkylene, or a group

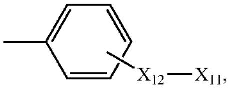

wherein $X_{12}$ is alkylene in ortho-, meta- or para-position and $X_{11}$ is a single bond, —O—, —S—, $-NR^{45}-$, —CO—, —CONH—, $-CONR^{45}-$, or —COO—.

"Cycloalkylene (spacer)" is an unsubstituted or substituted carbocylic or heterocyclic cycloalkylene group, preferably containing 6 to 14 carbon atoms, typically cyclopentylene, or cyclohexylene, which can optionally be condensed one or two times by phenyl which can be substituted one to three times with $C_1$-$C_8$alkyl, or $C_1$-$C_8$alkoxy; preferably a group

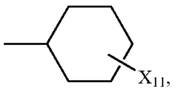
or
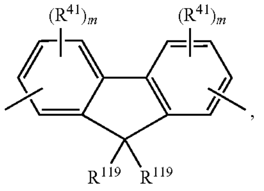

wherein $R^{120}$, $R^{119}$, $R^{41}$ and m are as defined above, $X_{11}$ is a single bond in 2-, 3- or 4-position, or —O—, —S—, $-NR^{45}-$, —C—, —CONH—, $-CONR^{45}-$, or —COO— in 2-, 3- or 4-position; 4-cyclohexylene and 4-cyclohexylenoxy are preferred.

The following groups $-(Sp)_{x1}$-HEI are preferred:

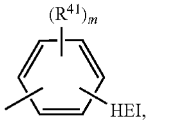
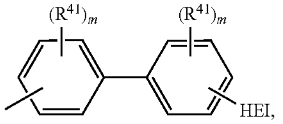

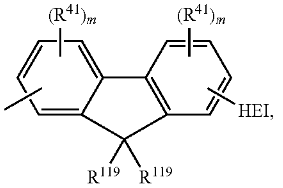

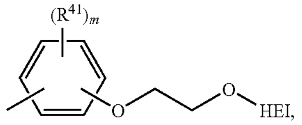

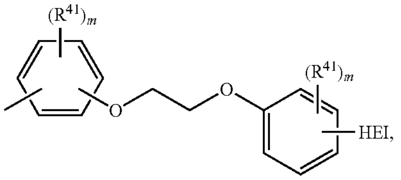

$-OCH_2CH_2O$-HEI, $-O(CH_2CH_2O)_2$-HEI, $-O(CH_2CH_2O)_3$-HEI, and $-OCH_2CH(OR^{69})CH_2O$-HEI, wherein m, $R^{41}R^{119}$ and HEI are as defined above, and $R^{69}$ is $C_1$-$C_{18}$alkoxy.

As used herein the term "polymer of the present invention" refers to polymers having repeating units of formula I, especially repeating units of formula X, XI and/or XII (XVI, XVII and XVIII), very especially repeating units of formula Xa, XIa, XIIa and/or XIIb.

In a preferred embodiment the present invention is directed to polymers comprising repeating units of formula XII, especially XIIb, wherein either $R^{10}$, or $R^{17}$, or both of them are a group -Sp-HEI.

In another preferred embodiment the present invention is directed to polymers comprising repeating units of formula X, especially Xa, wherein either $R^8$, or $R^9$, or both of them are a group -Sp-HEI.

The following repeating units of formula I are especially preferred:
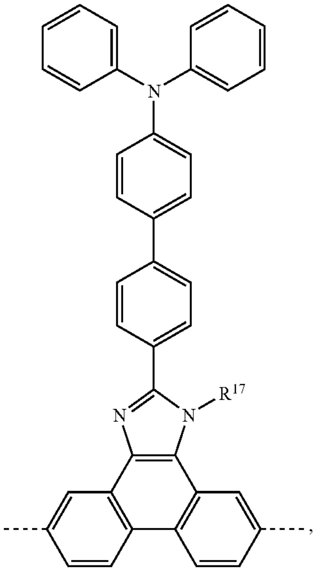
,
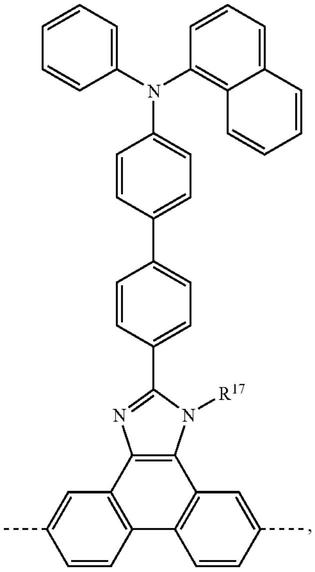
,
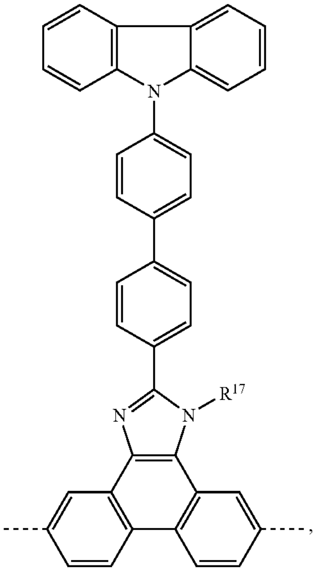
,
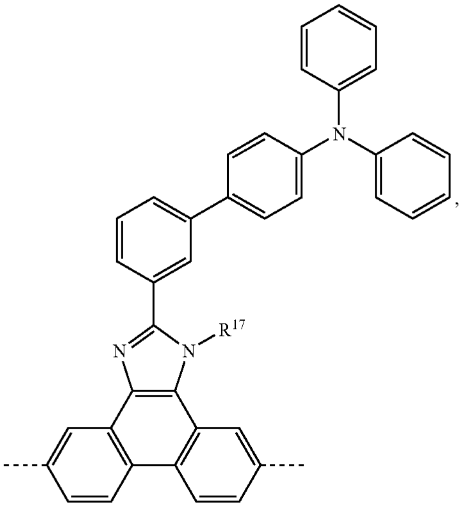
,
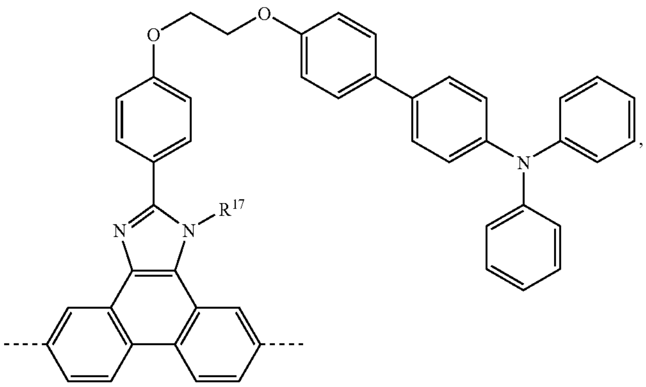
, -continued
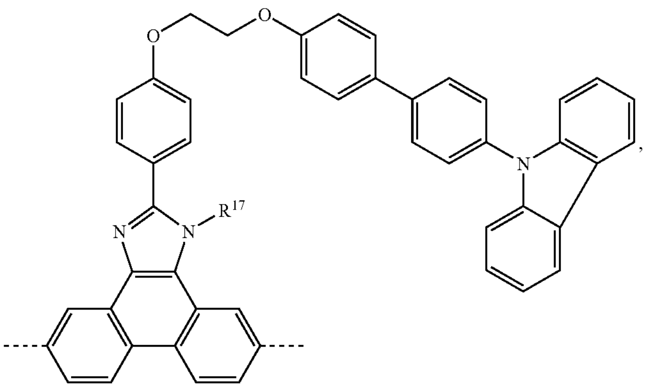
,
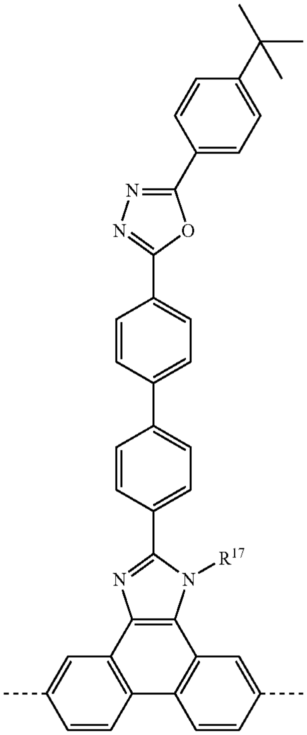
,
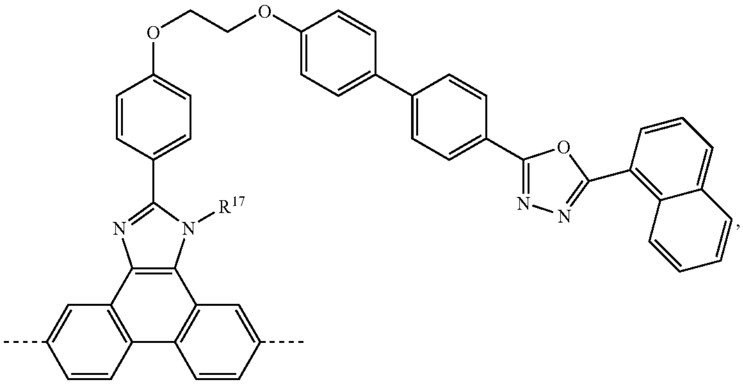
,
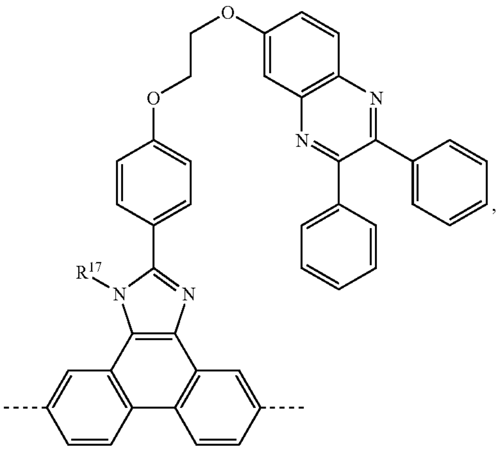
,
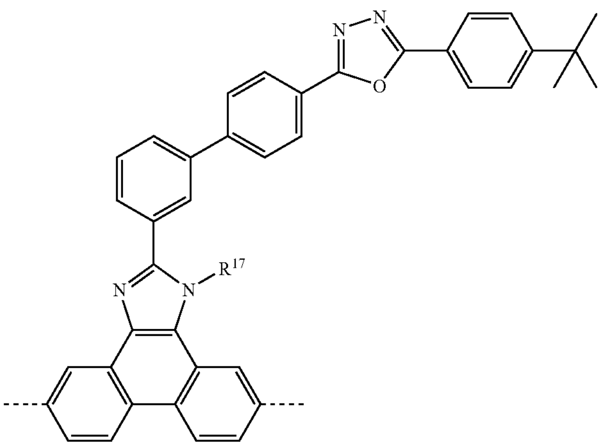
, -continued
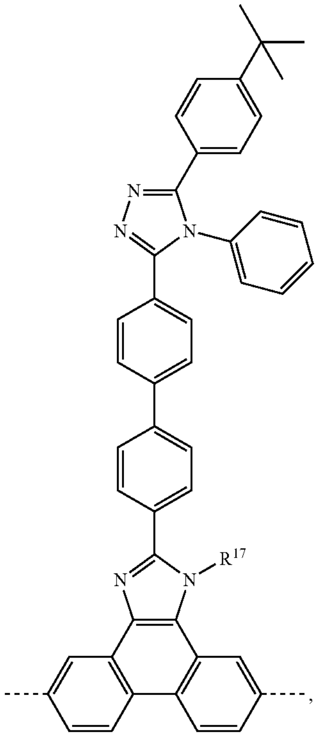
,
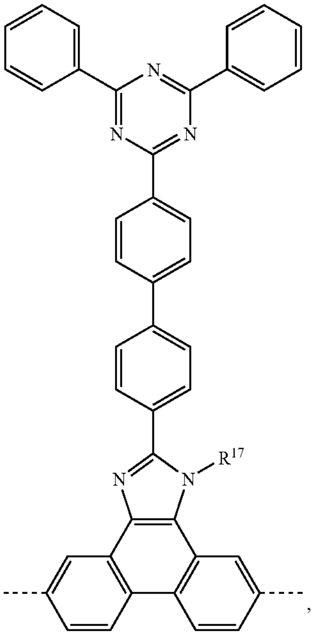
,
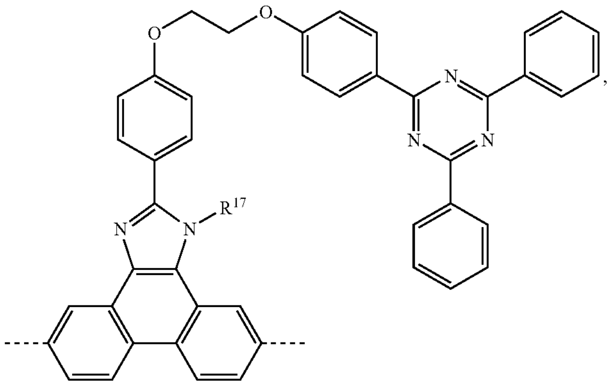
,
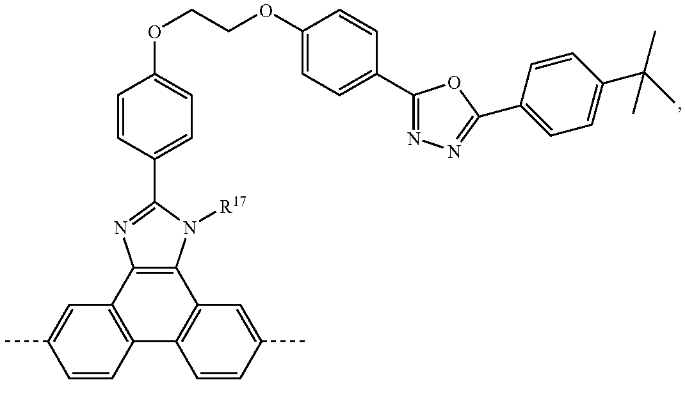
, -continued

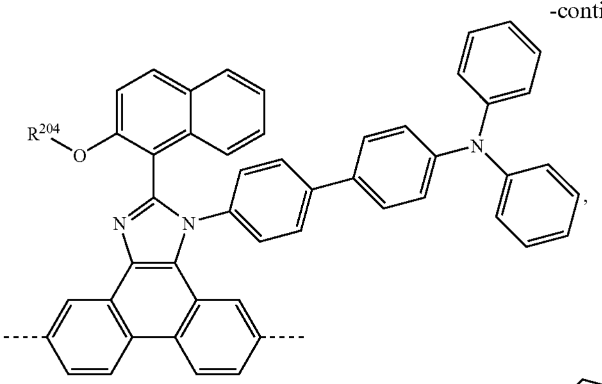
,
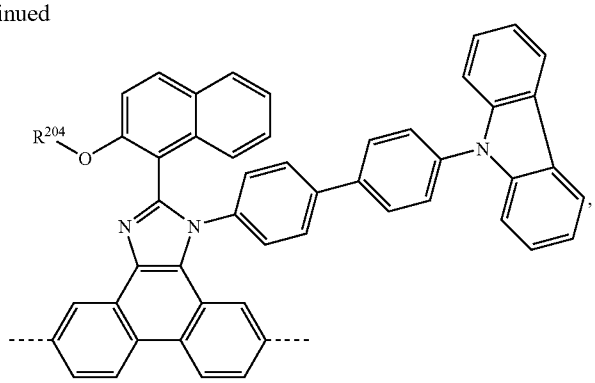
,
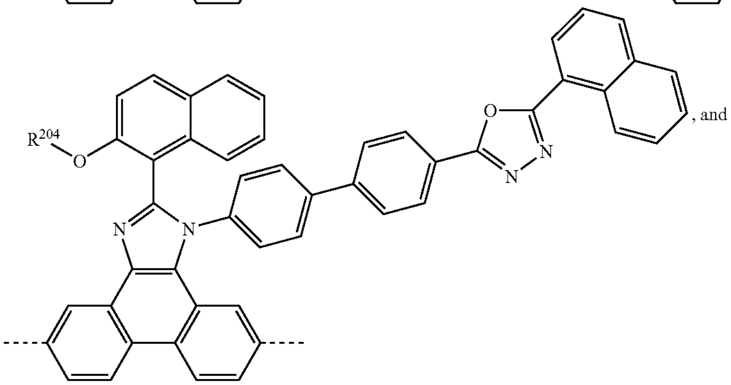
, and
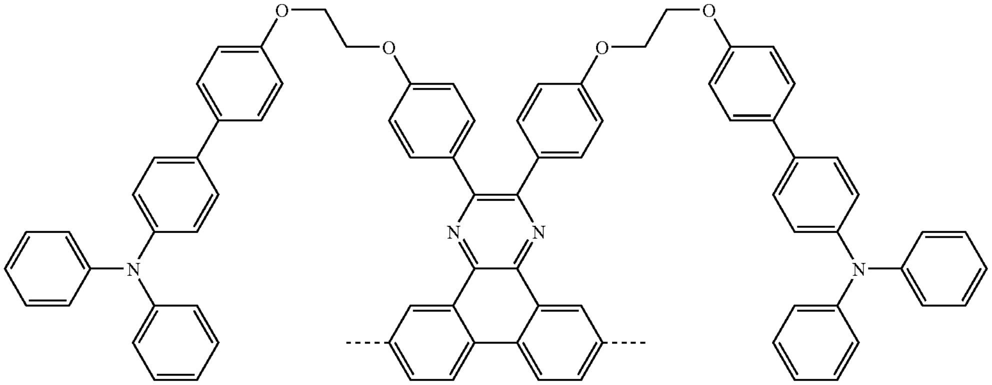

wherein $R^{17}$ is $C_4$-$C_{25}$alkyl, such as n-butyl, sec.-butyl, isobutyl, tert.-butyl, n-pentyl, 2-pentyl, 3-pentyl, 2,2-dimethylpropyl, n-hexyl, n-heptyl, n-octyl, 1,1,3,3-tetramethylbutyl, 2-ethylhexyl, n-nonyl, n-decyl, n-undecyl, n-dodecyl, tridecyl, tetradecyl, pentadecyl, hexadecyl, 2-hexyldecyl, heptadecyl, octadecyl, eicosyl, heneicosyl, docosyl, tetracosyl, or pentacosyl, especially 2-ethylhexyl, n-octyl, 2-hexyldecyl, or 1-hexyldecyl, and $R^{204}$ is $C_4$-$C_{25}$alkyl, such as n-butyl, sec.-butyl, isobutyl, tert.-butyl, n-pentyl, 2-pentyl, 3-pentyl, 2,2-dimethylpropyl, n-hexyl, n-heptyl, n-octyl, 1,1,3,3-tetramethylbutyl, 2-ethylhexyl, n-nonyl, n-decyl, n-undecyl, n-dodecyl, tridecyl, tetradecyl, pentadecyl, hexadecyl, 2-hexyldecyl, heptadecyl, octadecyl, eicosyl, heneicosyl, docosyl, tetracosyl, or pentacosyl, especially 2-ethylhexyl, n-octyl, 2-hexyldecyl, or 1-hexyldecyl. Advantageous groups can be represented by formula

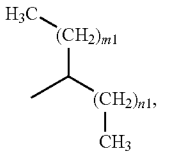

wherein m1=n1+4 and m1+n1≦22.

The present invention is illustrated in more detail on the basis of repeating units of formula X, XI and/or XII, but is not limited thereto.

In a first aspect, the present invention relates to polymers comprising a repeating unit of the formula I, especially repeating units of formula X, XI and/or XII, very especially repeating units of formula Xa, XIa, XIIa and/or XIIb.

The polymers of formula I can contain in addition to the repeating unit (recurring unit) of formula I one or more repeating units $Ar^3$ and/or T. $Ar^3$ is selected from the following groups:

group XXII: units, which increase the hole-injection or hole-transport properties of the polymers;

group XXIII: units, which increase the electron-injection or electron-transport properties of the polymers;

group XXIV: units, which are combinations of units of group XXII and XXIII;

group XXV:

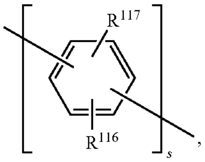

,

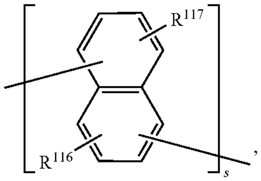

,

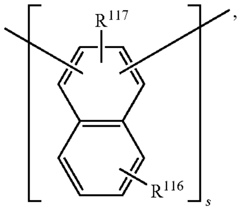

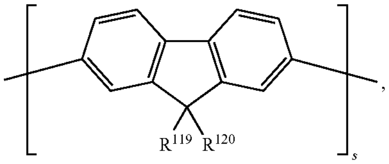

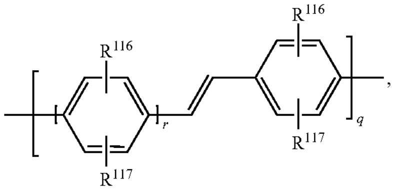

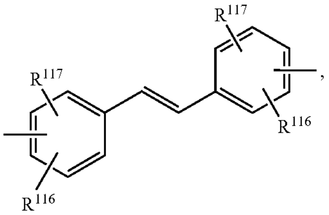

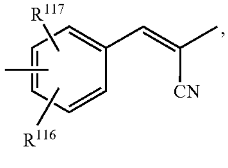

, especially (XXVa)

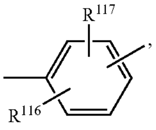

(XXVb)

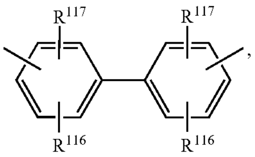

-continued (XXVc)

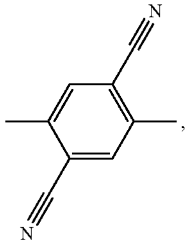

, or (XXVd)

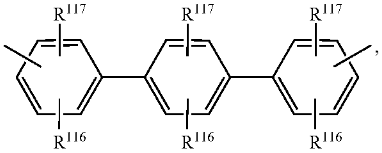

(XXVe)

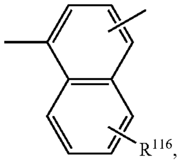

(XXVf)

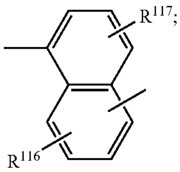

especially

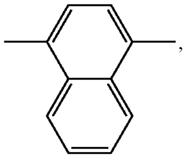

,

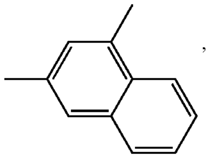

,

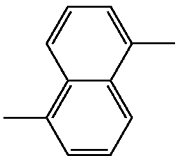

or

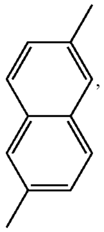

(XXVg)

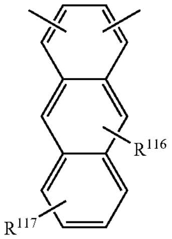

(XXVh)

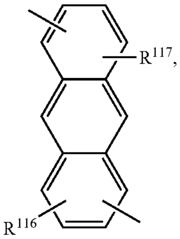

-continued (XXVi)

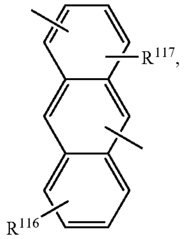

(XXVj)

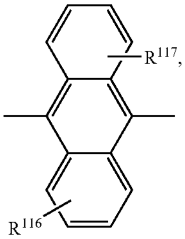

(XXVk)

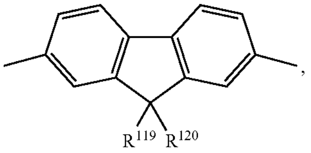

(XXVl)

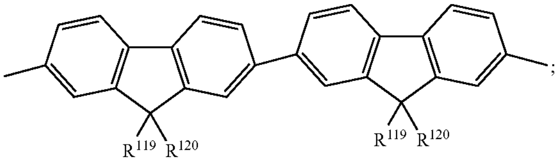

(XXVm)

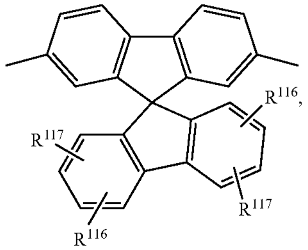

or (XXVn)

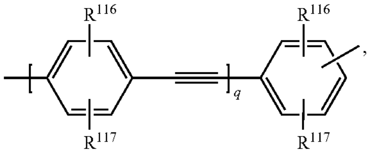

wherein r is an integer from 1 to 10, especially 1, 2 or 3, q is an integer from 1 to 10, especially 1, 2 or 3, s is an integer from 1 to 10, especially 1, 2 or 3, $R^{116}$, $R^{117}$, $R^{119}$ and $R^{120}$ are as defined above.

Among the above units of group XXV the units of formula XXVe, especially XXVa, XXVk and XXVm are more preferred.

The repeating units T are selected from the following group XXVI:

(XXVIa)

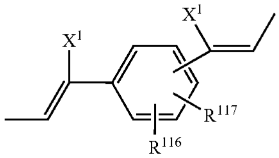

, especially

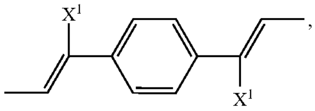

(XXVIb)

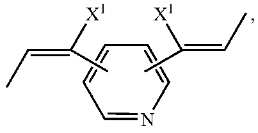

(XXVIc)

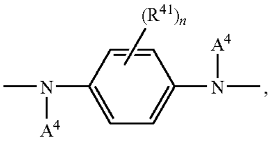

(XXVId)

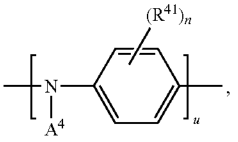

(XXVIe)

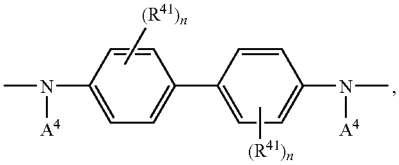

, or (XXVIf)

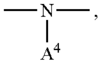

wherein $X^1$ is a hydrogen atom, or a cyano group, $R^{116}$ and $R^{117}$ are as defined above, $R^{41}$ can be the same or different at each occurrence and is Cl, F, CN, $N(R^{45})_2$, a $C_1$-$C_{25}$alkyl group, a $C_4$-$C_{18}$cycloalkyl group, a $C_1$-$C_{25}$alkoxy group, in which one or more carbon atoms which are not in neighbourhood to each other could be replaced by —$NR^{45}$—, —O—, —S—, —C(=O)—O—, or —O—C(=O)—O—, and/or wherein one or more hydrogen atoms can be replaced by F, a $C_6$-$C_{24}$aryl group, or a $C_6$-$C_{24}$aryloxy group, wherein one or more carbon atoms can be replaced by O, S, or N, and/or which can be substituted by one or more non-aromatic groups $R^{41}$, or two or more groups $R^{41}$ form a ring system;

$R^{45}$ is H, a $C_1$-$C_{25}$alkyl group, a $C_4$-$C_{18}$cycloalkyl group, in which one or more carbon atoms which are not in neighbourhood to each other could be replaced by —$NR^{45'}$—, —O—, —S—, —C(=O)—O—, or, —O—C(=O)—O—, and/or wherein one or more hydrogen atoms can be replaced by F, a $C_6$-$C_{24}$aryl group, or a $C_6$-$C_{24}$aryloxy group, wherein one or more carbon atoms can be replaced by O, S, or N, and/or which can be substituted by one or more non-aromatic groups $R^{41}$ $R^{45'}$ is H, a $C_1$-$C_{25}$alkyl group, or a $C_4$-$C_{18}$cycloalkyl group, n can be the same or different at each occurrence and is 0, 1, 2, or 3, especially 0, 1, or 2, very especially 0 or 1, and u is 1, 2, 3, or 4;

$A^4$ is a $C_6$-$C_{24}$aryl group, a $C_2$-$C_{30}$heteroaryl group, especially phenyl, naphthyl, anthryl, biphenylyl, 2-fluorenyl, phenanthryl, or perylenyl, which can be substituted by one or more non-aromatic groups $R^{41}$.

Preferred units of group XXII, which increase the hole-injection or hole-transport properties of the polymers, are:

(XXIIa)

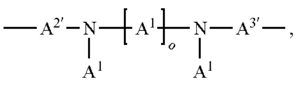

(XXIIb)

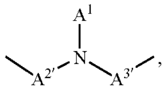

(XXIIc)

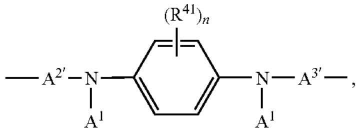

(XXIId)

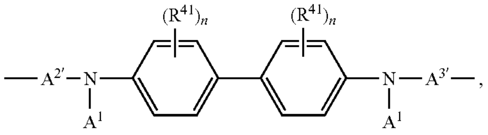

(XXIIe)

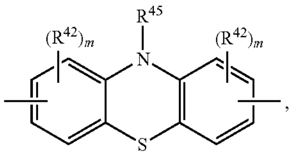

(XXIIf)

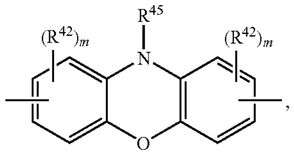

(XXIIg)

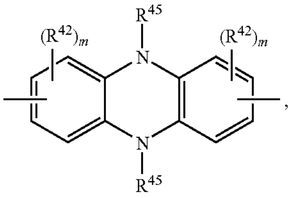

(XXIIh)

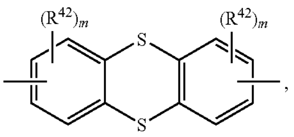

(XXIIi)

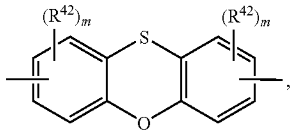

-continued (XXIIj)

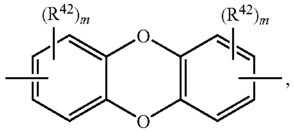

(XXIIk)

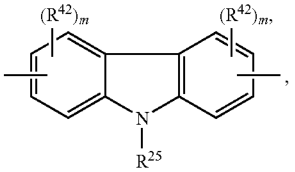

(XXIIl)

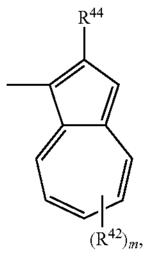

(XXIIm)

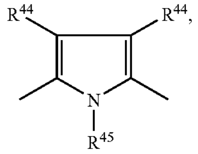

(XXIIn)

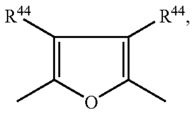

(XXIIo)

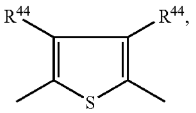

including

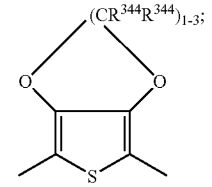

(XXIIp)

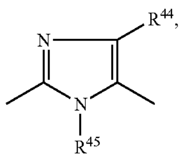

(XXIIq)

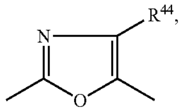

(XXIIr)

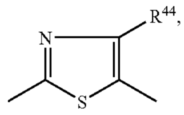

or

-continued (XXIIs)

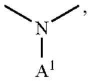

wherein $R^{344}$ can be the same or different at each occurrence and are a hydrogen atom, a $C_1$-$C_{25}$alkyl group, a $C_4$-$C_{18}$cycloalkyl group, or a $C_1$-$C_{25}$alkoxy group, o is 1, 2, or 3, especially 1, or 2, $A^2$ and $A^3$ are independently of each other $A^2$, or

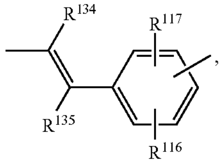

, or

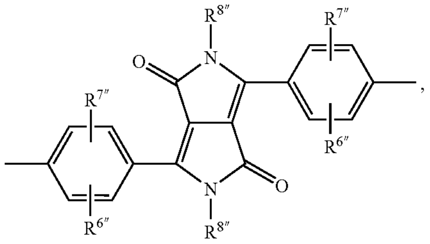

wherein $R^{116}$ and $R^{117}$ are as defined above, $R^{6''}$ and $R^{7''}$ are have independently of each other the meaning of $R^{116}$, $R^{8''}$ are H, $C_1$-$C_{18}$alkyl, $C_1$-$C_{18}$alkyl which is substituted by E and/or interrupted by D, $C_6$-$C_{24}$aryl, or $C_7$-$C_{25}$aralkyl, which are optionally substituted by G, $R^{134}$ and $R^{135}$ are independently of each other H, $C_1$-$C_{18}$alkyl, $C_1$-$C_{18}$alkyl which is substituted by E and/or interrupted by D, $C_6$-$C_{24}$aryl, $C_6$-$C_{24}$aryl which is substituted by E, or $C_2$-$C_{20}$heteroaryl, $C_2$-$C_{20}$heteroaryl which is substituted by E, wherein D, E and G are as defined above. Among the above units of group XXII the units of formula XXIIa, XXIIb and XxIIIk are more preferred.

Preferably, $R^{134}$ and $R^{135}$ are independently of each other H, $C_1$-$C_{12}$alkyl, such as methyl, ethyl, n-propyl, iso-propyl, n-butyl, isobutyl, or sec-butyl, or $C_6$-$C_{14}$aryl, such as phenyl, naphthyl, or biphenylyl.

Preferred units of group XXIII, which increase the electron-injection or electron-transport properties of the polymers, are:

(XXIIIa)

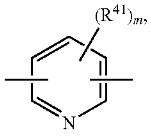

(XXIIIb)

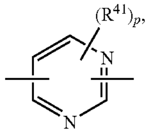

-continued (XXIIIc)

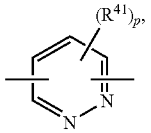

(XXIIId)

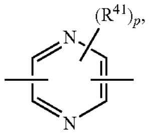

(XXIIIe)

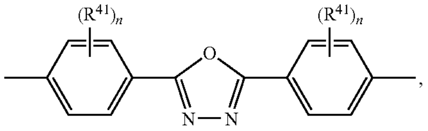

(XXIIIe')

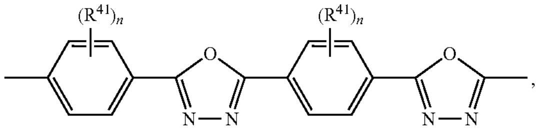

(XXIIIe'')

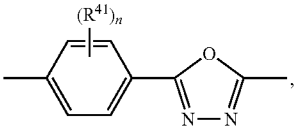

(XXIIIf)

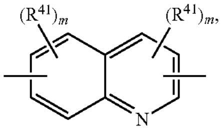

(XXIIIg)

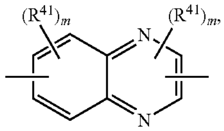

(XXIIIh)

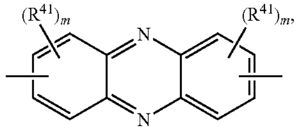

(XXIIIi)

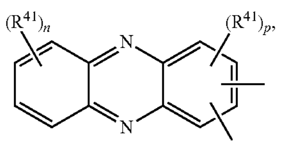

(XXIIIj)

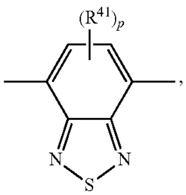

-continued (XXIIIk)

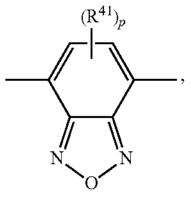

(XIIIl)

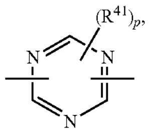

(XXIIIm)

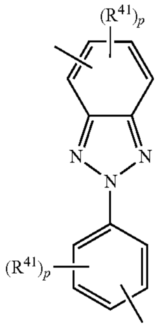

(XXIIIn)

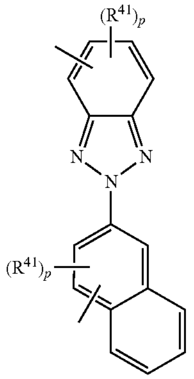

(XXIIIo)

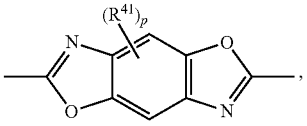

(XXIIIp)

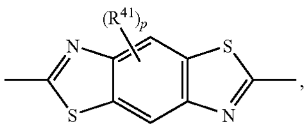

, or

-continued (XXIIIq)

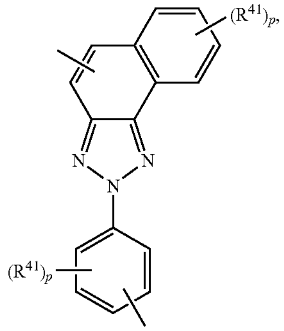

wherein $R^{41}$ and m and n are as defined above and p is 0, 1, or 2, especially 0 or 1. Among the above units of group XXIII the units of formula XXIIIe, XXIIIj, and XXIIIk are more preferred.

Preferred units of group XXIV, which are combinations of units of formula XXII and XXIII, are:

(XXIVa)

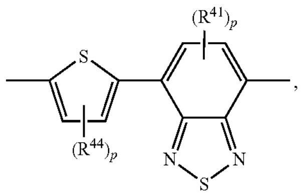

(XXIVb)

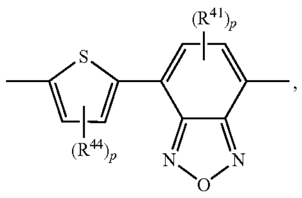

(XXIVc)

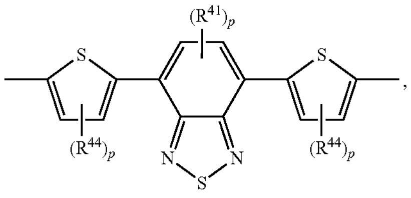

(XXIVd)

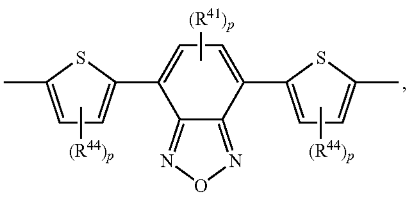

(XXIVe)

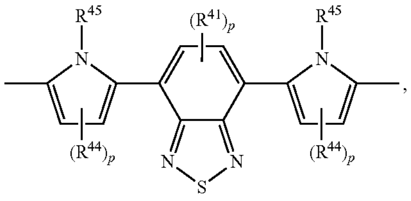

-continued (XXIVf)

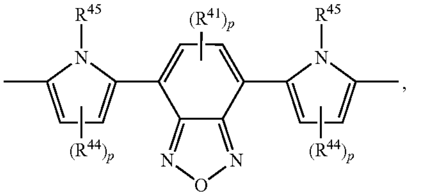

(XXIVg)

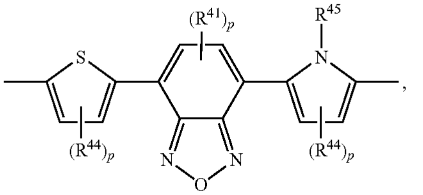

(XXIVh)

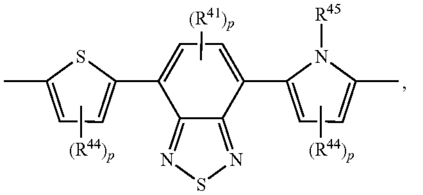

(XXIVi)

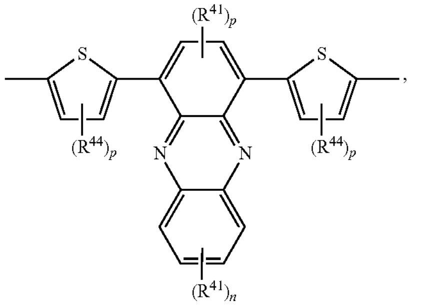

(XXIVj)

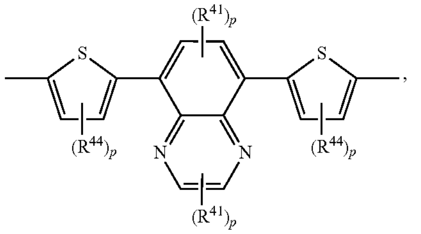

(XXIVk)

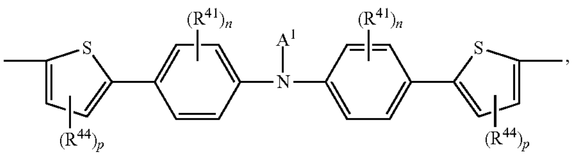

(XXIVl)

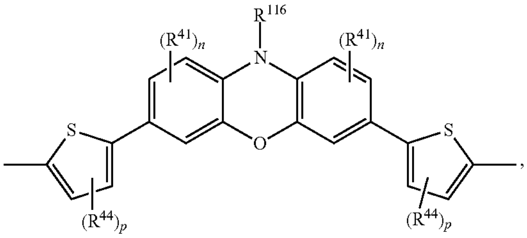

-continued (XXIVm)

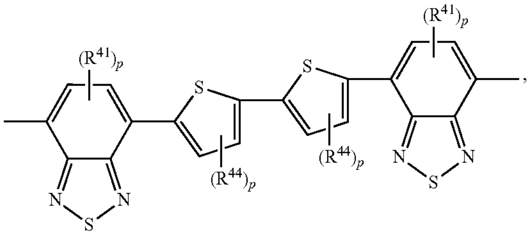

(XXIVn)

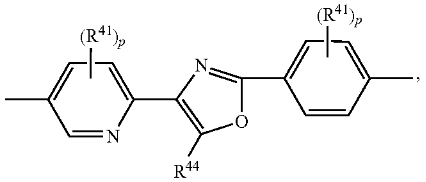

(XXIVo)

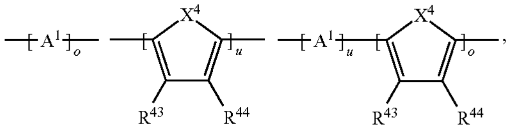

(XXIVp)

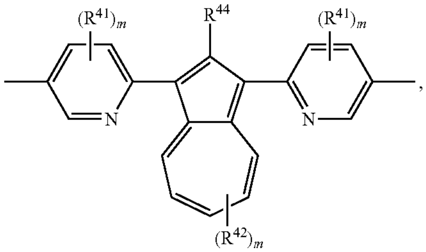

, or (XXIVq)

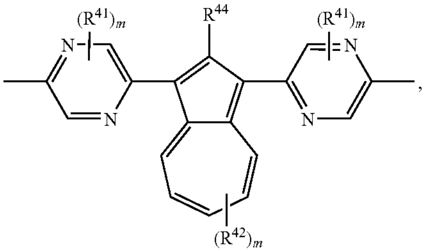

wherein $X^4$ is O, S, or $NR^{45}$, $R^{43}$ is a hydrogen atom, a $C_1$-$C_{25}$alkyl group, a $C_4$-$C_{18}$cycloalkyl group, a $C_1$-$C_{25}$alkoxy group, in which one or more carbon atoms which are not in neighbourhood to each other could be replaced by —$NR^{45}$—, —O—, —S—, —C(═O)—O—, or, —O—C(═O)—O—, and/or wherein one or more hydrogen atoms can be replaced by F, a $C_6$-$C_{24}$aryl group, or a $C_6$-$C_{24}$aryloxy group, wherein one or more carbon atoms can be replaced by O, S, or N, and/or which can be substituted by one or more non-aromatic groups $R^{41}$, or CN, or two or more groups $R^{43}$ and/or $R^{44}$, which are in neighbourhood to each other, form a ring;

o is 1, 2, or 3, especially 1, or 2, u is 1, 2, 3, or 4, and $A^1$, $R^{41}$, $R^{42}$, $R^{44}$, $R^{45}$, m, n and p are as defined above.

Among the above units of formula XXIV units of formula (XXIVa), (XXIVb), (XXIVc), (XXIVd), and (XXIVe) are preferred.

The presence of repeating units of formula XXII to XXV can lead to the following advantages: If structures of group XXII, e.g. repeating units of formula XXIIa to XXIIr are present, improved hole-injection and/or hole-transport properties of the polymers can be observed. If used in PLEDs, the PLEDs show higher current density and electroluminescence at a given voltage. This property is of high importance in mobile applications, such as, for example, displays for mobile phones and PDAs, when the power consumption can be reduced. If structures of group XXIII, e.g. repeating units of formula XXIIIa to XXIIIk are present, improved electron-injection or electron-transport properties of the polymers are observed. The presence of structures of group XXIV, e.g. repeating units of formula XXIVa to XXIVp, enables the variation of the of the electronic band gap and, hence, a variation of the color properties.

The preparation of monomers from which the units of group XXII, XXIII, XXIV and XXV are derived, is, for example, described in WO03/020790.

In one embodiment, the polymers according to the invention consist only of one or more type of repeating units of formula I. In a preferred embodiment, the polymers according to the invention consist of precisely one type of repeating unit of formula I (homopolymers).

According to the present invention the term "polymer" comprises polymers as well as oligomers, wherein a polymer is a molecule of high relative molecular mass, the structure of which essentially comprises the repetition of units derived, actually or conceptually, from molecules of low relative molecular mass and an oligomer is a molecule of intermediate molecular mass, the structure of which essentially comprises a small plurality of units derived, actually or conceptually, from molecules of lower relative molecular mass. A molecule is regarded as having a high relative molecular mass if it has properties which do not vary significantly with the removal of one or a few of the units. A molecule is regarded as having an intermediate molecular mass if it has properties which do vary significantly with the removal of one or a few of the units.

According to the present invention a homopolymer is a polymer derived from one species of (real, implicit, or hypothetical) monomer. Many polymers are made by the mutual reaction of complementary monomers. These monomers can readily be visualized as reacting to give an "implicit monomer", the homopolymerisation of which would give the actual product, which can be regarded as a homopolymer. Some polymers are obtained by chemical modification of other polymers, such that the structure of the macromolecules that constitute the resulting polymer can be thought of having been formed by the homopolymerisation of a hypothetical monomer.

Accordingly a copolymer is a polymer derived from more than one species of monomer, e.g. bipolymer, terpolymer, quaterpolymer, etc.

The oligomers of this invention have a weight average molecular weight of <2,000 Daltons. The polymers of this invention preferably have a weight average molecular weight of 2,000 Daltons or greater, especially 2,000 to 2,000,000 Daltons, more preferably 10,000 to 1,000,000 and most preferably 20,000 to 750,000 Daltons. Molecular weights are determined according to gel permeation chromatography using polystyrene standards.

In one aspect of the present invention polymers are preferred, which besides the repeating units of formula I at the same time have at least one additional repeating unit $Ar^3$, or T, which is selected from groups XXII to XXVI. In said aspect, the polymers according to the invention comprise from 1 to 99 mol % of repeating units of formula I and preferably from 5 to 95 mol % of repeating units of groups XXII to XXVI, more preferably from 10 to 90 mol % of repeating units of groups XXII to XXVI, most preferably from 25 to 75 mol % of repeating units of groups XXII to XXVI.

In said aspect of the present invention polymers are preferred, which besides the repeating units of formula I at the same time have at least two additional repeating units, which are selected from at least two different groups XXII to XXVI.

Accordingly, in one preferred embodiment the present invention relates to polymers, wherein the polymer comprises repeating units of formula

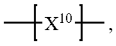, 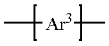 and 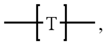, wherein $X^{10}$ is a repeating unit of formula I, especially (X)

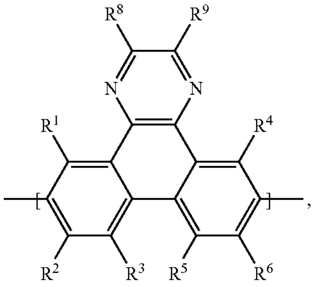, (XI)

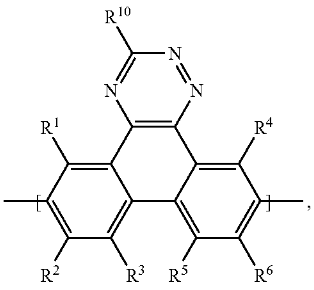, or (XII)

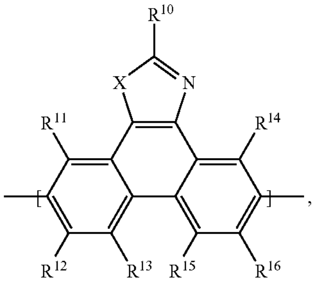, wherein X, $R^1$, $R^2$, $R^3$, $R^4$, $R^5$, $R^6$, $R^8$, $R^9$, $R^{10}$, $R^{11}$, $R^{12}R^{13}R^{14}$, $R^{15}$ and $R^{16}$ are as defined above, very especially (Xa)

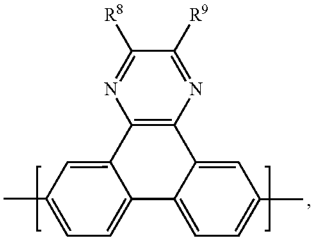, (XIa)

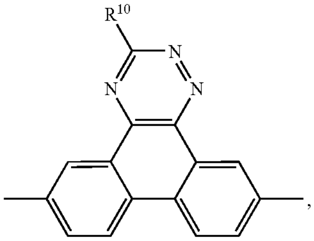, (XIIa)

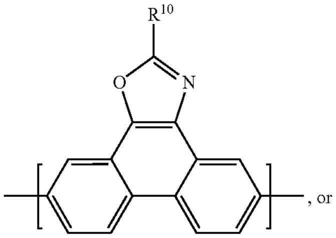, or (XIIb)

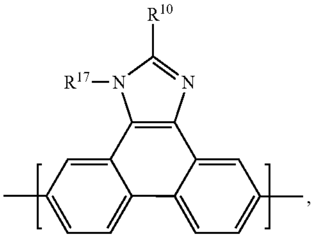, wherein $R^8$ and $R^9$ are independently of each other H, $C_1$-$C_{18}$alkyl, $C_1$-$C_{18}$alkyl which is interrupted by D, $C_1$-$C_{18}$perfluoroalkyl, $C_1$-$C_{18}$alkoxy, $C_1$-$C_{18}$alkoxy which is interrupted by D, or a group —$X^2$—$R^{18}$, $R^8$ and $R^9$ together form a group

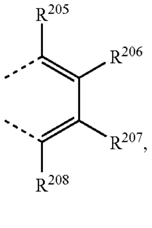 or 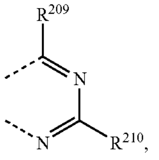

wherein $R^{205}$, $R^{206}$, $R^{207}$, $R^{208}$, $R^{209}$ and $R^{210}$ are independently of each other H, $C_1$-$C_{18}$alkyl, $C_1$-$C_{18}$alkyl which is substituted by E and/or interrupted by D, $C_1$-$C_{18}$alkoxy, or $C_1$-$C_{18}$alkoxy which is substituted by E and/or interrupted by D, $C_1$-$C_{18}$perfluoroalkyl, $R^{10}$ is H, $C_6$-$C_{18}$aryl, which can be substituted by G, $C_2$-$C_{18}$heteroaryl, which can be substituted by G, $C_1$-$C_{18}$alkyl, $C_1$-$C_{18}$alkyl which is interrupted by D, $C_1$-$C_{18}$perfluoroalkyl, $C_1$-$C_{18}$alkoxy, $C_1$-$C_{18}$alkoxy which is substituted by E and/or interrupted by D, or a group —$X^2$—$R^{18}$, wherein $X^2$ is a spacer, such as $C_6$-$C_{12}$aryl, or $C_6$-$C_{12}$heteroaryl, especially phenyl, or naphthyl, which can be substituted one, or more times, especially one to two times with $C_1$-$C_{18}$alkyl, $C_1$-$C_{18}$alkyl which is interrupted by D, $C_1$-$C_{18}$perfluoroalkyl, $C_1$-$C_{18}$alkoxy, or $C_1$-$C_{18}$alkoxy which is substituted by E and/or interrupted by D, $R^{17}$ is $C_6$-$C_{18}$aryl; $C_6$-$C_{18}$aryl which is substituted by $C_1$-$C_{18}$alkyl, $C_1$-$C_{18}$perfluoroalkyl, or $C_1$-$C_{18}$alkoxy; $C_1$-$C_{18}$alkyl; or $C_1$-$C_{18}$alkyl which is interrupted by —O—; and $R^{18}$ is H, $C_1$-$C_{18}$alkyl, $C_1$-$C_{18}$alkyl which is interrupted by D, $C_1$-$C_{18}$perfluoroalkyl, $C_1$-$C_{18}$alkoxy, $C_1$-$C_{18}$alkoxy which is interrupted by D; with the proviso that in case of formula X at least one of $R^8$ and $R^9$ is a group of formula -$(Sp)_{x1}$-HEI, or if $R^8$ and $R^9$ together form a group

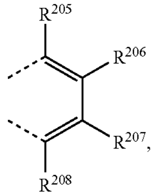

at least one of $R^{206}$ and $R^{207}$ is a group of formula -$(Sp)_{x1}$-HEI, or if $R^8$ and $R^9$ together form a group

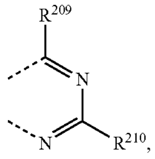

at least one of $R^{209}$ and $R^{210}$ is a group of formula -$(Sp)_{x1}$-HEI;

that in case of formula XI $R^{10}$ is a group of formula -$(Sp)_{x1}$-HEI;

that in case of formula XII $R^{10}$ is a group of formula -$(Sp)_{x1}$-HEI, or if X is group N—$R^{17}$, at least one of $R^{10}$ and $R^{17}$ is a group of formula -$(Sp)_{x1}$-HEI.

In said embodiment T is preferably a repeating unit of formula XXVIa or XXVIb and $Ar^3$ is preferably selected from repeating units of formula:

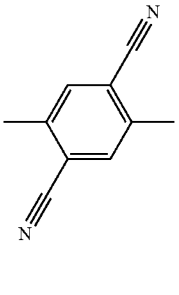, 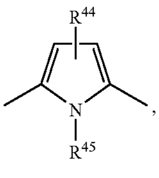, 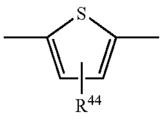,

-continued

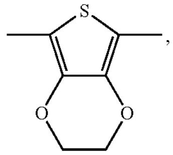

, or

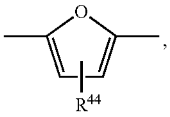

,

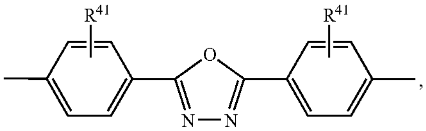

, and

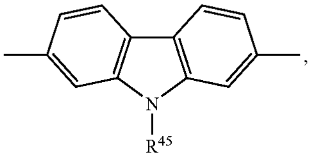

, wherein $R^{44}$ and $R^{41}$ are hydrogen, $C_1$-$C_{18}$alkyl, or $C_1$-$C_{18}$alkoxy, and $R^{45}$ is H, $C_1$-$C_{18}$alkyl, or $C_1$-$C_{18}$alkyl which is substituted by E and/or interrupted by D, especially $C_1$-$C_{18}$alkyl which is interrupted by —O—, wherein D and E are as defined above.

In said aspect of the present invention terpolymers comprising a repeating unit of formula

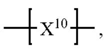

, a repeating unit of formula

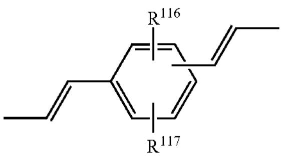

, especially

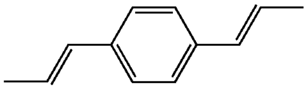

, and a repeating unit of formula

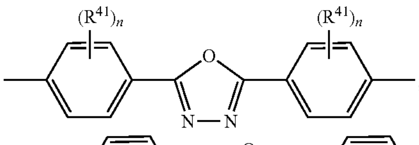

, especially

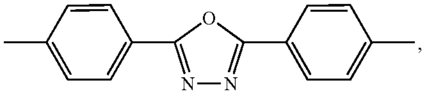

, are most preferred, wherein $X^{10}$ is a repeating unit of formula I, especially X, XI and XII, very especially Xa, XIa, XIIa and XIIb, wherein $R^{116}$ and $R^{117}$ are as defined above and are preferably H, halogen, CN, $C_1$-$C_{12}$alkyl, $C_1$-$C_{12}$alkoxy, or $C_6$-$C_{14}$aryl, more preferably H, $C_1$-$C_{12}$alkyl, or $C_1$-$C_{18}$alkoxy, $R^{41}$ is Cl, F, CN, $N(R^{45})_2$, $C_1$-$C_{18}$alkyl, $C_1$-$C_{18}$alkoxy, or $C_6$-$C_{14}$aryl, n is 0, 1, or 2.

In another preferred embodiment the present invention relates to polymers, wherein the polymer comprises repeating units of formula

and

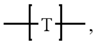

, especially

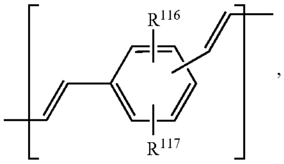

, or

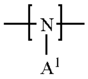

, more preferably

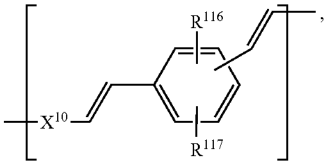

, most preferably

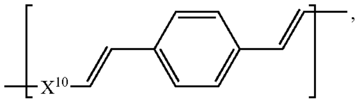

, or

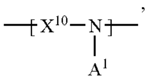

, wherein $X^{10}$ is a repeating unit of formula I, especially X, XI and XII, very especially Xa, XIa, XIIa and XIIb.

$R^{116}$ and $R^{117}$ are as defined above and are especially H, halogen, CN, $C_1$-$C_{12}$alkyl, $C_1$-$C_{12}$alkoxy, or $C_6$-$C_{14}$aryl, $A^1$ is a $C_6$-$C_{24}$aryl group, a $C_2$-$C_{30}$heteroaryl group, which can be substituted by one or more non-aromatic groups $R^{41}$, preferably a phenyl group, which is substituted by $C_1$-$C_4$alkyl, in particular

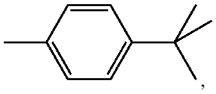

, or an anthryl group, in particular an anthr-2-yl group.

In another preferred embodiment the polymer comprises a repeating unit of formula (I)

and a repeating unit

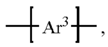

wherein $X^{10}$ is a repeating unit of formula I, especially X, XI and XII (XVI, XVII and XVIII), very especially Xa, XIa, XIIa and XIIb ((XVIa, XVIIa, XVIIIa and XVIIIb);

and —$Ar^3$— is a group of formula

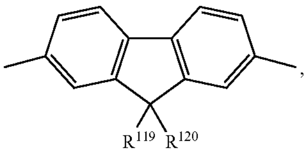

, or

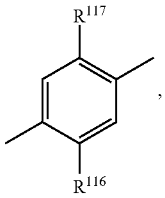

, wherein $R^{116}$ and $R^{117}$ are independently of each other H, $C_1$-$C_{18}$alkyl, which can optionally be interrupted by O, or $C_1$-$C_{18}$alkoxy, which can optionally be interrupted by O, $R^{119}$ and $R^{120}$ are independently of each other $C_1$-$C_{18}$alkyl, which can optionally be interrupted by O, or $R^{119}$ and $R^{120}$ together form a group of formula $=CR^{100}R^{101}$, wherein $R^{100}$ and $R^{101}$ are independently of each other H, $C_1$-$C_{18}$alkyl, or $R^{119}$ and $R^{120}$ together form a five or six membered ring, which optionally can be substituted by $C_1$-$C_{18}$alkyl.

The present invention is illustrated in more detail on the basis of an especially preferred embodiment below, but should not be limited thereto.

In said embodiment the polymer is a polymer of formula (VII)

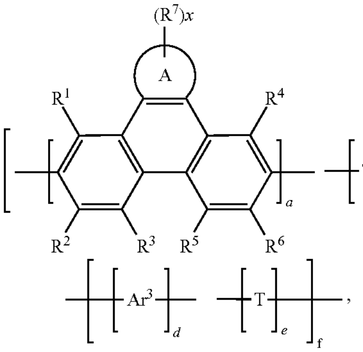

wherein

A, $R^1$, $R^2$, $R^3$, $R^4$, $R^5$, $R^6$, $R^7$ and x are as defined above, T and $Ar^3$ are as defined above, a is 1, b is 0, or 1, c is 0.005 to 1, d is 0, or 1, e is 0, or 1, wherein e is not 1, if d is 0, f is 0.995 to 0, wherein the sum of c and f is 1.

T is preferably a repeating unit of formula XXVIa, XXVIb or XXVIf and $Ar^3$ is preferably selected from repeating units of formula:

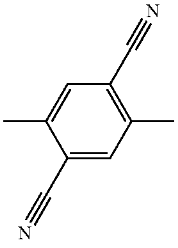

,

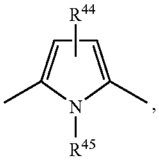

,

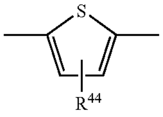

,

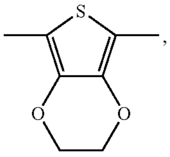

, or

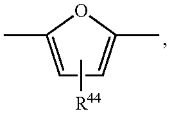

,

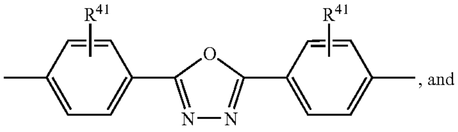

, and

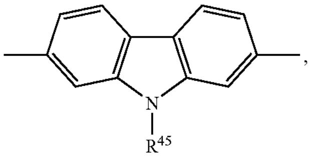

, wherein $R^{44}$ and $R^{41}$ are hydrogen, $C_1$-$C_{18}$alkyl, or $C_1$-$C_{18}$alkoxy, and $R^{45}$ is H, $C_1$-$C_{18}$alkyl, or $C_1$-$C_{18}$alkyl which is substituted by E and/or interrupted by D, especially $C_1$-$C_{18}$alkyl which is interrupted by —O—, wherein D and E are as defined above.

Homopolymers of formula VII, wherein a=1, b=0, c=1, d=0, e=0, f=0, are, for example, obtained by nickel coupling reactions, especially the Yamamoto reaction:

(I)

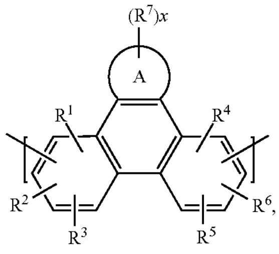

wherein A, $R^1$, $R^2$, $R^3$, $R^4$, $R^5$, $R^6$, $R^7$ and x are as defined above. In said aspect homopolymers consisting of repeating units of formula X, XI, or XII are preferred and homopolymers consisting of repeating units of formula Xa, XIa, XIIa and XIIb are most preferred.

Copolymers of formula VII, involving repeating units of formula I and —$Ar^3$—(a=1, c=0.995 to 0.005, b=0, d=1, e=0, f=0.005 to 0.995), can be obtained by nickel coupling reactions:

(VIIb)

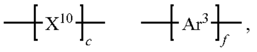

wherein $X^{10}$, c, f and $Ar^3$ are as defined above.

In an especially preferred embodiment the present invention is directed to copolymers which contain at least two different repeating units of formula (I')

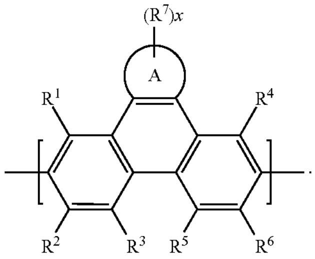

In said embodiment copolymers are more preferred, which comprise at least one repeating unit of formula I' wherein A is a 5 membered heteroaromatic ring and at least one repeating unit of formula I' wherein A is a 6 membered heteroaromatic ring. Appropriate examples of repeating units comprising a 6 membered heteroaromatic ring are compounds of formula (X)

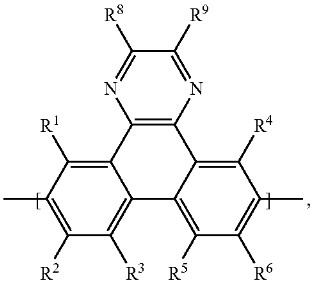

, especially (Xa)

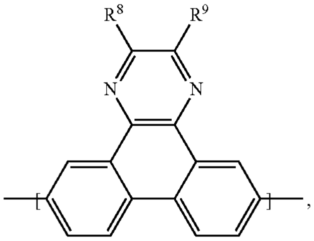

, and (XI)

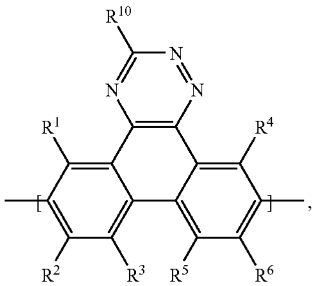

, especially

-continued (XIa)

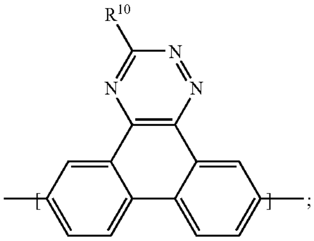

;

examples of repeating units comprising a 5 membered heteroaromatic ring are compounds of formula and (XII)

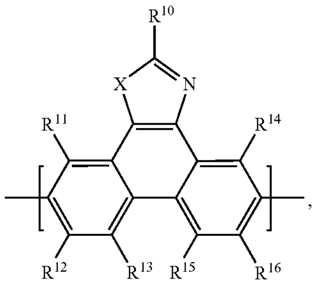

, especially (XIIa)

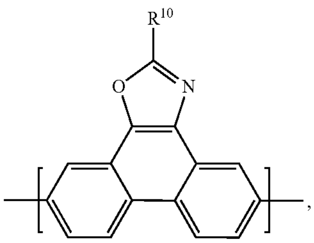

, or (XIIb)

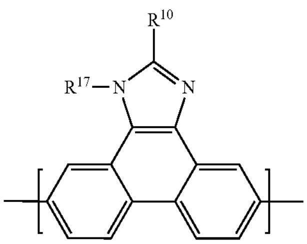

;

wherein $R^1$, $R^2$, $R^3$, $R^4$, $R^5$, $R^6$, $R^8$, $R^9$, $R^{10}$, $R^{11}$, $R^{12}$, $R^{13}$, $R^{14}R^{15}$, $R^{16}$ and $R^{17}$ are as defined above. In said aspect of the present invention copolymers comprising repeating units of formula Xa and XIIa and/or XIIa (Xa and XIIa; Xa and XIIa; Xa and Xa, XIIa and XIIb), or XIa and XIIa and/or XIIa (XIa and XIIa; XIa and XIIa; XIa and Xa, XIIa and XIIb) are most preferred.

In another preferred embodiment the polymer is a polymer of formula (VII)

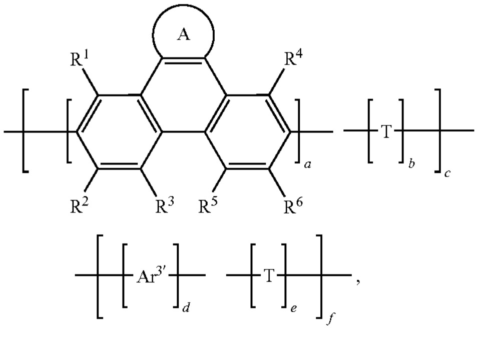

wherein a, b, c, d, e, f, A, $R^1$, $R^2$, $R^3$, $R^4$, $R^5$, $R^6$, $R^7$ and x are as defined above, T' is a group of formula

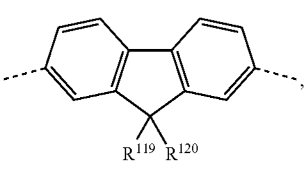

, or

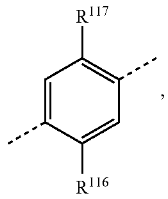

, and $Ar^{3'}$ is a repeating unit as described in WO06/097419.

In said embodiment the repeating unit of the present invention has preferably the formula X, or XIIb and $Ar^{3'}$ is preferably a repeating unit of formula (Xa)

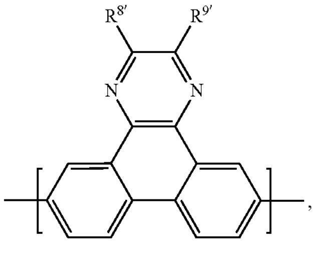

, (XIIa')

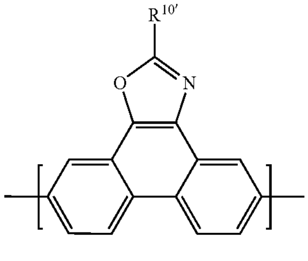

, or

-continued (XIIb')

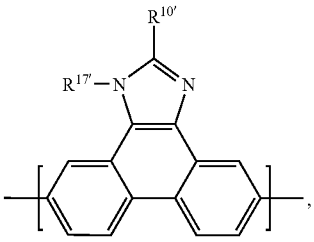

, wherein $R^{8'}$ and $R^{9'}$ are independently of each other H, $C_1$-$C_{18}$alkyl, $C_1$-$C_{18}$alkyl which is interrupted by D, $C_1$-$C_{18}$perfluoroalkyl, $C_1$-$C_{18}$alkoxy, $C_1$-$C_{18}$alkoxy which is interrupted by D, or a group —$X^{2'}$—$R^{18'}$, $R^{10'}$ is H, $C_6$-$C_{18}$aryl, which can be substituted by G, $C_2$-$C_{18}$heteroaryl, which can be substituted by G, $C_1$-$C_{18}$alkyl, $C_1$-$C_{18}$alkyl which is interrupted by D, $C_1$-$C_{18}$perfluoroalkyl, $C_1$-$C_{18}$alkoxy, $C_1$-$C_{18}$alkoxy which is substituted by E and/or interrupted by D, or a group —$X^{2'}$—$R^{18'}$, wherein $X^{2'}$ is a spacer, such as $C_6$-$C_{12}$aryl, or $C_6$-$C_{12}$heteroaryl, especially phenyl, or naphthyl, which can be substituted one, or more times, especially one to two times with $C_1$-$C_{18}$alkyl, $C_1$-$C_{18}$alkyl which is interrupted by D, $C_1$-$C_{18}$perfluoroalkyl, $C_1$-$C_{18}$alkoxy, or $C_1$-$C_{18}$alkoxy which is substituted by E and/or interrupted by D, $R^{17'}$ is $C_6$-$C_{18}$aryl; $C_6$-$C_{18}$aryl which is substituted by $C_1$-$C_{18}$alkyl, $C_1$-$C_{18}$perfluoroalkyl, or $C_1$-$C_{18}$alkoxy; $C_1$-$C_{18}$alkyl; or $C_1$-$C_{18}$alkyl which is interrupted by —O—.

$R^{18'}$ is H, $C_1$-$C_{18}$alkyl, $C_1$-$C_{18}$alkyl which is interrupted by D, $C_1$-$C_{18}$perfluoroalkyl, $C_1$-$C_{18}$alkoxy, $C_1$-$C_{18}$alkoxy which is interrupted by D.

$R^{10'}$ is preferably $C_6$-$C_{12}$aryl, which can optionally be substituted by one to three groups selected from $C_1$-$C_{18}$alkyl, $C_1$-$C_{18}$alkyl which is interrupted by D, $C_1$-$C_{18}$perfluoroalkyl, $C_1$-$C_{18}$alkoxy, or $C_1$-$C_{18}$alkoxy which is substituted by E and/or interrupted by D; especially

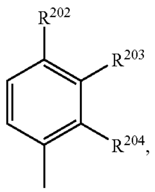

and

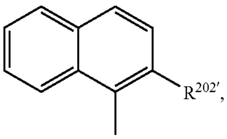

wherein $R^{202'}$ is $C_1$-$C_{18}$alkyl, $C_1$-$C_{18}$alkyl which is interrupted by D, $C_1$-$C_{18}$perfluoroalkyl, $C_1$-$C_{18}$alkoxy, or $C_1$-$C_{18}$alkoxy which is substituted by E and/or interrupted by D, especially $C_1$-$C_{18}$alkoxy;

one of $R^{202}$, $R^{203}$ and $R^{204}$ is $R^{202}$, and the other groups are H, or $R^{202'}$.

$R^{17'}$ is preferably $C_1$-$C_{18}$alkyl, especially $C_4$-$C_{12}$alkyl, such as, for example, n-butyl, n-hexyl, n-octyl, 2-ethylhexyl, and 2-hexadecyl.

The following polymers are especially preferred:
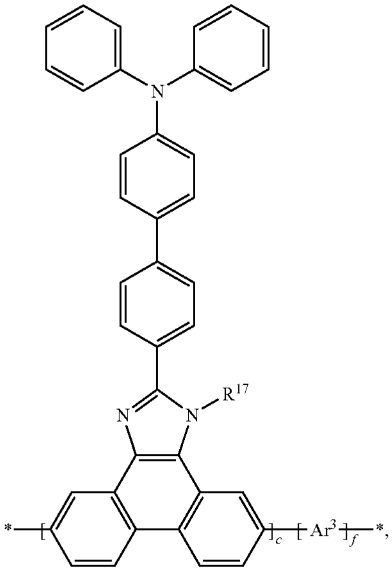
,
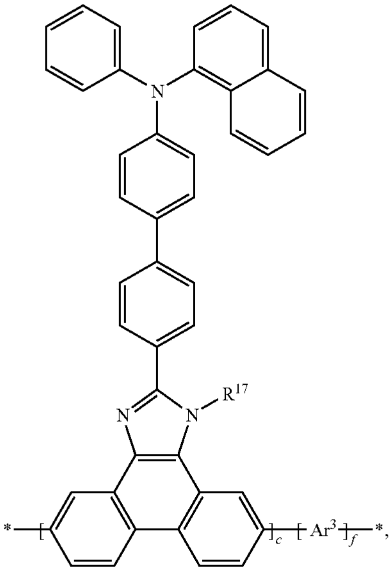
,
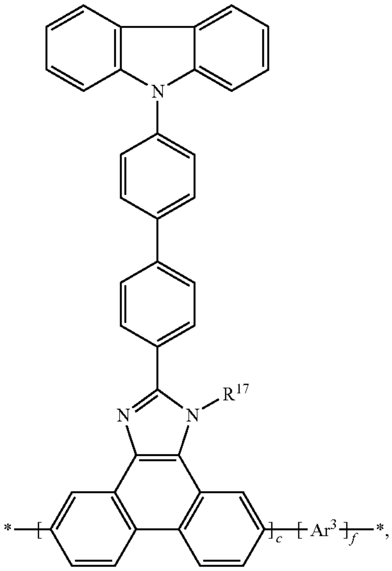
,
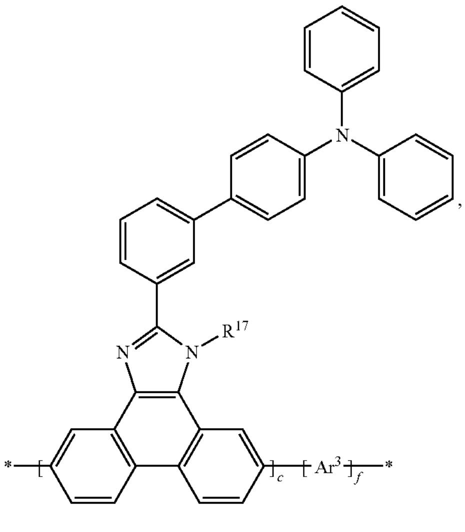
,
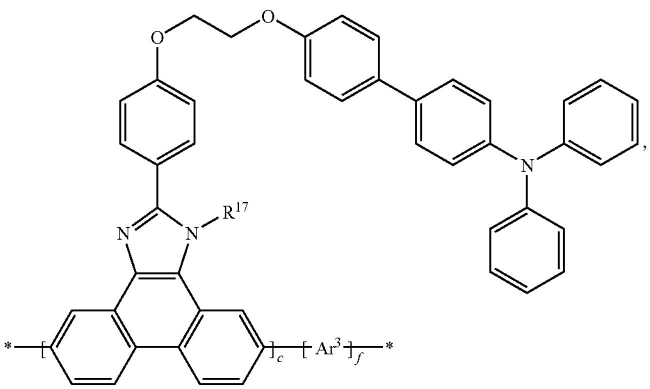
, -continued
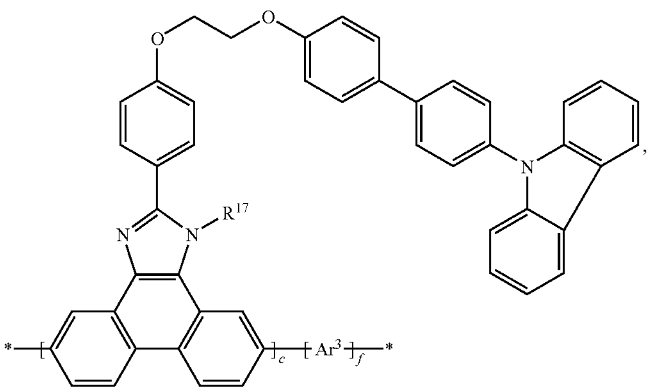
,
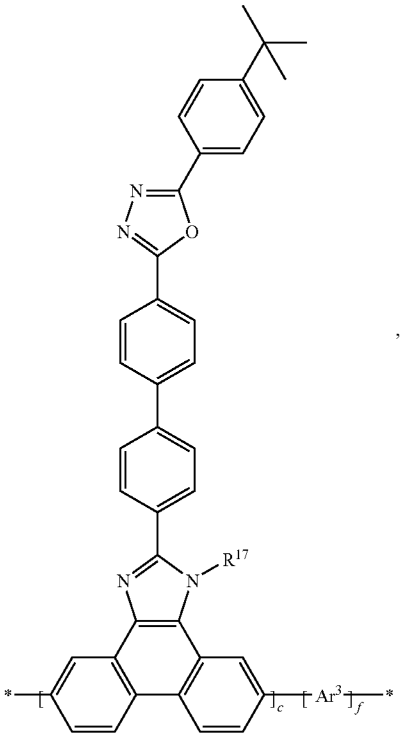
,
,
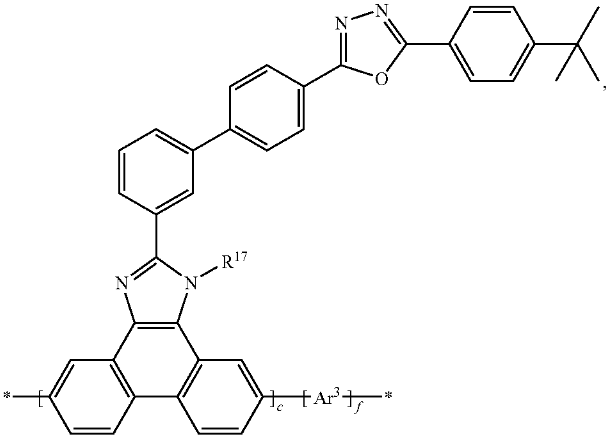
, -continued
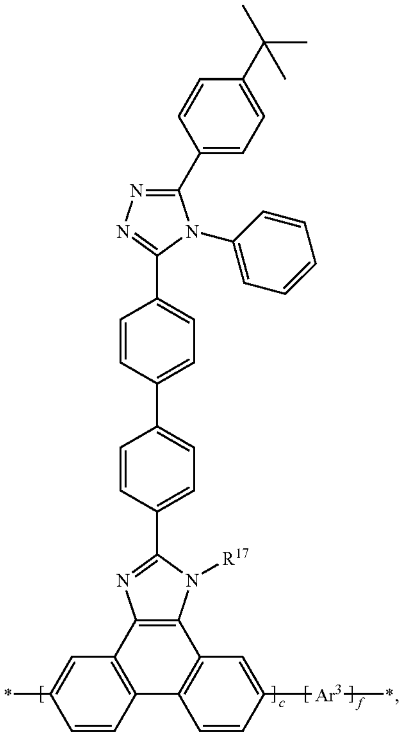
,
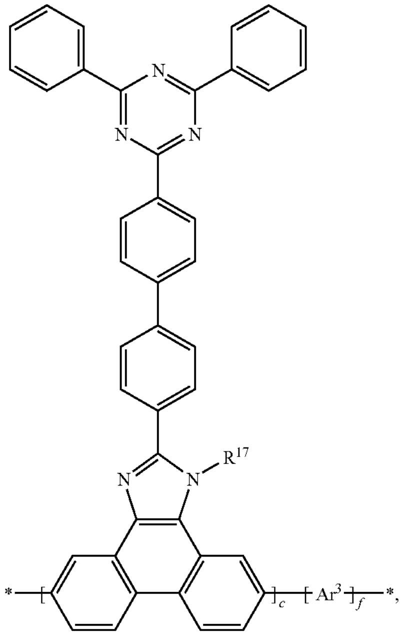
,
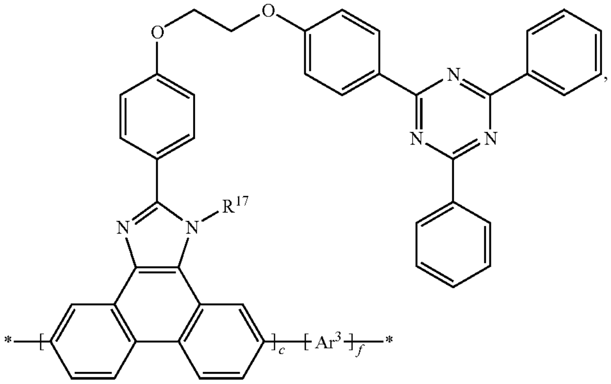
,
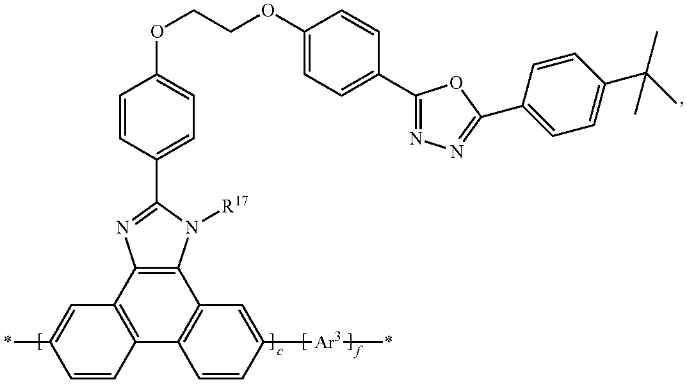
, -continued
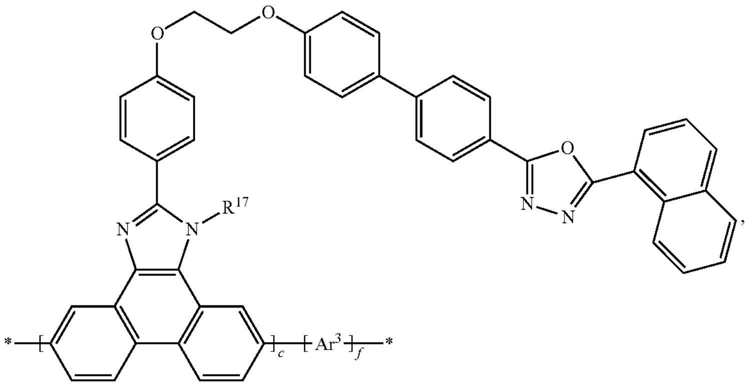
,
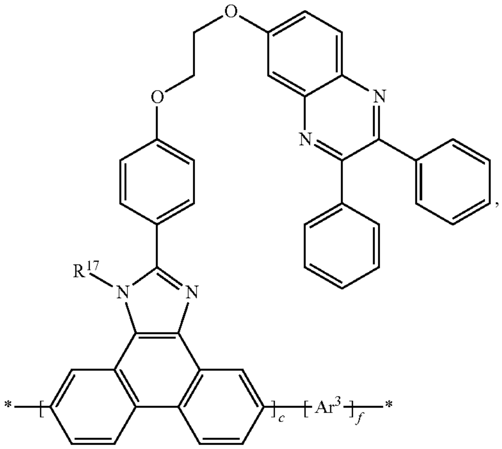
,
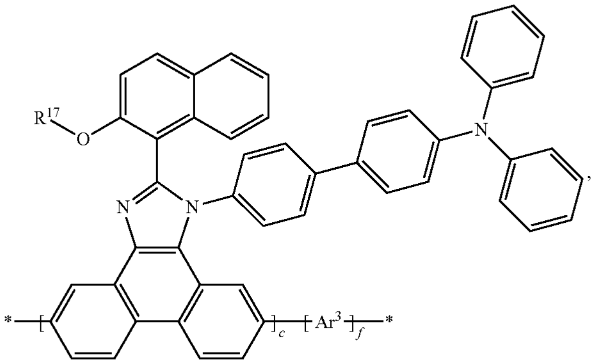
,
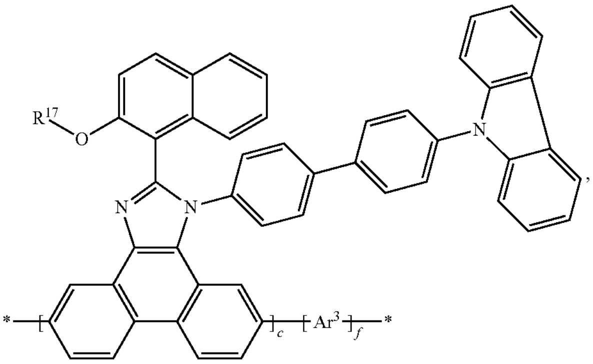
,
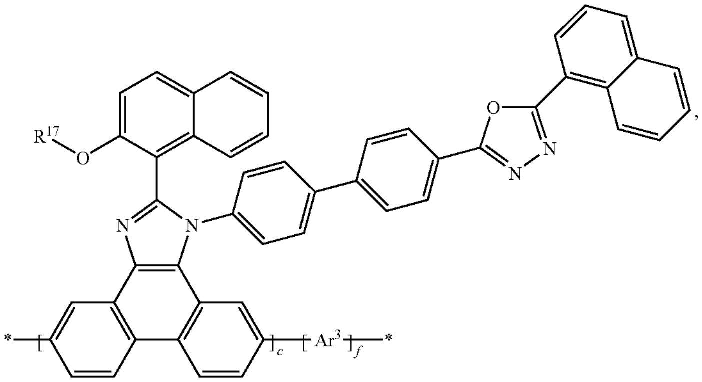
, -continued

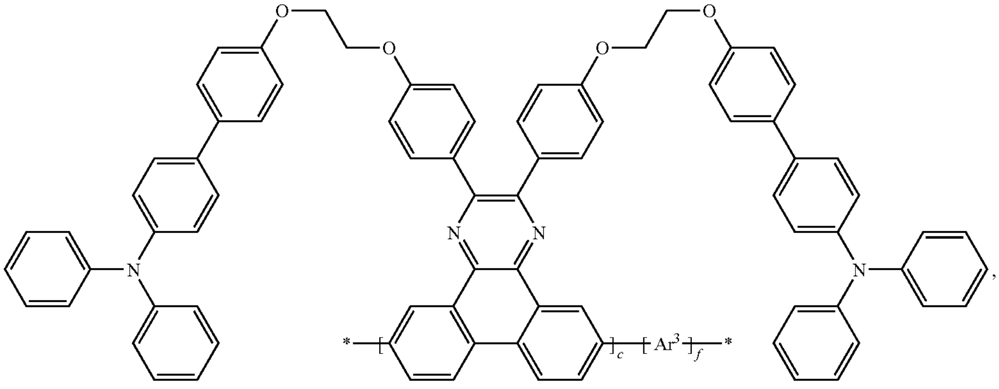

, wherein $Ar^3$ is

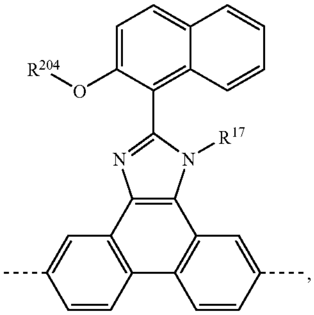
,
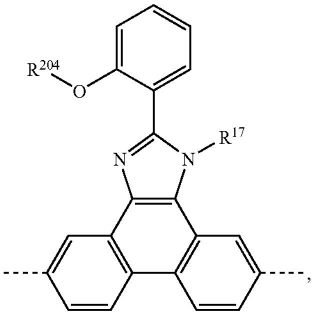
,
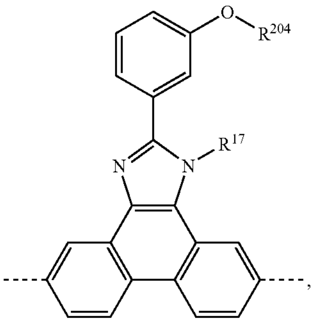
,
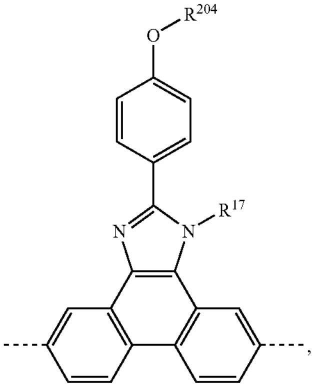
,
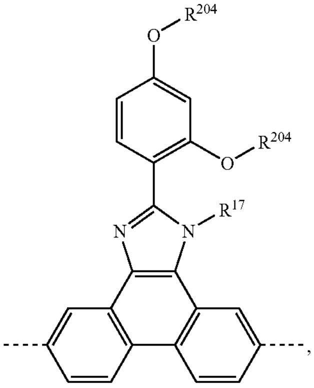
,
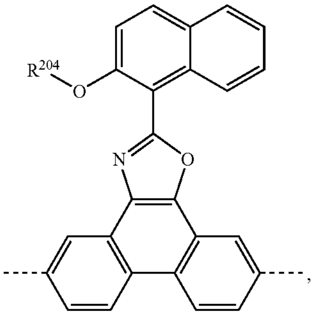
,
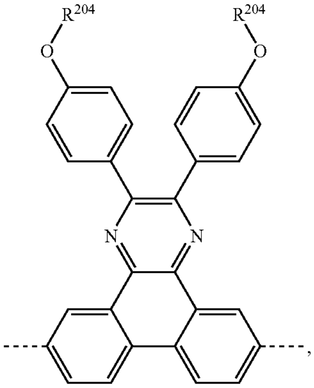
, or
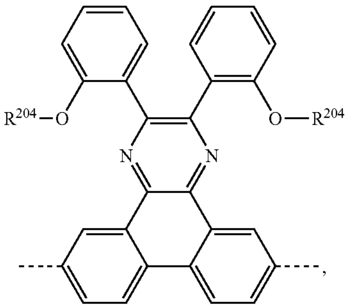
, wherein c=0.995 to 0.005, f=0.005 to 0.995, $R^{17}$ is $C_4$-$C_{25}$alkyl, such as n-butyl, sec.-butyl, isobutyl, tert.-butyl, n-pentyl, 2-pentyl, 3-pentyl, 2,2-dimethylpropyl, n-hexyl, n-heptyl, n-octyl, 1,1,3,3-tetramethylbutyl, 2-ethylhexyl, n-nonyl, n-decyl, n-undecyl, n-dodecyl, tridecyl, tetradecyl, pentadecyl, hexadecyl, 2-hexyldecyl, heptadecyl, octadecyl, eicosyl, heneicosyl, docosyl, tetracosyl, or pentacosyl, especially 2-ethylhexyl, n-octyl, 2-hexyldecyl, or 1-hexyldecyl, and $R^{204}$ is $C_4$-$C_{25}$alkyl, such as n-butyl, sec.-butyl, isobutyl, tert.-butyl, n-pentyl, 2-pentyl, 3-pentyl, 2,2-dimethylpropyl, n-hexyl, n-heptyl, n-octyl, 1,1,3,3-tetramethylbutyl, 2-ethylhexyl, n-nonyl, n-decyl, n-undecyl, n-dodecyl, tridecyl, tetradecyl, pentadecyl, hexadecyl, 2-hexyldecyl, heptadecyl, octadecyl, eicosyl, heneicosyl, docosyl, tetracosyl, or pentacosyl, especially 2-ethylhexyl, n-octyl, 2-hexyldecyl, or 1-hexyldecyl.

In addition, the above polymers can contain one of the following repeating units

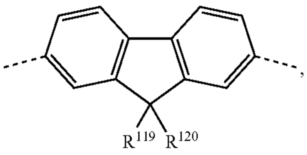

, or

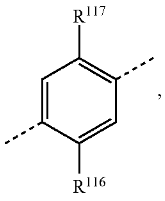

, wherein $R^{116}$ and $R^{117}$ are independently of each other H, $C_1$-$C_{18}$alkyl, which can optionally be interrupted by O, or $C_1$-$C_{18}$alkoxy, which can optionally be interrupted by O, $R^{119}$ and $R^{120}$ are independently of each other $C_1$-$C_{18}$alkyl, which can optionally be interrupted by O, especially

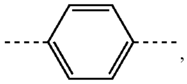

, or

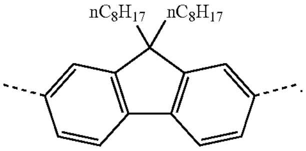

In a further preferred embodiment the present invention relates to polymers of formula

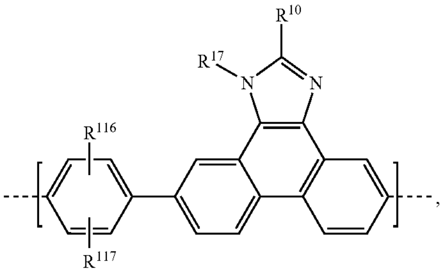

wherein $R^{10}$ is $C_6$-$C_{12}$aryl, which can optionally be substituted by one to three groups selected from $C_1$-$C_{18}$alkyl, $C_1$-$C_{18}$alkyl which is interrupted by D, $C_1$-$C_{18}$perfluoroalkyl, $C_1$-$C_{18}$alkoxy, or $C_1$-$C_{18}$alkoxy which is substituted by E and/or interrupted by D; especially

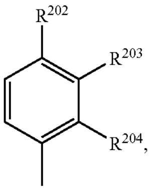

and

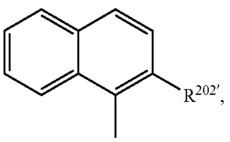

wherein $R^{202'}$ is $C_1$-$C_{18}$alkyl, $C_1$-$C_{18}$alkyl which is interrupted by D, $C_1$-$C_{18}$perfluoroalkyl, $C_1$-$C_{18}$alkoxy, or $C_1$-$C_{18}$alkoxy which is substituted by E and/or interrupted by D, especially $C_1$-$C_{18}$alkoxy;

one of $R^{202}$, $R^{203}$ and $R^{204}$ is $R^{202'}$, and the other groups are H, or $R^{202'}$.

$R^{116}$ and $R^{117}$ are H, $C_1$-$C_{18}$alkyl, $C_1$-$C_{18}$alkyl which is interrupted by D, $C_1$-$C_{18}$perfluoroalkyl, $C_1$-$C_{18}$alkoxy, or $C_1$-$C_{18}$alkoxy which is substituted by E and/or interrupted by D, especially $C_1$-$C_{18}$alkoxy;

$R^{17}$ is $C_1$-$C_{18}$alkyl, or $C_6$-$C_{12}$aryl, which can optionally be substituted by one to three $C_1$-$C_{18}$alkoxy groups, wherein one of the groups $R^{10}$ and $R^{17}$ is a group of formula -$(Sp)_{x1}$-HEI,

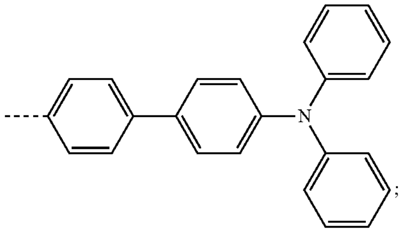

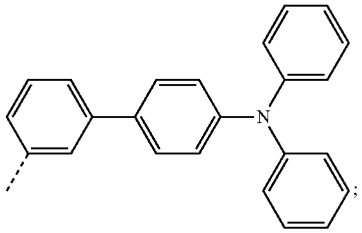

especially

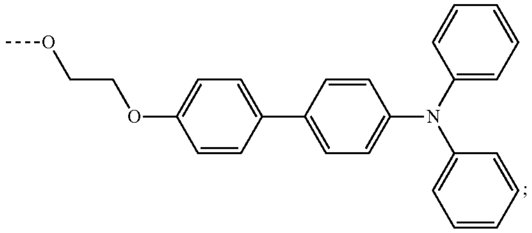

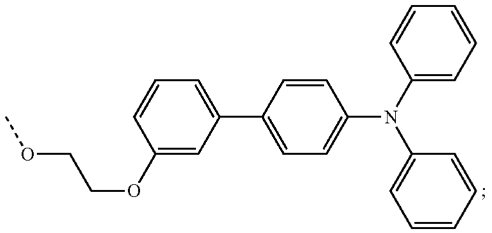

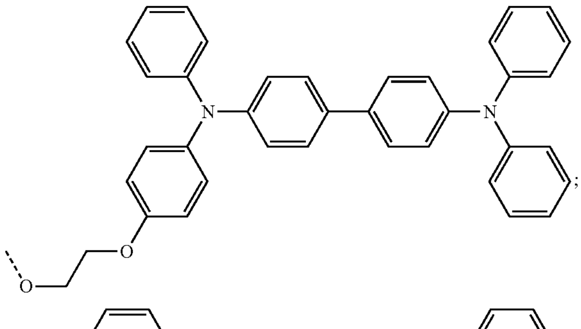

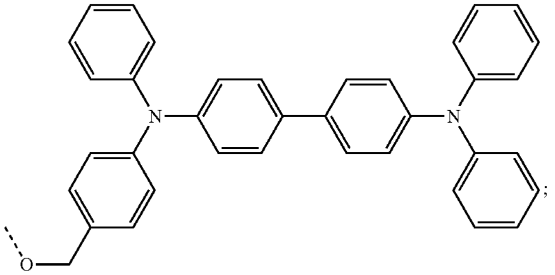

-continued

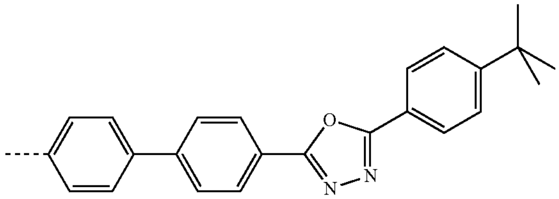

;

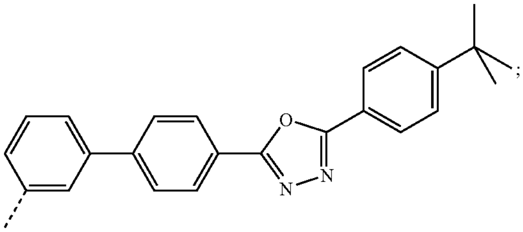

;

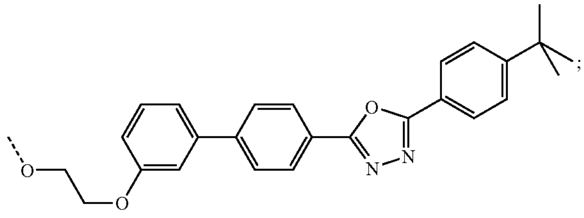

;

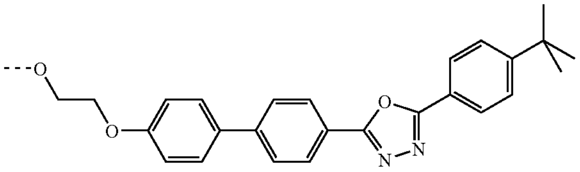

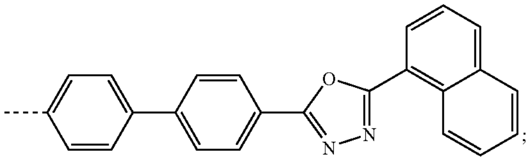

;

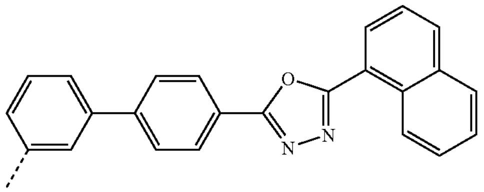

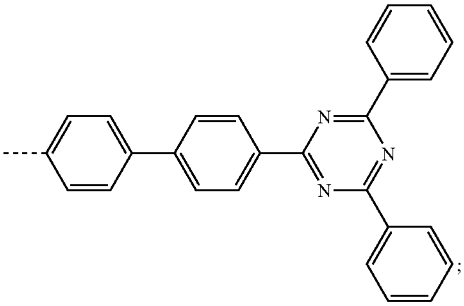

;

-continued

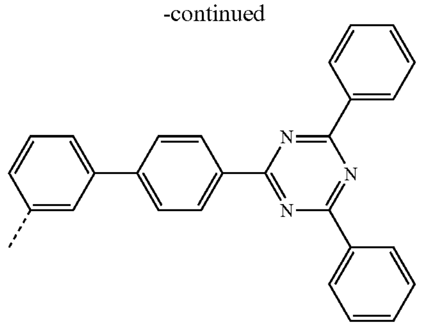

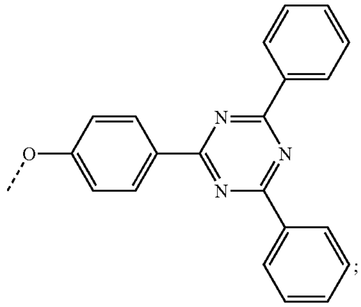

;

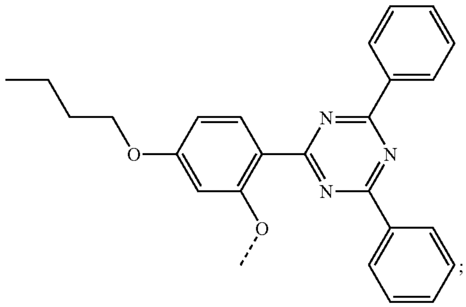

; and

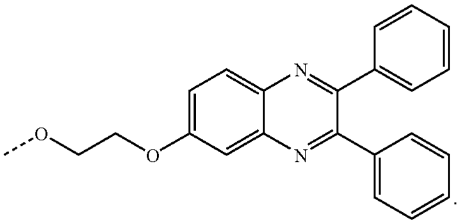

.

In a further preferred embodiment the present invention relates to polymers comprising repeating units of formula

XX

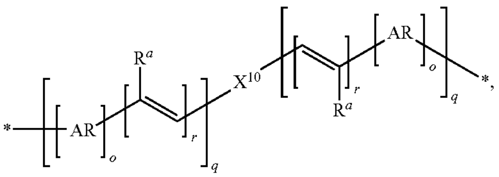

wherein $X^{10}$ is a repeating unit of formula I, especially X, XI and XII (XVI, XVII and XVIII), very especially Xa, XIa, XIIa and XIIb ((XVIa, XVIIa, XVIIIa and XVIIIb);

q is an integer 0, 1, or 2, o is 0, 1, or 2, r is 0, or 1;

AR is $C_6$-$C_{24}$aryl, $C_6$-$C_{24}$aryl which is substituted by G, $C_2$-$C_{20}$heteroaryl, or $C_2$-$C_{20}$heteroaryl which is substituted by G, $R^a$ is H, $C_1$-$C_{18}$alkyl, $C_1$-$C_{18}$alkyl which is substituted by E and/or interrupted by D, $C_1$-$C_{18}$perfluoroalkyl, $C_2$-$C_{18}$alkenyl, $C_2$-$C_{18}$alkynyl, $C_1$-$C_{18}$alkoxy, $C_1$-$C_{18}$alkoxy which is substituted by E and/or interrupted by D, wherein E, D and G are as defined above.

AR is the same or different in each occurrence. AR can be derived from thiophen, 2,7-N-alkylcarbazol, 2,7-N-arylcarbazol, 3,6-N-alkylcarbazol, 3,6-N-arylcarbazol, benzene, pyridine, fluorene, spirobifluorene, anthracene, phenanthrene, pyrene, quinoline, or naphthalene, which be substituted by 0 to 2 substituents $R^a$.

Examples of additional repeating units are in particular selected from the group consisting of ortho-, meta- or para-phenylene, 1,4-naphthylene, 9,10-anthracenylene, 2,7-phenanthrenylene, 1,6-, 2,7-, 4,9-pyrene, 2,7-tetrahydropyrene, oxadiazolylene, 2,5-thiophenylene, 2,5-pyrrolylene; 2,5-furanylene, 2,5-pyridylene, 2,5-pyrimidinylene, 5,8-chinolinylene, fluorene, spiro-9,9'-bifluorene, indenofluorene, heteroindenofluorene, 2,7-N-alkylcarbazol, 2,7-N-arylcarbazol, 3,6-N-alkylcarbazol, and 3,6-N-arylcarbazol. Preferred examples of additional repeating units are

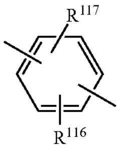
,
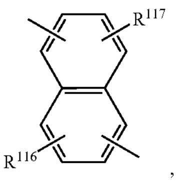
,
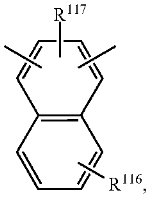

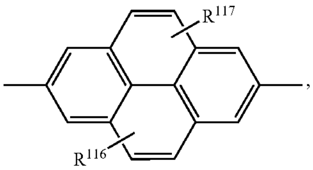
,
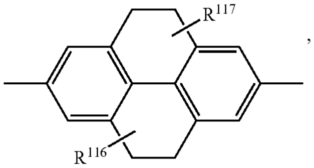
,
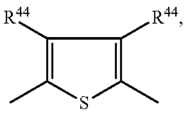

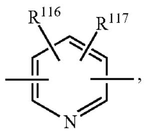
,
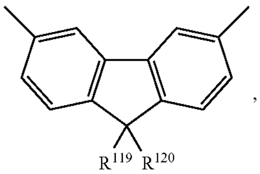
,
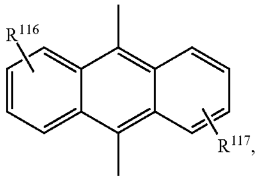

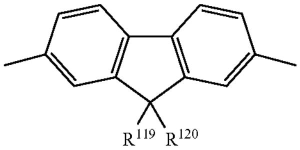
,
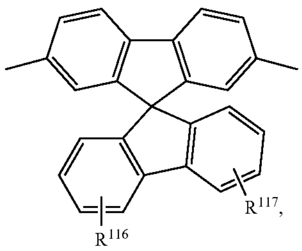

-continued

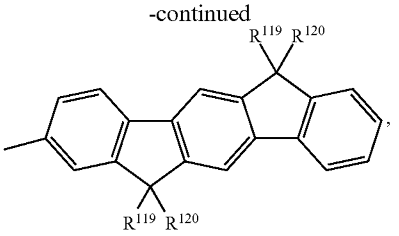

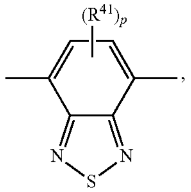

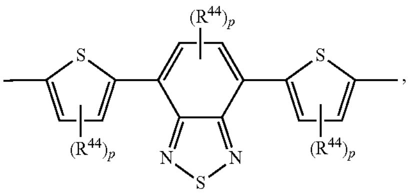

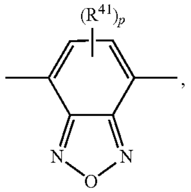

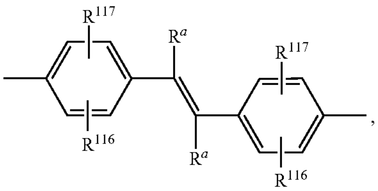
, and

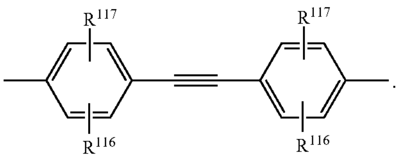

The polymers of the present invention can show high photoluminescence and/or electroluminescence.

Polymerization processes involving only dihalo-functional reactants may be carried out using nickel coupling reactions. One such coupling reaction was described by Colon et al. in J. Pol. Sci., Part A, Polymer Chemistry Edition 28 (1990) 367, and by Colon et al. in J. Org. Chem. 51 (1986) 2627. The reaction is typically conducted in a polar aprotic solvent (e.g., dimethylacetamide) with a catalytic amount of nickel salt, a substantial amount of triphenylphosphine and a large excess of zinc dust. A variant of this process is described by loyda et al. in Bull. Chem. Soc. Jpn. 63 (1990) 80 wherein an organo-soluble iodide was used as an accelerator.

Another nickel-coupling reaction was disclosed by Yamamoto in Progress in Polymer Science 17 (1992) 1153 wherein a mixture of dihaloaromatic compounds was treated with an excess amount of nickel (1,5-cyclooctadiene) complex in an inert solvent. All nickel-coupling reactions when applied to reactant mixtures of two or more aromatic dihalides yield essentially random copolymers. Such polymerization reactions may be terminated by the addition of small amounts of water to the polymerization reaction mixture, which will replace the terminal halogen groups with hydrogen groups. Alternatively, a monofunctional aryl halide may be used as a chain-terminator in such reactions, which will result in the formation of a terminal aryl group.

Nickel-coupling polymerizations yield essentially homopolymers or random copolymers comprising units of formula I and units derived from other co-monomers.

Homopolymers of formula VII, wherein a=1, c=1, b=0, d=1, e=0, f=1, can be obtained, for example, by the Suzuki reaction:

(VIIc)

$$-\!\!\left[X^{10}-Ar^3\right]\!\!-,$$

wherein $X^{10}$ and $Ar^3$ are as defined above.

The condensation reaction of an aromatic boronate and a halogenide, especially a bromide, commonly referred to as the "Suzuki reaction", is tolerant of the presence of a variety of organic functional groups as reported by N. Miyaua and A. Suzuki in Chemical Reviews, Vol. 95, pp. 457-2483 (1995). This reaction can be applied to preparing high molecular weight polymers and copolymers. Preferred catalysts are 2-dicyclohexylphosphino-2',6'-di-alkoxybiphenyl/palladium (II)acetates. An especially preferred catalyst is 2-dicyclohexylphosphino-2',6'-di-methoxybiphenyl (sPhos)/palladium(II)acetate.

To prepare polymers corresponding to formula VIIc, a dihalogenide, such as a dibromide or dichloride, especially a dibromide corresponding to formula Br—$X^{10}$—Br is reacted with an equimolar amount of a diboronic acid or diboronate corresponding to formula $$X^{11}-\!\!\left[Ar^3\right]\!\!-X^{11},$$

wherein $X^{11}$ is independently in each occurrence —$B(OH)_2$, —$B(OY^1)_2$ or

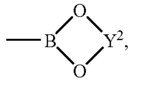

wherein $Y^1$ is independently in each occurrence a $C_1$-$C_{10}$alkyl group and $Y^2$ is independently in each occurrence a $C_2$-$C_{10}$alkylene group, such as —$CY^3Y^4$—$CY^5Y^6$—, or —$CY^7Y^8$—$CY^9Y^{10}$—$CY^{11}Y^{12}$—, wherein $Y^3$, $Y^4$, $Y^5$, $Y^6$, $Y^7$, $Y^8$, $Y^9$, $Y^{10}$, $Y^{11}$ and $Y^{12}$ are independently of each other hydrogen, or a $C_1$-$C_{10}$alkyl group, especially —$C(CH_3)_2C(CH_3)_2$—, or —$C(CH_3)_2CH_2C(CH_3)_2$—, under the catalytic action of Pd and a phosphine ligand, especially triphenylphosphine. The reaction is typically conducted at about 70° C. to 180° C. in an aromatic hydrocarbon solvent such as toluene. Other solvents such as dimethylformamide and tetrahydrofuran can also be used alone, or in mixtures with an aromatic hydrocarbon. An aqueous base, preferably sodium carbonate, potassium carbonate, $K_3PO_4$, or bicarbonate, is used as the HBr scavenger. Depending on the reactivities of the reactants, a polymerization reaction may take 2 to 100 hours. Organic bases, such as, for example, tetraalkylammonium hydroxide, and phase transfer catalysts, such as, for example TBAB, can promote the activity of the boron (see, for example, Leadbeater & Marco; Angew. Chem. Int. Ed. Eng. 42 (2003) 1407 and references cited therein). Other variations of reaction conditions are given by T. I. Wallow and B. M. Novak in J. Org. Chem. 59 (1994) 5034-5037; and M. Remmers, M. Schulze, and G. Wegner in Macromol. Rapid Commun. 17 (1996) 239-252.

If desired, a monofunctional aryl halide or aryl boronate may be used as a chain-terminator in such reactions, which will result in the formation of a terminal aryl group.

It is possible to control the sequencing of the monomeric units in the resulting copolymer by controlling the order and composition of monomer feeds in the Suzuki reaction.

Homopolymers of formula VII, wherein a=1, c=1, b=1, d=0, e=0, f=0, can be obtained, for example by the Heck reaction:

(VIId)

$$-\!\!\left[X^{10}-T\right]\!\!-,$$

wherein $X^{10}$ and T are as defined above.

Polyphenylenethenylene derivatives and polyphenylenethynylene derivatives can be obtained by polymerization of divinyl or diethinyl compounds with dihalogen compounds by the Heck reaction (R. F. Heck, Palladium Reagents in Organic Synthesis, Academic Press, New York 1985, pp. 179; L. S. Hegedus, Organometalics in Synthesis, Ed. M. Schlosser, Wiley, Chichester, UK 1994, pp. 383; Z. Bao, Y. Chen, R. Cai, L. Yu, Macromolecules 26 (1993) pp. 5281; W.-K. Chan, L. Yu, Macromolecules 28 (1995) pp. 6410; A. Hilberer, H.-J. Brouwer, B.-J. van der Scheer, J. Wildeman, G. Hadziioannou, Macromolecules 1995, 28, 4525) and the Sonogaschira reaction (Dmitri Gelman and Stephen L. Buchwald, Angew. Chem. Int. Ed. 42 (2003) 5993-5996; Rik R. Tykwinski, Angew. Chem. 115 (2003) 1604-1606; Jason M. Nolan and Daniel L. Comins, J. Org. Chem. 68 (2003) 3736-3738; Jiang Cheng et al., J. Org. Chem. 69 (2004) 5428-5432; Zolta'n Nova'k et al., Tetrahedron 59 (2003) 7509-7513):

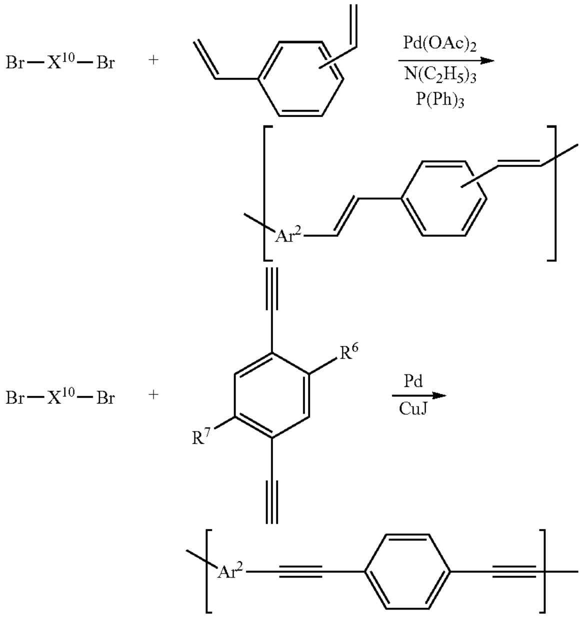

(Random) copolymers of formula VII, wherein a is 1, b is 1, c is 0.005 to 0.995, d is 1, e is 1, f is 0.995 to 0.005, wherein the sum of c and f is 1, can also be obtained by the Heck reaction:

(VIIe)

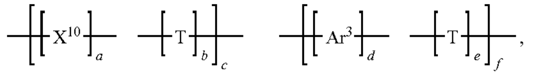

wherein a, b, c, d, e, f, $X^{10}$, $Ar^3$ and T are as defined above.

The polymers containing groups of formulas (I) may be prepared by any suitable process, but are preferably prepared by the processes described above.

The polymers of the present invention can optionally comprise end moieties $E^1$, wherein $E^1$ is an aryl moiety which may optionally be substituted with a reactive group capable of undergoing chain extension or crosslinking, or a tri($C_1$-$C_{18}$) alkylsiloxy group. As used herein, a reactive group capable of undergoing chain extension or crosslinking refers to any group which is capable of reacting with another of the same group or another group so as to form a link to prepare polymers. Preferably, such reactive group is a hydroxy, glycidyl ether, acrylate ester, methacrylate ester, ethenyl, ethynyl, maleimide, naphthimide, trifluorovinyl ether moiety or a cyclobutene moiety fused to the aromatic ring of $E^1$.

The polymers of the present invention, where $E^1$ are reactive groups as defined above, are capable of crosslinking to form solvent resistant, heat-resistant films at 100° C. or more, more preferably at 150° C. or more. Preferably, such crosslinking occurs at 350° C. or less, more preferably 300° C. or less and most preferably 250° C. or less. The crosslinkable polymers of the invention are stable at 100° C. or more and more preferably 150° C. or more. "Stable" as used herein means that such polymers do not undergo crosslinking or polymerization reactions at or below the stated temperatures. If a crosslinkable material is desired, $E^1$ is preferably a vinylphenyl, an ethynylphenyl, or 4-(or 3-)benzocyclobutenyl radical. In another embodiment, $E^1$ is selected from a group of phenolic derivatives of the formula —$C_6H_4$—O—Y, wherein Y is

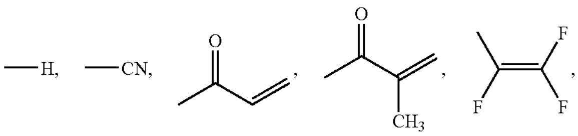

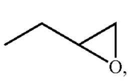 or 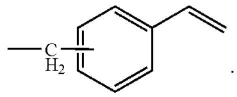 .

If desired, the cross-linkable groups can be present in other parts of the polymer chain. For example, one of the substituents of the co-monomer T may be a crosslinkable group $E^1$.

The end-capping agent $E^1$-$X^{12}$ ($E^1$ is as defined above and $X^{12}$ is either Cl or Br) is incorporated into the polymers of the present invention under the condition in which the resulting polymers are substantially capped by the reactive group $E^1$. The reactions useful for this purpose are the nickel-coupling, Heck reactions and Suzuki reactions described above. The average degree of polymerization is controlled by the mole ratio of monomers to end-capping agent.

The polymers according to the invention can be worked up by known methods which are familiar to the person skilled in the art, as described, for example, in D. Braun, H. Cherdron, H. Ritter, Praktikum der makromolekularen Stoffe, $1^{st}$ Edn., Wiley VCH, Weinheim 1999, p. 68-79 or R. J. Young, P. A. Lovell, Introduction to Polymers, Chapman & Hall, London 1991. For example, the reaction mixture can be filtered, diluted with aqueous acid, extracted and the crude product obtained after drying and stripping-off of the solvent can be further purified by reprecipitation from suitable solvents with addition of precipitants. Residual palladium can be removed by using activated carbon, chromatography etc. Advantageously, the residual palladium could be reduced to <3 ppm by washing the crude organic solvent layer containing the polymer with an aqueous solution of L-cysteine at room temperature to the boiling point of the organic solvent, especially by washing a toluene layer containing the polymer with an aqueous solution of L-cysteine at 85 to 90° C., optionally followed by washing with a solution of L-cysteine and sodium thiosulfate at 78 to 82° C. (Mahavir Prashad, Yugang Liu, Oljan Repicoe, Adv. Synth. Catal. 2003, 345, 533-536; Christine E. Garrett, Kapa Prasad, Adv. Synth. Catal. 2004, 346, 889-900). Additionally the Pd can be removed by washing the polymer with an aqueous NaCN solution as described in U.S. Pat. No. 6,956,095. Polymer-analogous reactions can subsequently be carried out for further functionalization of the polymer. Thus, for example, terminal halogen atoms can be removed reductively by reduction with, for example, $LiAlH_4$ (see, for example, J. March, Advanced Organic Chemistry, $3^{rd}$ Edn. McGraw-Hill, p. 510).

Another aspect of this invention is related to polymer blends containing 1 to 99 percent of at least one containing polymers comprising a unit of formula I. The remainder 1 to 99 percent of the blend is composed of one or more polymeric materials selected from among chain growth polymers such as polystyrene, polybutadiene, poly(methyl methacrylate), and poly(ethylene oxide); step-growth polymers such as phenoxy resins, polycarbonates, polyamides, polyesters, polyurethanes, and polyimides; and crosslinked polymers such as crosslinked epoxy resins, crosslinked phenolic resins, crosslinked acrylate resins, and crosslinked urethane resins. Examples of these polymers may be found in Preparative Methods of Polymer Chemistry, W. R. Sorenson and T. W. Campbell, Second Edition, Interscience Publishers (1968). Also may be used in the blends are conjugated polymers such as poly(phenylene vinylene), substituted poly(phenylene vinylene)s, substituted polyphenylenes and polythiophenes. Examples of these conjugated polymers are given by Greenham and Friend in Solid State Physics, Vol. 49, pp. 1-149 (1995).

A further embodiment of the present invention is represented by the monomers of the formula (XIII)

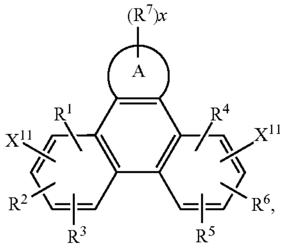 especially

-continued (XIIIa)

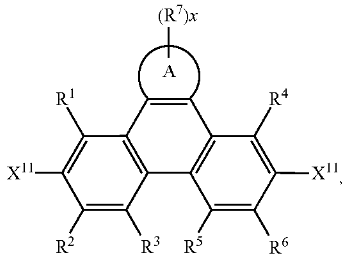

or (XIIIb)

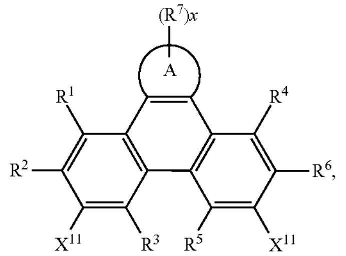

wherein A, $R^1$, $R^2$, $R^3$, $R^4$, $R^5$, $R^6$, $R^7$ and x are defined as above, $X^{11}$ is independently in each occurrence a halogen atom, or $-OS(O)_2CF_3$, $-OS(O)_2$-aryl, especially

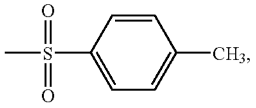

$-OS(O)_2CH_3$, $-B(OH)_2$, $-B(OY^1)_2$,

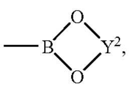

$-BF_4Na$, or $-BF_4K$, wherein $Y^1$ is independently in each occurrence a $C_1$-$C_{10}$alkyl group and $Y^2$ is independently in each occurrence a $C_2$-$C_{10}$alkylene group, such as $-CY^3Y^4-CY^5Y^6-$, or $-CY^7Y^8-CY^9Y^{10}-CY^{11}Y^{12}-$, wherein $Y^3$, $Y^4$, $Y^5$, $Y^6$, $Y^7$, $Y^8$, $Y^9$, $Y^{10}$, $Y^{11}$ and $Y^{12}$ are independently of each other hydrogen, or a $C_1$-$C_{10}$alkyl group, especially $-C(CH_3)_2C(CH_3)_2-$, or $-C(CH_3)_2CH_2C(CH_3)_2-$, with the proviso that the following compounds are excluded: 7:8(?)-dibromo-3'-nitrophenanthriminazole, 5:10(?)-dibromo-3'-nitrophenanthriminazole, 7:8(?)-dibromo-4'-nitrophenanthriminazole (J. Chem. Soc. (1923) 1560),

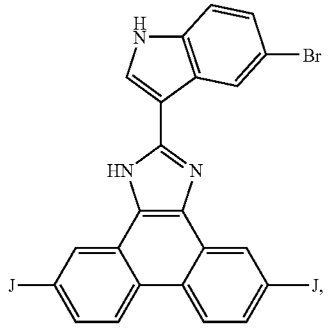

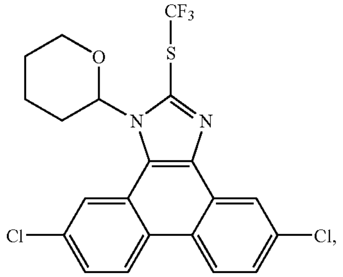

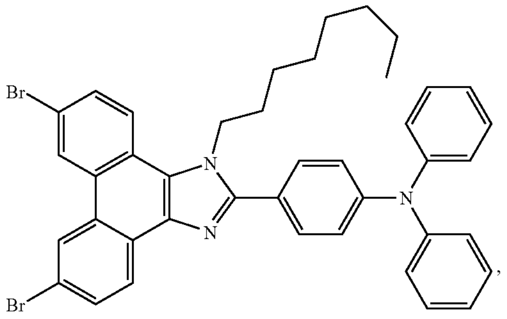

, and

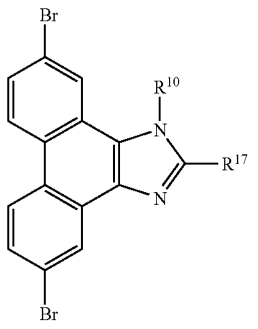

| $R^{10}$ | $R^{17}$ |
|---|---|
| 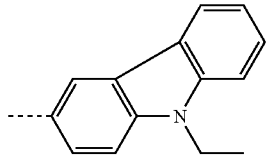 | H |
| " | 1-octyl |
| " | 2-ethylhexyl |
| " | 2-hexyldecyl |

-continued

| | |
|---|---|
| 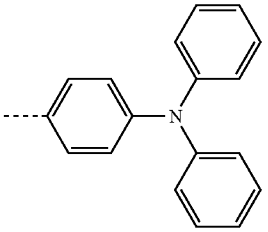 | H |
| " | 2-ethylhexyl |
| " | 2-hexyldecyl |

and with the further proviso that if

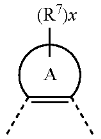

is a group

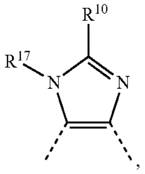

$R^{10}$ is different from a group —$S(O)_{ng}$—R', wherein R' is $CF_2CF_2H$ and n9 is 0-2 (SU1001855).

According to the present invention monomers are preferred, wherein the groups $X^{11}$ are in position 2, 7 or 3,6.

Preference is given to monomers of formula (XIV)

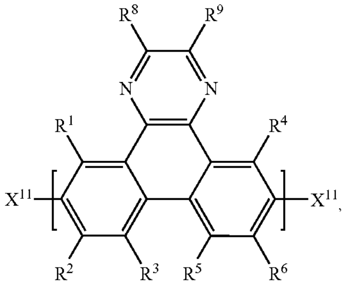

(XV)

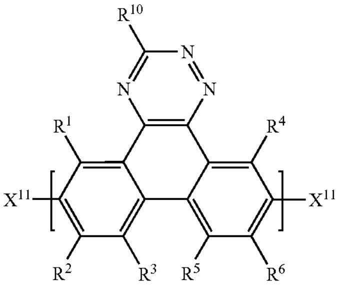

and/or

-continued (XVI)

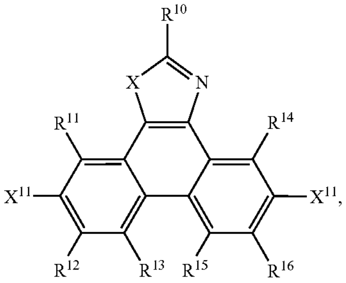

especially (XVIa)

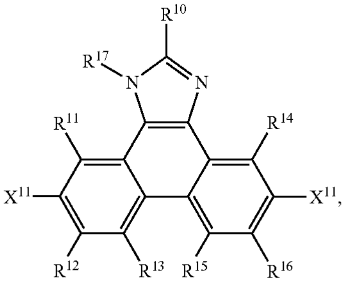

and/or (XVIb)

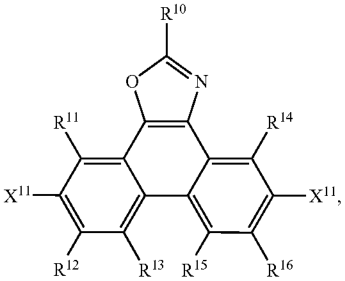

(XIX)

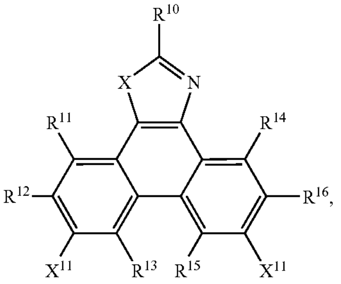

especially (XXa)

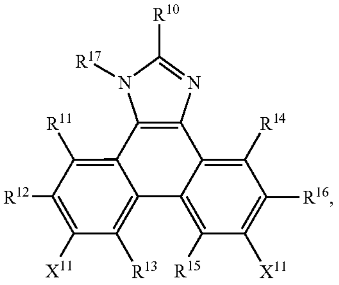

and/or

-continued (XXb)

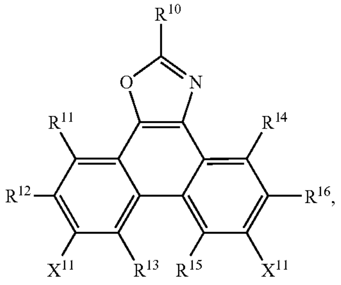

wherein $X^{11}$ is independently in each occurrence a halogen, especially Br, or I, especially Br, or $—OS(O)_2CF_3$, $—B(OH)_2$, $—B(OY^1)_2$ or

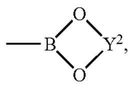

wherein $Y^1$ is independently in each occurrence a $C_1$-$C_{10}$alkyl group and $Y^2$ is independently in each occurrence a $C_2$-$C_{10}$alkylene group, such as $—CY^3Y^4—CY^5Y^6—$, or $—CY^7Y^8—CY^9Y^{10}—CY^{11}Y^{12}$_, wherein $Y^3$, $Y^4$, $Y^5$, $Y^6$, $Y^7$, $Y^8$, $Y^9$, $Y^{10}$, $Y^{11}$ and $Y^{12}$ are independently of each other hydrogen, or a $C_1$-$C_{10}$alkyl group, especially $—C(CH_3)_2C(CH_3)_2—$, or $—C(CH_3)_2CH_2C(CH_3)_2—$; with the proviso that in case of formula X at least one of $R^8$ and $R^9$ is a group of formula $-(Sp)_{x1}$-HEI, or if $R^8$ and $R^9$ together form a group

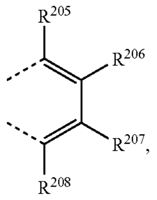

at least one of $R^{206}$ and $R^{207}$ is a group of formula $-(Sp)_{x1}$-HEI, or if $R^8$ and $R^9$ together form a group

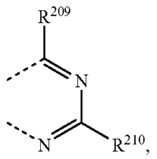

at least one of $R^{209}$ and $R^{210}$ is a group of formula $-(Sp)_{x1}$-HEI;

that in case of formula XI $R^{10}$ is a group of formula $-(Sp)_{x1}$-HEI;

that in case of formula XII $R^{10}$ is a group of formula $-(Sp)_{x1}$-HEI, or if X is group $N—R^{17}$, at least one of $R^{10}$ and $R^{17}$ is a group of formula $-(Sp)_{x1}$-HEI.

The following monomers are especially preferred:

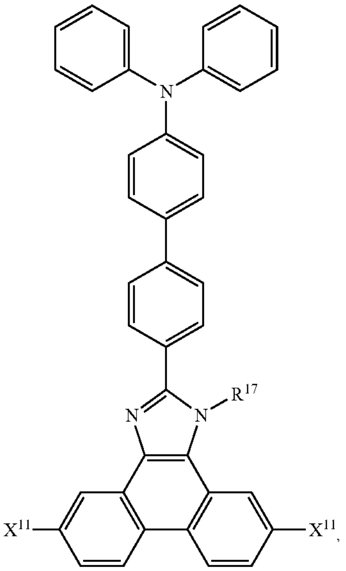

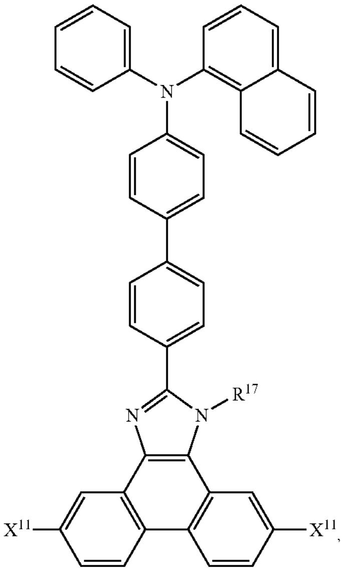

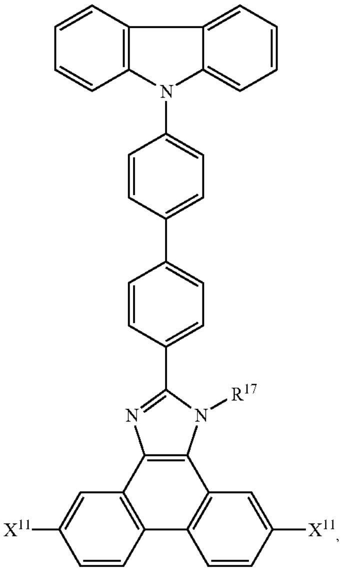

-continued
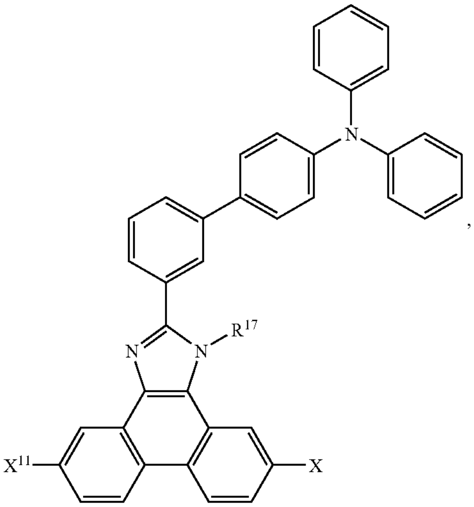
,
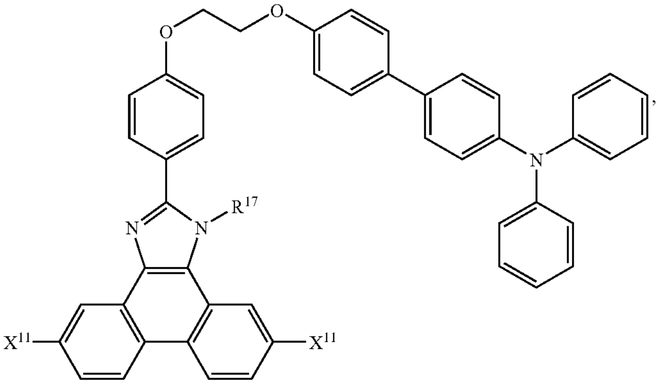
,
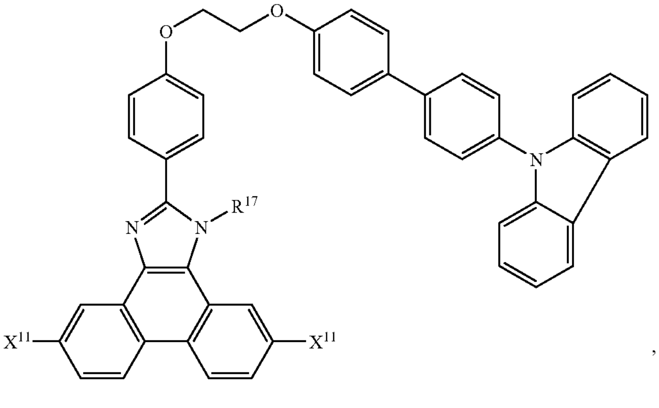
,
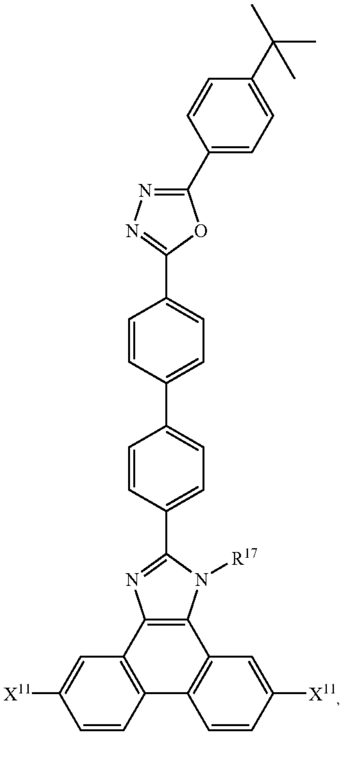
,

-continued
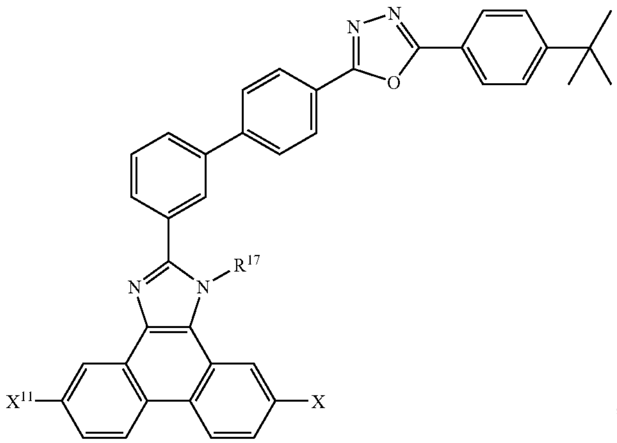
,
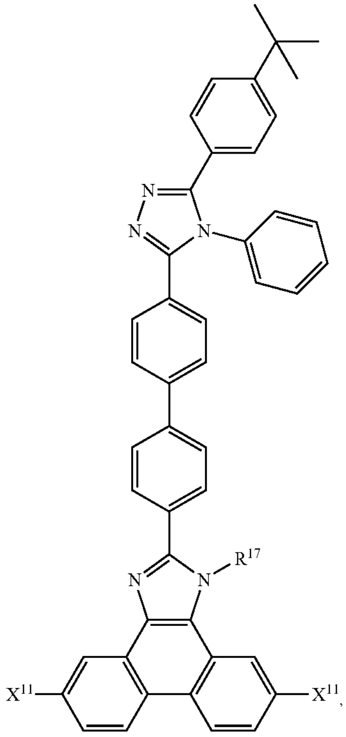
,
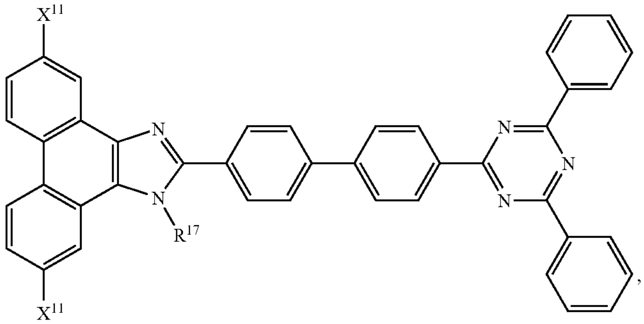
,
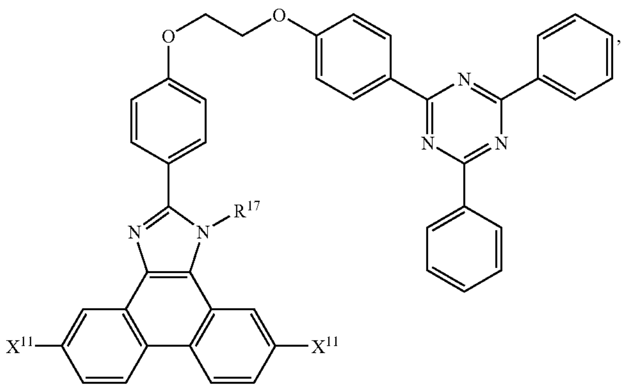
,

-continued
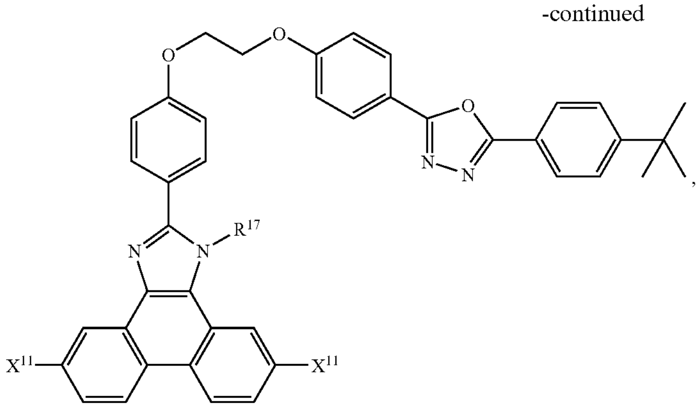
,
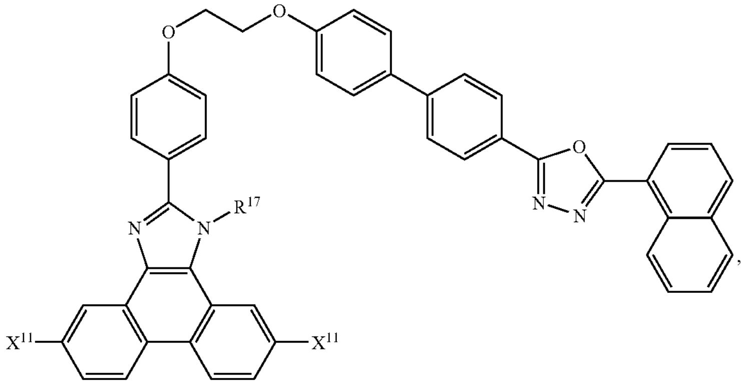
,
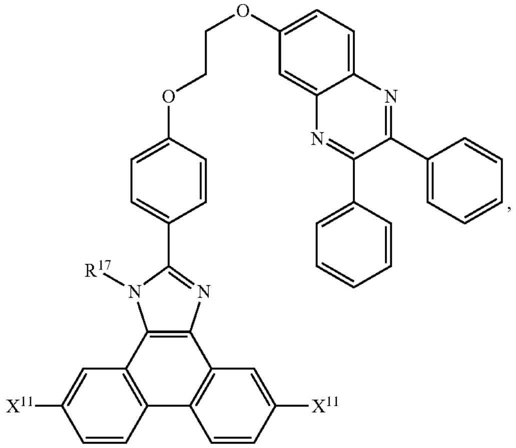
,
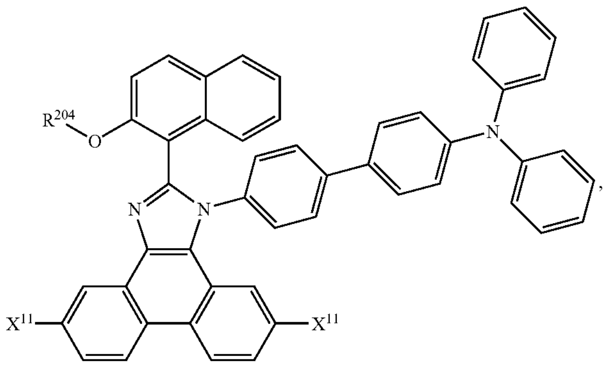
,

-continued

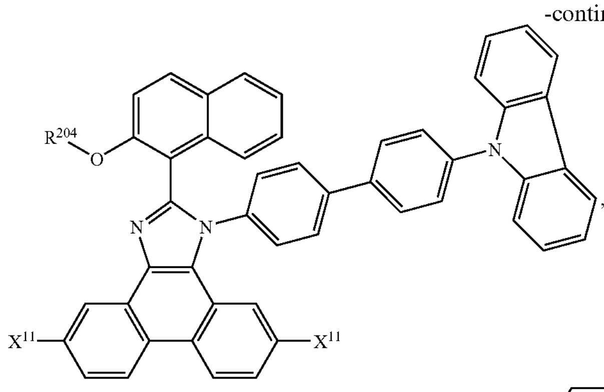

,

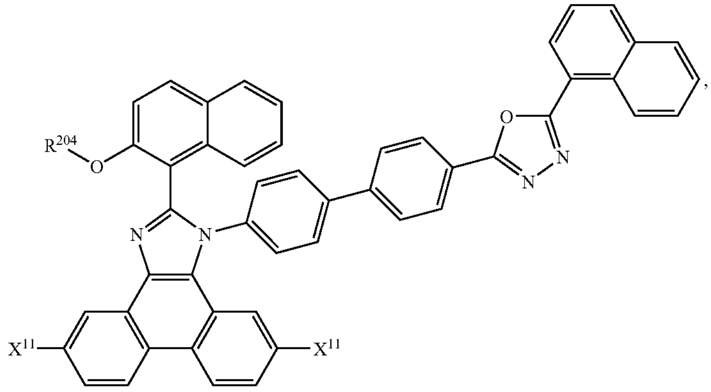

, and

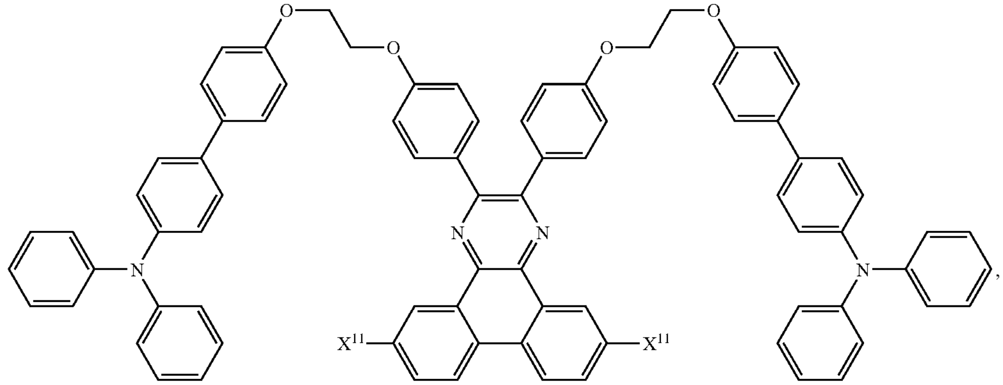

, wherein $R^{17}$ is $C_4$-$C_{25}$alkyl, such as n-butyl, sec.-butyl, isobutyl, tert.-butyl, n-pentyl, 2-pentyl, 3-pentyl, 2,2-dimethylpropyl, n-hexyl, n-heptyl, n-octyl, 1,1,3,3-tetramethylbutyl, 2-ethylhexyl, n-nonyl, n-decyl, n-undecyl, n-dodecyl, tridecyl, tetradecyl, pentadecyl, hexadecyl, 2-hexyldecyl, heptadecyl, octadecyl, eicosyl, heneicosyl, docosyl, tetracosyl, or pentacosyl, especially 2-ethylhexyl, n-octyl, 2-hexyldecyl, or 1-hexyldecyl, and $R^{204}$ is $C_4$-$C_{25}$alkyl, such as n-butyl, sec.-butyl, isobutyl, tert.-butyl, n-pentyl, 2-pentyl, 3-pentyl, 2,2-dimethylpropyl, n-hexyl, n-heptyl, n-octyl, 1,1,3,3-tetramethylbutyl, 2-ethylhexyl, n-nonyl, n-decyl, n-undecyl, n-dodecyl, tridecyl, tetradecyl, pentadecyl, hexadecyl, 2-hexyldecyl, heptadecyl, octadecyl, eicosyl, heneicosyl, docosyl, tetracosyl, or pentacosyl, especially 2-ethylhexyl, n-octyl, 2-hexyldecyl, or 1-hexyldecyl and $X^{11}$ is as defined above.

Halogen is fluorine, chlorine, bromine and iodine.

$C_1$-$C_{25}$alkyl is typically linear or branched, where possible. Examples are methyl, ethyl, n-propyl, isopropyl, n-butyl, sec.-butyl, isobutyl, tert.-butyl, n-pentyl, 2-pentyl, 3-pentyl, 2,2-dimethylpropyl, 1,1,3,3-tetramethylpentyl, n-hexyl, 1-methylhexyl, 1,1,3,3,5,5-hexamethylhexyl, n-heptyl, isoheptyl, 1,1,3,3-tetramethylbutyl, 1-methylheptyl, 3-methylheptyl, n-octyl, 1,1,3,3-tetramethylbutyl and 2-ethylhexyl, n-nonyl, decyl, undecyl, dodecyl, tridecyl, tetradecyl, pentadecyl, hexadecyl, heptadecyl, octadecyl, eicosyl, heneicosyl, docosyl, tetracosyl or pentacosyl. $C_1$-$C_8$alkyl is typically methyl, ethyl, n-propyl, isopropyl, n-butyl, sec.-butyl, isobutyl, tert.-butyl, n-pentyl, 2-pentyl, 3-pentyl, 2,2-dimethylpropyl, n-hexyl, n-heptyl, n-octyl, 1,1,3,3-tetramethylbutyl and 2-ethylhexyl. $C_1$-$C_4$alkyl is typically methyl, ethyl, n-propyl, isopropyl, n-butyl, sec.-butyl, isobutyl, tert.-butyl.

$C_1$-$C_{25}$alkoxy groups are straight-chain or branched alkoxy groups, e.g. methoxy, ethoxy, n-propoxy, isopropoxy, n-butoxy, sec-butoxy, tert-butoxy, amyloxy, isoamyloxy or tert-amyloxy, heptyloxy, octyloxy, isooctyloxy, nonyloxy, decyloxy, undecyloxy, dodecyloxy, tetradecyloxy, pentadecyloxy, hexadecyloxy, heptadecyloxy and octadecyloxy. Examples of $C_1$-$C_8$alkoxy are methoxy, ethoxy, n-propoxy, isopropoxy, n-butoxy, sec.-butoxy, isobutoxy, tert.-butoxy, n-pentyloxy, 2-pentyloxy, 3-pentyloxy, 2,2-dimethylpropoxy, n-hexyloxy, n-heptyloxy, n-octyloxy, 1,1,3,3-tetramethylbutoxy and 2-ethylhexyloxy, preferably $C_1$-$C_4$alkoxy such as typically methoxy, ethoxy, n-propoxy, isopropoxy, n-butoxy, sec.-butoxy, isobutoxy, tert.-butoxy. The term "alkylthio group" means the same groups as the alkoxy groups, except that the oxygen atom of the ether linkage is replaced by a sulfur atom.

$C_2$-$C_{25}$alkenyl groups are straight-chain or branched alkenyl groups, such as e.g. vinyl, allyl, methallyl, isopropenyl, 2-butenyl, 3-butenyl, isobutenyl, n-penta-2,4-dienyl, 3-methyl-but-2-enyl, n-oct-2-enyl, n-dodec-2-enyl, isododecenyl, n-dodec-2-enyl or n-octadec-4-enyl.

$C_{2-24}$alkynyl is straight-chain or branched and preferably $C_{2-8}$alkynyl, which may be unsubstituted or substituted, such as, for example, ethynyl, 1-propyn-3-yl, 1-butyn-4-yl, 1-pentyn-5-yl, 2-methyl-3-butyn-2-yl, 1,4-pentadiyn-3-yl, 1,3-pentadiyn-5-yl, 1-hexyn-6-yl, cis-3-methyl-2-penten-4-yn-1-yl, trans-3-methyl-2-penten-4-yn-1-yl, 1,3-hexadiyn-5-yl, 1-octyn-8-yl, 1-nonyn-9-yl, 1-decyn-10-yl, or 1-tetracosyn-24-yl.

$C_1$-$C_{18}$perfluoroalkyl, especially $C_1$-$C_4$perfluoroalkyl, is a branched or unbranched radical such as for example $-CF_3$, $-CF_2CF_3$, $-CF_2CF_2CF_3$, $-CF(CF_3)_2$, $-(CF_2)_3CF_3$, and $-C(CF_3)_3$.

The terms "haloalkyl, haloalkenyl and haloalkynyl" mean groups given by partially or wholly substituting the above-mentioned alkyl group, alkenyl group and alkynyl group with halogen, such as trifluoromethyl etc. The "aldehyde group, ketone group, ester group, carbamoyl group and amino group" include those substituted by an alkyl group, a cycloalkyl group, an aryl group, an aralkyl group or a heterocyclic group, wherein the alkyl group, the cycloalkyl group, the aryl group, the aralkyl group and the heterocyclic group may be unsubstituted or substituted. The term "silyl group" means a group of formula $-SiR^{62}R^{63}R^{64}$, wherein $R^{62}$, $R^{63}$ and $R^{64}$ are independently of each other a $C_1$-$C_8$alkyl group, in particular a $C_1$-$C_4$ alkyl group, a $C_6$-$C_{24}$aryl group or a $C_7$-$C_{12}$aralkyl group, such as a trimethylsilyl group. The term "siloxanyl grgup" means a group of formula $-O-SiR^{62}R^{63}R^{64}$, wherein $R^{62}$, $R^{63}$ and $R^{64}$ are as defined above, such as a trimethylsiloxanyl group.

The term "cycloalkyl group" is typically $C_5$-$C_{12}$cycloalkyl, such as cyclopentyl, cyclohexyl, cycloheptyl, cyclooctyl, cyclononyl, cyclodecyl, cycloundecyl, cyclododecyl, preferably cyclopentyl, cyclohexyl, cycloheptyl, or cyclooctyl, which may be unsubstituted or substituted. The term "cycloalkenyl group" means an unsaturated alicyclic hydrocarbon group containing one or more double bonds, such as cyclopentenyl, cyclopentadienyl, cyclohexenyl and the like, which may be unsubstituted or substituted. The cycloalkyl group, in particular a cyclohexyl group, can be condensed one or two times by phenyl which can be substituted one to three times with $C_1$-$C_4$-alkyl, halogen and cyano. Examples of such condensed cyclohexyl groups are:

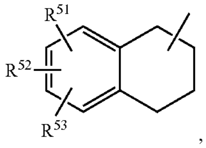

,

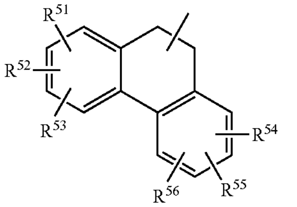

or

-continued

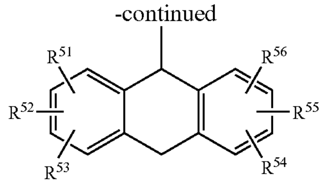

in particular

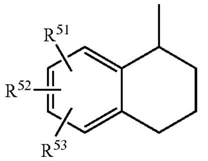

or

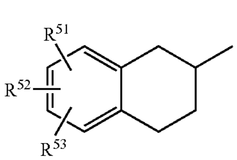

, wherein $R^{51}$, $R^{52}$, $R^{53}$, $R^{54}$, $R^{55}$ and $R^{56}$ are independently of each other $C_1$-$C_8$-alkyl, $C_1$-$C_8$-alkoxy, halogen and cyano, in particular hydrogen.

Aryl is usually $C_6$-$C_{30}$aryl, preferably $C_6$-$C_{24}$aryl, which optionally can be substituted, such as, for example, phenyl, 4-methylphenyl, 4-methoxyphenyl, naphthyl, especially 1-naphthyl, or 2-naphthyl, biphenylyl, terphenylyl, pyrenyl, 2- or 9-fluorenyl, phenanthryl, anthryl, tetracyl, pentacyl, hexacyl, or quaderphenylyl, which may be unsubstituted or substituted.

The term "aralkyl group" is typically $C_7$-$C_{24}$aralkyl, such as benzyl, 2-benzyl-2-propyl, β-phenyl-ethyl, α,α-dimethylbenzyl, ω-phenyl-butyl, ω,ω-dimethyl-ω-phenyl-butyl, ω-phenyl-dodecyl, ω-phenyl-octadecyl, ω-phenyl-eicosyl or ω-phenyl-docosyl, preferably $C_7$-$C_{18}$aralkyl such as benzyl, 2-benzyl-2-propyl, β-phenyl-ethyl, α,α-dimethylbenzyl, ω-phenyl-butyl, ω,ω-dimethyl-ω-phenyl-butyl, ω-phenyl-dodecyl or ω-phenyl-octadecyl, and particularly preferred $C_7$-$C_{12}$aralkyl such as benzyl, 2-benzyl-2-propyl, β-phenyl-ethyl, α,α-dimethylbenzyl, ω-phenyl-butyl, or ω,ω-dimethyl-ω-phenyl-butyl, in which both the aliphatic hydrocarbon group and aromatic hydrocarbon group may be unsubstituted or substituted.

The term "aryl ether group" is typically a $C_{6-24}$aryloxy group, that is to say $O-C_{6-24}$aryl, such as, for example, phenoxy or 4-methoxyphenyl. The term "aryl thioether group" is typically a $C_{6-24}$arylthio group, that is to say $S-C_{6-24}$aryl, such as, for example, phenylthio or 4-methoxyphenylthio. The term "carbamoyl group" is typically a $C_{1-18}$carbamoyl radical, preferably $C_{1-8}$carbamoyl radical, which may be unsubstituted or substituted, such as, for example, carbamoyl, methylcarbamoyl, ethylcarbamoyl, n-butylcarbamoyl, tert-butylcarbamoyl, dimethylcarbamoyloxy, morpholinocarbamoyl or pyrrolidinocarbamoyl.

The terms "aryl" and "alkyl" in alkylamino groups, dialkylamino groups, alkylarylamino groups, arylamino groups and diaryl groups are typically $C_1$-$C_{25}$alkyl and $C_6$-$C_{24}$aryl, respectively.

Alkylaryl refers to alkyl-substituted aryl radicals, especially $C_7$-$C_{12}$alkylaryl. Examples are tolyl, such as 3-methyl-, or 4-methylphenyl, or xylyl, such as 3,4-dimethylphenyl, or 3,5-dimethylphenyl.

Heteroaryl is typically $C_2$-$C_{26}$heteroaryl, i.e. a ring with five to seven ring atoms or a condensed ring system, wherein nitrogen, oxygen or sulfur are the possible hetero atoms, and is typically an unsaturated heterocyclic group with five to 30 atoms having at least six conjugated π-electrons such as thienyl, benzo[b]thienyl, dibenzo[b,d]thienyl, thianthrenyl, furyl, furfuryl, 2H-pyranyl, benzofuranyl, isobenzofuranyl, dibenzofuranyl, phenoxythienyl, pyrrolyl, imidazolyl, pyrazolyl, pyridyl, bipyridyl, triazinyl, pyrimidinyl, pyrazinyl, pyridazinyl, indolizinyl, isoindolyl, indolyl, indazolyl, purinyl, quinolizinyl, chinolyl, isochinolyl, phthalazinyl, naphthyridinyl, chinoxalinyl, chinazolinyl, cinnolinyl, pteridinyl, carbazolyl, carbolinyl, benzotriazolyl, benzoxazolyl, phenanthridinyl, acridinyl, pyrimidinyl, phenanthrolinyl, phenazinyl, isothiazolyl, phenothiazinyl, isoxazolyl, furazanyl or phenoxazinyl, which can be unsubstituted or substituted.

Examples of a five or six membered ring formed by, for example, $R^{16}$ and $R^{17}$, or $R^{65}$ and $R^{66}$, respectively are heterocycloalkanes or heterocycloalkenes having from 3 to 5 carbon atoms which can have one additional hetero atom selected from nitrogen, oxygen and sulfur, for example

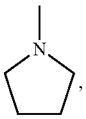, 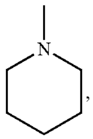, 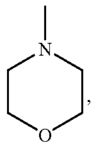, or 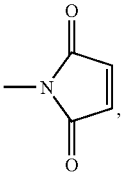, which can be part of a bicyclic system, for example

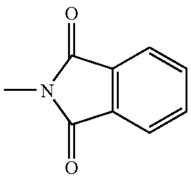 or 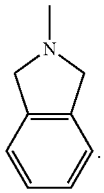.

Possible substituents of the above-mentioned groups are $C_1$-$C_8$alkyl, a hydroxyl group, a mercapto group, $C_1$-$C_8$alkoxy, $C_1$-$C_8$alkylthio, halogen, halo-$C_1$-$C_8$alkyl, a cyano group, an aldehyde group, a ketone group, a carboxyl group, an ester group, a carbamoyl group, an amino group, a nitro group or a silyl group.

If a substituent, such as, for example $R^7$ occurs more than one time in a group, it can be different in each occurrence.

The wording "substituted by G" means that one, or more, especially one to three substituents G might be present.

As described above, the aforementioned groups may be substituted by E and/or, if desired, interrupted by D. Interruptions are of course possible only in the case of groups containing at least 2 carbon atoms connected to one another by single bonds; $C_6$-$C_{18}$aryl is not interrupted; interrupted arylalkyl or alkylaryl contains the unit D in the alkyl moiety. $C_1$-$C_{18}$alkyl substituted by one or more E and/or interrupted by one or more units D is, for example, $(CH_2CH_2O)_{1-9}$—$R^x$, where $R^x$ is H or $C_1$-$C_{10}$alkyl or $C_2$-$C_{10}$alkanoyl (e.g. CO—$CH(C_2H_5)C_4H_9$), $CH_2$—$CH(OR^{y'})$—$CH_2$—O—$R^y$, where $R^y$ is $C_1$-$C_{18}$alkyl, $C_5$-$C_{12}$cycloalkyl, phenyl, $C_7$-$C_{15}$-phenylalkyl, and $R^{y'}$ embraces the same definitions as $R^y$ or is H;

$C_1$-$C_8$alkylene-COO—$R^z$, e.g. $CH_2COOR^z$, $CH(CH_3)COOR^z$, $C(CH_3)_2COOR^z$, where $R^z$ is H, $C_1$-$C_{18}$alkyl, $(CH_2CH_2O)_{1-9}$—$R^x$, and $R^x$ embraces the definitions indicated above; $CH_2CH_2$—O—CO—CH═$CH_2$; $CH_2CH(OH)CH_2$—O—CO—$C(CH_3)$═$CH_2$.

Preferred arylene radicals are 1,4-phenylene, 2,5-tolylene, 1,4-naphthylene, 1,9antracylene, 2,7-phenantrylene and 2,7-dihydrophenantrylene.

Preferred heteroarylene radicals are 2,5-pyrazinylene, 3,6-pyridazinylene, 2,5-pyridinylene, 2,5-pyrimidinylene, 1,3,4-thiadiazol-2,5-ylene, 1,3-thiazol-2,4-ylene, 1,3-thiazol-2,5-ylene, 2,4-thiophenylene, 2,5-thiophenylene, 1,3-oxazol-2,4-ylene, 1,3-oxazol-2,5-ylene and 1,3,4-oxadiazol-2,5-ylene, 2,5-indenylene and 2,6-indenylene.

Another aspect of the invention is the films formed from the polymers of the invention. Such films can be used in polymeric light-emitting diodes (PLEDs). Preferably, such films are used as emitting layers. These films may also be used as protective coatings for electronic devices and as fluorescent coatings. The thickness of the coating or film is dependent upon the ultimate use. Generally, such thickness can be from 0.01 to 200 microns. In that embodiment wherein the coating is used as a fluorescent coating, the coating or film thickness is from 10 to 200 microns. In that embodiment where the coatings are used as electronic protective layers, the thickness of the coating can be from 5 to 20 microns. In that embodiment where the coatings are used in a polymeric light-emitting diode, the thickness of the layer formed is 0.01 to 0.5 microns. The polymers of the invention form good pinhole- and defect-free films. Such films can be prepared by means well known in the art including spin-coating, spray-coating, dip-coating and roller-coating. Such coatings are prepared by a process comprising applying a composition to a substrate and exposing the applied composition to conditions such that a film is formed. The conditions which form a film depend upon the application technique. Preferably, the solution contains from 0.1 to 10 weight percent of the polymers. This composition is applied to the appropriate substrate by the desired method and the solvent is allowed to evaporate. Residual solvent may be removed by vacuum and/or by heat-drying. The films are preferably substantially uniform in thickness and substantially free of pinholes. In another embodiment, the polymers may be partially cured. This is known as B-staging.

The polymers of the present invention are suitable as matrix material for phosphorescent compounds, wherein the phosphorescent compounds are blended with or covalently bonded to the polymers.

A further embodiment of the present invention is directed to an electronic device or a component therefore, comprising a substrate and a polymer according to the present invention.

In such a device the polymers according to the present invention are used as electroluminescent material. For the purposes of the present invention, the term "electroluminescent material" is taken to mean materials which can be used as or in an active layer in an electroluminescent device. The term "active layer" means that the layer is capable of emitting light (light-emitting layer) on application of an electric field and/or that it improves the injection and/or transport of the positive and/or negative charges (charge injection or charge transport layer). The invention therefore also relates to the use of the polymers according to the invention as electroluminescent material. The invention furthermore relates to an electroluminescent material which comprises the polymers according to the invention. Electroluminescent devices are used, for example, as self-illuminating display elements, such as control lamps, alphanumeric displays, signs and in opto-electronic couplers.

A device according to the present invention may be prepared in accordance with the disclosure of WO99/48160, the contents of which are incorporated by reference. Polymers according to the present invention may be present in the device as the sole light emitting polymer or as a component in a blend further comprising hole and/or electron transporting polymers. Alternatively, the device may comprise distinct layers of a polymer of the present invention, a hole transporting polymer and/or an electron transporting polymer.

In one embodiment the electronic device comprises an electroluminescent device, which comprises (a) a charge injecting layer for injecting positive charge carriers, (b) a charge injecting layer for injecting negative charge carriers, (c) a light-emissive layer located between the layers (a) and (b) comprising a polymer according to the present invention.

The layer (a) may be a positive charge carrier transport layer which is located between the light emissive layer (c) and an anode electrode layer, or may be an anode electrode layer.

The layer (b) may be a negative charge carrier transport layer which is located between the light emissive layer (c) and an cathode electrode layer, or may be an cathode electrode layer. Optionally, an organic charge transport layer can be located between the light emissive layer (c) and one of the charge carrier injecting layers (a) and (b).

The EL device emits light in the visible electromagnetic spectrum between 400 nm and 780 nm, preferably between 430 nm and 470 nm for a blue color, preferably between 520 nm and 560 nm for a green color, preferably between 600 nm and 650 nm for a red color. By incorporating specific repeating units in the backbone of the polymer the emission can be even shifted to the near infrared (NIR, >780 nm).

It will be appreciated that the light emissive layer may be formed from a blend or mixture of materials including one or more polymers according to the present invention, and optionally further different polymers. The further different polymers may be so-called hole transport polymers (i.e. to improve the efficiency of hole transport to the light-emissive material) or electron-transport polymers (i.e. to improve the efficiency of electron transport to the light-emissive material). Preferably, the blend or mixture would comprise at least 0.1% by weight of a polymer according to the present invention, preferably from 0.2 to 50%, more preferably from 0.5 to 30% by weight.

An organic EL device typically consists of an organic film sandwiched between an anode and a cathode such that when a positive bias is applied to the device, holes are injected into the organic film from the anode, and electrons are injected into the organic film from the cathode. The combination of a hole and an electron may give rise to an exciton, which may undergo radiative decay to the ground state by liberating a photon. In practice the anode is commonly an mixed oxide of tin and indium for its conductivity and transparency. The mixed oxide (ITO) is deposited on a transparent substrate such as glass or plastic so that the light emitted by the organic film may be observed. The organic film may be the composite of several individual layers each designed for a distinct function. Since holes are injected from the anode, the layer next to the anode needs to have the functionality of transporting holes. Similarly, the layer next to the cathode needs to have the functionality of transporting electrons. In many instances, the hole-(electron) transporting layer also acts as the emitting layer. In some instances one layer can perform the combined functions of hole and electron transport and light emission. The individual layers of the organic film may be all polymeric in nature or combinations of films of polymers and films of small molecules deposited by thermal evaporation. It is preferred that the total thickness of the organic film be less than 1000 nanometers (nm). It is more preferred that the total thickness be less than 500 nm. It is most preferred that the total thickness be less than 300 nm. It is preferred that the thickness of the active (light emitting) layer be less than 400 nanometers (nm). It is more preferred that the thickness is in the range of from 40 to 160 nm.

The ITO-glass, which serves as the substrate and the anode, may be used for coating after the usual cleaning with detergent, organic solvents and UV-ozone treatment. It may also be first coated with a thin layer of a conducting substance to facilitate hole injection. Such substances include copper phthalocyanine, polyaniline (PANI) and poly(3,4-ethylenedioxy-thiophene) (PEDOT); the last two in their (doped) conductive forms, doped, for example, with $FeCl_3$ or $Na_2S_2O_8$. They contain poly(styrenesulfonic acid) (PSS) as counter-ion to ensure water solubility. It is preferred that the thickness of this layer be 200 nm or less; it is more preferred that the thickness be 100 nm or less.

In the cases where a hole-transporting layer is used, the polymeric arylamines described in U.S. Pat. No. 5,728,801, may be used. Other known hole-conducting polymers, such as polyvinylcarbazole, may also be used. The resistance of this layer to erosion by the solution of the copolymer film which is to be applied next is obviously critical to the successful fabrication of multi-layer devices. The thickness of this layer may be 500 nm or less, preferably 300 nm or less, most preferably 150 nm or less.

In the case where an electron-transporting layer is used, it may be applied either by thermal evaporation of low molecular weight materials or by solution coating of a polymer with a solvent that would not cause significant damage to the underlying film.

Examples of low molecular weight materials include the metal complexes of 8-hydroxyquinoline (as described by Burrows et al. in Appl. Phys. Lett. 64 (1994) 2718-2720), metallic complexes of 10-hydroxybenzoquinoline (as described by Hamada et al. in Chem. Lett. (1993) 906-906), 1,3,4-oxadiazoles (as described by Hamada et al. in Optoelectronics-Devices and Technologies 7 (1992) 83-93), 1,3,4-triazoles (as described by Kido et al. in Chem. Lett. (1996) 47-48), and dicarboximides of perylene (as described by Yoshida et al. in Appl. Phys. Lett. 69 (1996) 734-736).

Polymeric electron-transporting materials are exemplified by 1,3,4-oxadiazole-containing polymers (as described by Li et al. in J. Chem. Soc. (1995) 2211-2212, by Yang and Pei in J. Appl. Phys. 77 (1995) 4807-4809), 1,3,4-triazole-containing polymers (as described by Strukelj et al. in Science 267 (1995) 1969-1972), quinoxaline-containing polymers (as described by Yamamoto et al. in Jpn. J. Appl. Phys. 33 (1994) L250-L253, O'Brien et al. in Synth. Met. 76 (1996) 105-108), and cyano-PPV (as described by Weaver et al. in Thin Solid Films 273 (1996) 39-47). The thickness of this layer may be 500 nm or less, preferably 300 nm or less, most preferably 150 nm or less.

The cathode material may be deposited either by thermal evaporation or by sputtering. The thickness of the cathode may be from 1 nm to 10,000 nm, preferably 5 nm to 500 nm.

OLEDs made according to the present invention may include phosphorescent dopants dispersed in the device's emissive layer, capable of achieving internal quantum efficiencies approaching 100%. As used herein, the term "phosphorescence refers to emission from a triplet excited state of an organic or metal-organic molecule. High efficiency organic light emitting devices using phosphorescent dopants have been demonstrated using several different conducting host materials (M. A. Baldo et al., Nature, Vol 395, 151 (1998), C. Adachi et al., Appl. Phys. Lett., Vol. 77, 904 (2000)).

In a preferred embodiment, the electroluminescent device comprises at least one hole-transporting polymer film and a light-emitting polymer film comprised of the polymer of the invention, arranged between an anode material and a cathode material such that under an applied voltage, holes are injected from the anode material into the hole-transporting polymer film and electrons are injected from the cathode material into the light-emitting polymer films when the device is forward biased, resulting in light emission from the light-emitting layer.

In another preferred embodiment, layers of hole-transporting polymers are arranged so that the layer closest to the anode has the lower oxidation potential, with the adjacent layers having progressively higher oxidation potentials. By these methods, electroluminescent devices having relatively high light output per unit voltage may be prepared.

The term "hole-transporting polymer film" as used herein refers to a layer of a film of a polymer which when disposed between two electrodes to which a field is applied and holes are injected from the anode, permits adequate transport of holes into the emitting polymer. Hole-transporting polymers typically are comprised of triarylamine moieties. The term "light-emitting polymer film" as used herein refers to a layer of a film of a polymer whose excited states can relax to the ground state by emitting photons, preferably corresponding to wavelengths in the visible range. The term "anode material" as used herein refers to a semi-transparent, or transparent, conducting film with a work function between 4.5 electron volts (eV) and 5.5 eV. Examples are gold, silver, copper, aluminum, indium, iron, zinc, tin, chromium, titanium, vanadium, cobalt, nickel, lead, manganese, tungsten and the like, metallic alloys such as magnesium/copper, magnesium/silver, magnesium/aluminum, aluminum/indium and the like, semiconductors such as Si, Ge, GaAs and the like, metallic oxides such as indium-tin-oxide ("ITO"), ZnO and the like, metallic compounds such as CuI and the like, and furthermore, electroconducting polymers such polyacetylene, polyaniline, polythiophene, polypyrrole, polyparaphenylene and the like. Oxides and mixed oxides of indium and tin, and gold are preferred. Most preferred is ITO, especially ITO on glass, or on a plastics material, such as polyester, for example polyethylene terephthalate (PET), as substrate.

The term "cathode material" as used herein refers to a conducting film with a work function between 2.0 eV and 4.5 eV. Examples are alkali metals, earth alkaline metals, group 13 elements, silver, and copper as well as alloys or mixtures thereof such as sodium, lithium, potassium, calcium, lithium fluoride (LiF), sodium-potassium alloy, magnesium, magnesium-silver alloy, magnesium-copper alloy, magnesium-aluminum alloy, magnesium-indium alloy, aluminum, aluminum-aluminum oxide alloy, aluminum-lithium alloy, indium, calcium, and materials exemplified in EP-A 499,011, such as electroconducting polymers e.g. polypyrrole, polythiophene, polyaniline, polyacetylene etc. Preferably lithium, calcium, magnesium, indium, silver, aluminum, or blends and alloys of the above are used. In the case of using a metal or a metallic alloy as a material for an electrode, the electrode can be formed also by the vacuum deposition method. In the case of using a metal or a metallic alloy as a material forming an electrode, the electrode can be formed, furthermore, by the chemical plating method (see for example, Handbook of Electrochemistry, pp 383-387, Mazuren, 1985). In the case of using an electroconducting polymer, an electrode can be made by forming it into a film by means of anodic oxidation polymerization method onto a substrate, which is previously provided with an electroconducting coating.

As methods for forming said thin films, there are, for example, the vacuum deposition method, the spin-coating method, the casting method, the Langmuir—Blodgett ("LB") method, the ink jet printing method and the like. Among these methods, the vacuum deposition method, the spin-coating method, the ink jet printing method and the casting method are particularly preferred in view of ease of operation and cost.

In the case of forming the layers by using the spin-coating method, the casting method and ink jet printing method, the coating can be carried out using a solution prepared by dissolving the composition in a concentration of from 0.0001 to 90% by weight in an appropriate organic solvent such as benzene, toluene, xylene, tetrahydrofurane, methyltetrahydrofurane, N,N-dimethylformamide, acetone, acetonitrile, anisole, dichloromethane, dimethylsulfoxide and mixtures thereof.

The organic EL device of the present invention is seen as a future replacement technology for a flat panel display of an on-wall television set, a flat light-emitting device, such as a wall paper, a light source for a copying machine or a printer, a light source for a liquid crystal display or counter, a display signboard and a signal light and perhaps even to replace incandescent and fluorescent lamps. The polymers and compositions of the present invention can be used in the fields of an organic EL device, a photovoltaic device, an electrophotographic photoreceptor, a photoelectric converter, a solar cell, an image sensor, and the like.

Accordingly, the present invention relates also to PLEDs, organic integrated circuits (O-ICs), organic field effect transistors (OFETs), organic thin film transistors (OTFTs), organic solar cells (O-SCs), thermoelectric devices, electrochromic devices, or organic laser diodes comprising one or more of the polymers according to the present invention.

The following examples are included for illustrative purposes only and do not limit the scope of the claims. Unless otherwise stated, all parts and percentages are by weight. Weight-average molecular weight ($M_w$) and polydispersity ($M_w/M_n$=PD) are determined by Gel Permeation Chromatography (GPC) [Apparatus: $GPC_{max}$+TDA 302 from Viscotek (Houston, Tex., USA) yielding the responses form refractive index (RI), low angle light scattering (LALS), right angle light scattering (RALS) and differential viscosity (DP) measurements. Chromatographic conditions: Column: $PL_{gel}$ mixed C (300×7.5 mm, 5 μm particles) covering the molecular weight range from about $1\times10^3$ to about $2.5\times10^6$ Da from Polymer Laboratories (Church Stretton, UK); Mobile phase: tetrahydrofuran containing 5 g/l of sodium trifluoroacetate; Mobile phase flow: either 0.5 or 0.7 ml/min; Solute concentration: about 1-2 mg/ml; Injection volume: 100 μl; Detection: RI, LALS, RALS, DP. Procedure of molecular weight calibration: Relative calibration is done by use of a set of 10 polystyrene calibration standards obtained from Polymer Laboratories (Church Stretton, UK) spanning the molecular weight range from 1'930'000 Da-5'050 Da, i.e., PS 1'930'000, PS 1'460'000, PS 1'075'000, PS 560'000, PS 330'000, PS 96'000, PS 52'000, PS 30'300, PS 10'100, PS 5'050 Da. Absolute calibration is done on the base of the responses of LALS, RALS and DP. As experienced in a large number of investigations this combination provides optimum calculation of molecular weight data. Usually PS 96'000 is used as the molecular weight calibration standard, but in general every other PS standard lying in the molecular weight range to be determined can be chosen for this purpose.

All polymer structures given in the examples below are idealized representations of the polymer products obtained via the polymerization procedures described. If more than two components are copolymerized with each other sequences in the polymers can be either alternating or random depending on the polymerisation conditions.

EXAMPLES

Example 1

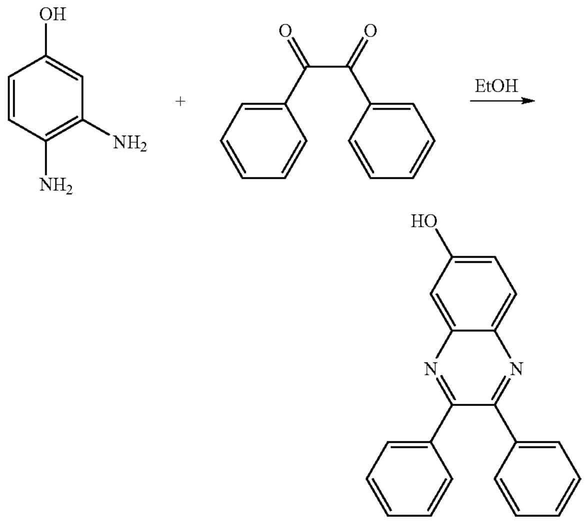

a) 5.00 g (40.3 mmol) 3,4-diaminophenol are added to a suspension of 7.06 g (33.6 mmol) of benzil in ethanol (200 ml), The reaction mixture is stirred under reflux. After 3 h water (200 ml) is added and the reaction mixture is cooled to room temperature, filtered and washed with ethanol to afford the product as a grey-brown solid (yield: 9.89 g (99%)).

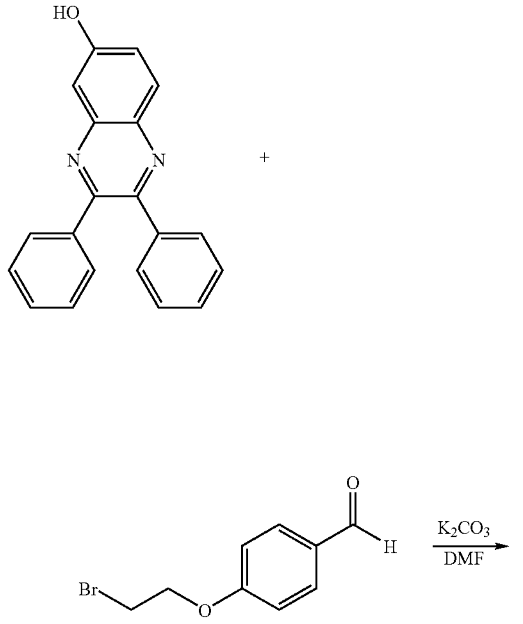

-continued

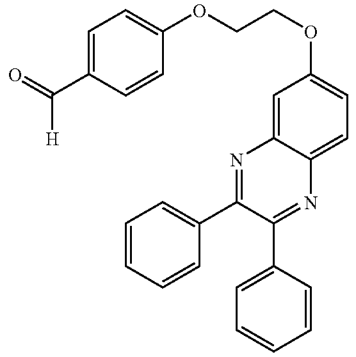

b) 4.14 g (18.1 mmol) 4-(2-bromo-ethoxy)-benzaldehyde, 5.21 g (37.7 mmol) of potassium carbonate and 60 ml dimethylformamide are added to 4.50 g (15.1 mmol) of the product of example 1a. The reaction mixture is stirred under nitrogen at 100° C. After 3.5 h water (60 ml) is added, the mixture is cooled to room temperature and filtered and washed with water to afford the product as a pale brown solid (yield: 6.61 g (98%)).

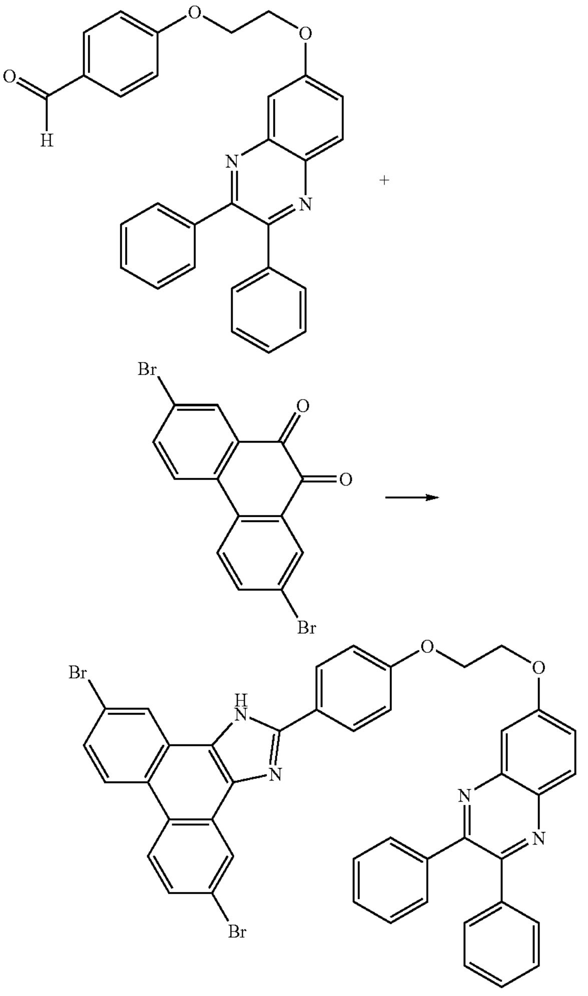

c) 2.31 g (6.31 mmol) 2,7-dibromo-phenanthrene-9,10-dione, 4.86 g (63.1 mmol) of ammonium acetate and 43 ml acetic acid are added to 2.68 g (6.01 mmol) of the product of example 1b. The reaction mixture is stirred under nitrogen at 120° C. After 22 h the mixture is cooled to room temperature, filtered and washed with water to afford the product as a beige solid (yield: 4.81 g (96%).

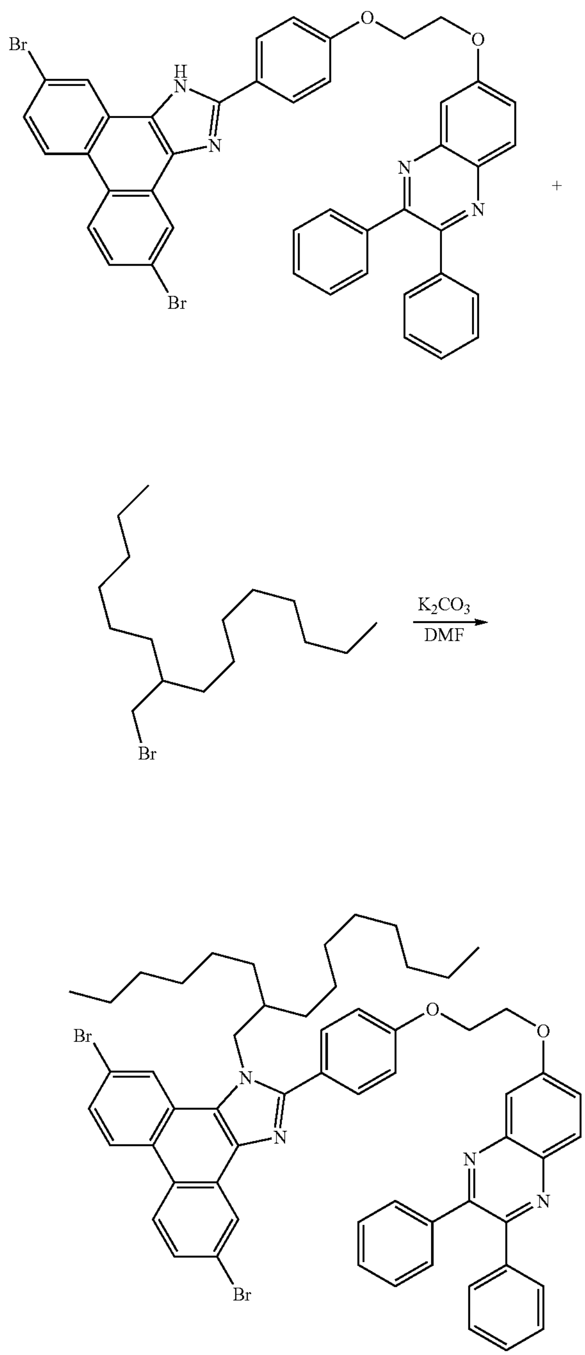

d) 6.06 g (19.8 mmol) 1-bromo-2-hexyldecane, 3.13 g (22.6 mmol) of potassium carbonate and 45 ml dimethylformamide are added to 4.50 g (5.68 mmol) of the product of example 1c. The reaction mixture is stirred under nitrogen at 120° C. After 48 h the mixture is cooled to room temperature, poured onto water and extracted three times with $CH_2Cl_2$. The organic layer is dried over $Na_2SO_4$, filtered and concentrated in vacuo. Purification by flash chromatography (cyclohexane/EtOAc 6:1) affords the product as a pale yellow solid (yield: 3.62 g (63%)).

Example 2

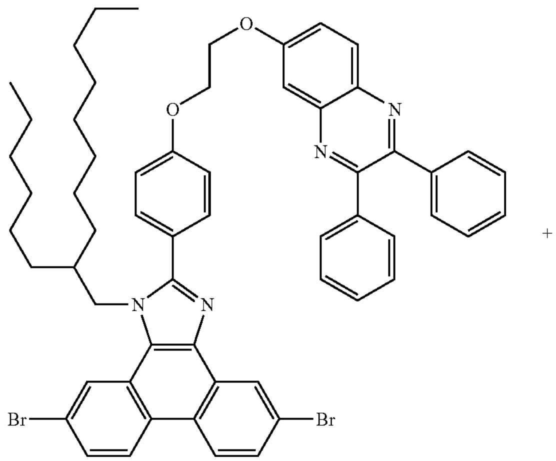

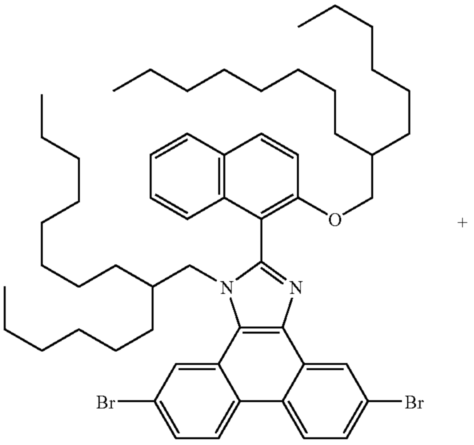

2

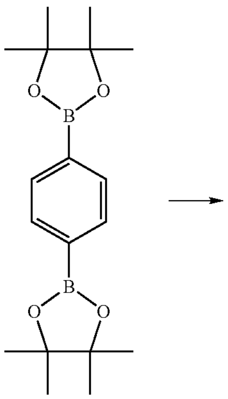

3

-continued

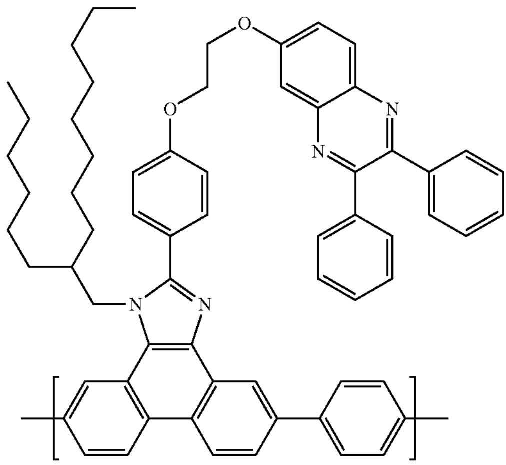

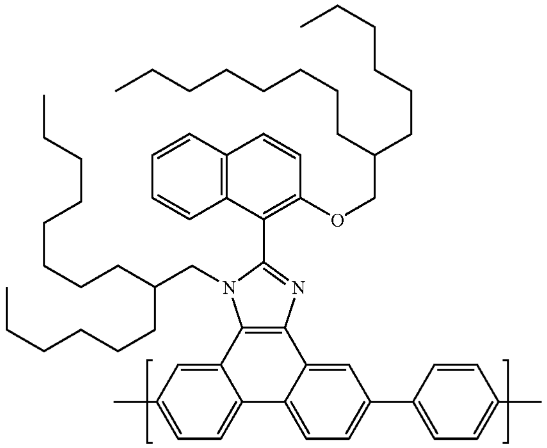

521.5 mg (1.5801 mmol, 1 eq.) of 3 and 321.4 g (0.3216 mmol, 0.2 eq.) of the product of example 1d) and 1.2225 g (1.2641 mmol, 0.8 eq.) of 2 are dissolved in 5 ml toluene and 5 ml dioxane. This mixture is degassed with argon. 38.9 (0.0948 mmol) 2-dicyclohexylphosphino-2',6'-di-methoxy-biphenyl and then 35 mg (0.0158 mmol) palladium(II)acetate are added. A degassed solution of 1.915 g (7.900 mmol) potassium phosphate tribasic monohydrate in 3 ml water is added. The reaction mixture is stirred at 90° C. under an argon atmosphere for 27 h. During the reaction the reaction mixture is diluted with 45 ml toluene. 0.443 g (2.3702 mmol) degassed 4-bromoanisol are added and the reaction mixture is stirred for 17 h. 0.925 g (3.95 mmol) 2-(4-methoxy-phenyl)-4,4,5,5-tetramethyl-1,3,2-dioxaborolane in 3 ml degassed toluene are added. The reaction mixture is stirred for 2 h and after addition of 100 ml 1% sodium cyanide solution for 3 h. The organic phase is separated off and poured into methanol. The polymer is filtered off and washed with methanol. This procedure is repeated once. The polymer is dissolved in tetrahydrofurane (THF), poured into methanol and filtered off. $M_w$ (GPC, polystyrol standard)=348000 g/mol; PD=2.10.

Example 3

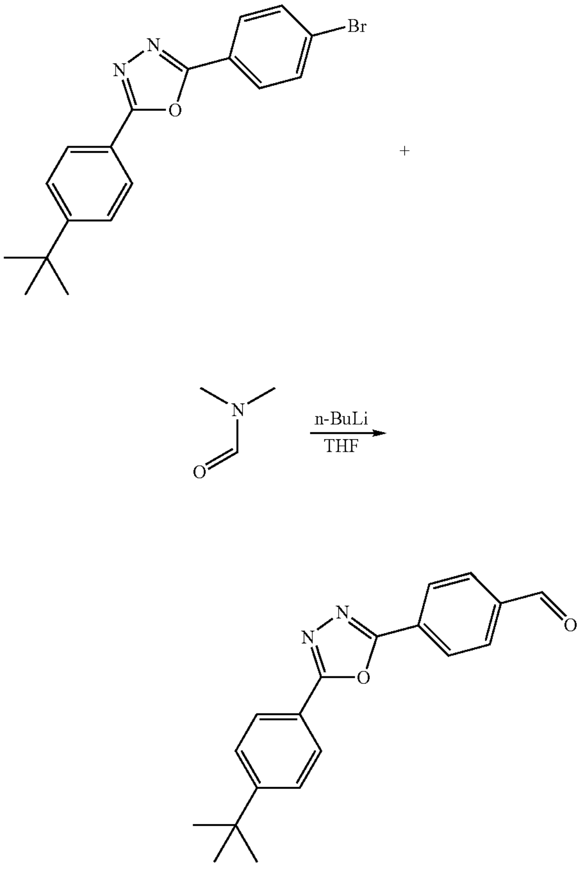

2-(4-Bromo-phenyl)-5-(4-tert-butyl-phenyl)-[1,3,4]oxadiazole can be prepared as described in *Macromolecules* 2002, 35, 3, 850-856.

a) 5.00 g (14 mmol) 2-(4-Bromo-phenyl)-5-(4-tert-butyl-phenyl)-[1,3,4]oxadiazole are dissolved in 230 ml tetrahydrofurane (THF) under argon. The solution is cooled to −78° C. and 5.9 ml (14.7 mmol) of a 2.5 M solution of n-butyl lithium in hexane is added. The reaction mixture is stirred for 10 min. 5.12 g (70.0 mmol) dimethylformamid (DMF) are added. The reaction mixture is warmed to 25° C. Water and dichloromethane are added. The organic phase is separated and dried with magnesium sulphate. The solvent is removed in vacuum. Diethylether is added and the mixture is refluxed. After cooling the mixture to 25° C. the product is filtered off (yield: 2.83 g (66%)).

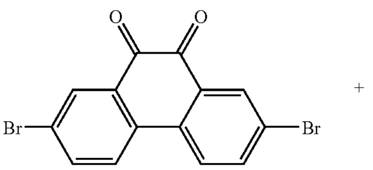

-continued

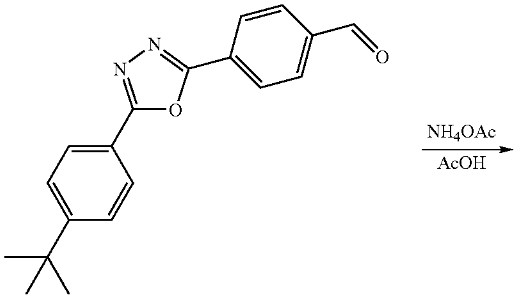

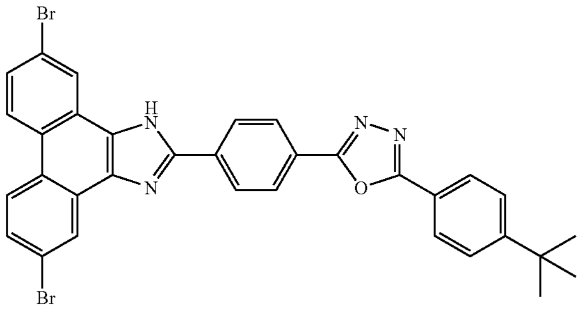

b) To 2.50 g (6.83 mmol) 2,7-Dibromo-phenanthrene-9,10-dione, 2.51 g (8.20 mmol) of the product of example 3a and 2.63 g (34.2 mmol) ammonium acetate, 150 ml acetic acid are added. The reaction mixture is refluxed for 1 h under nitrogen, cooled to 25° C. and the product is filtered off. The product is washed with acetic acid, water, sodium hydrogen carbonate solution and methanol (yield 3.89 g (89%)).

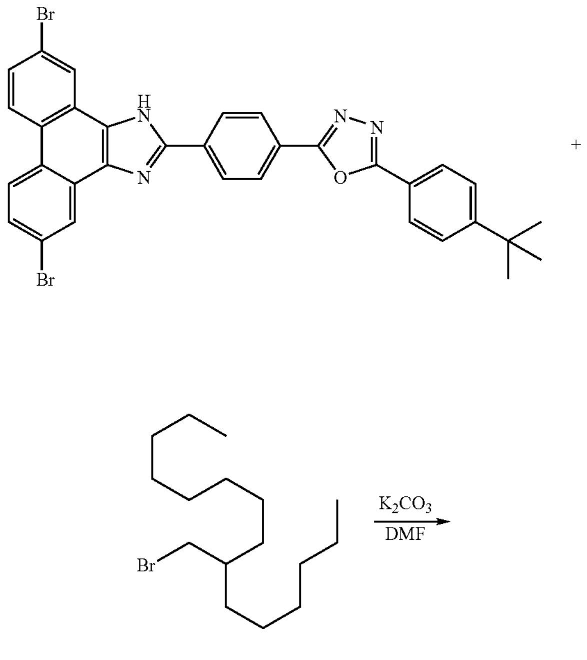

-continued

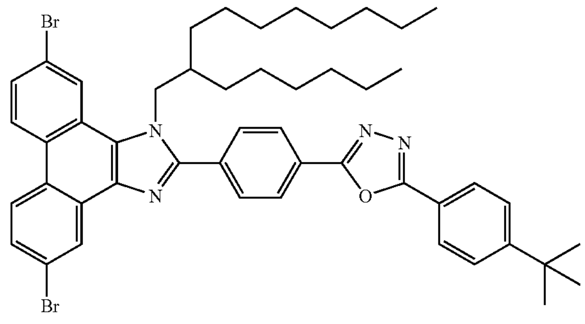

c) 3.90 g (5.98 mmol) of the product of example 3b, 1.65 g (12.0 mmol) potassium carbonate and 1.83 g (5.98 mmol) 7-bromomethyl-pentadecane in 20 ml Dimethylformamid (DMF) are heated 48 h at 120° C. under nitrogen. The reaction mixture is cooled to 25° C., dichloromethane is added and the solution is filtered on silica gel. The solvent is removed in vacuum and cyclohexane is added. The oxazol derivative, a formed side product, is filtered off. The solvent is distilled off (yield: 1.94 g (69%) of the imidazole type product and 0.43 g of the oxazole derivative of formula:

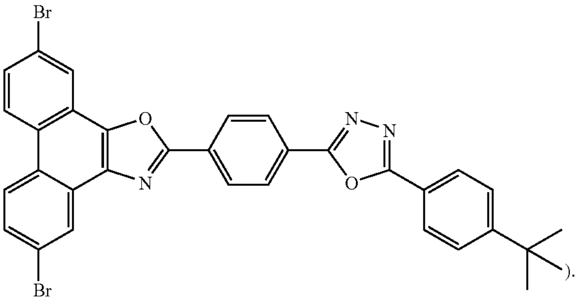

Example 4

Example 2 is repeated, except that instead the product of example 1d the product of example 3c is used.

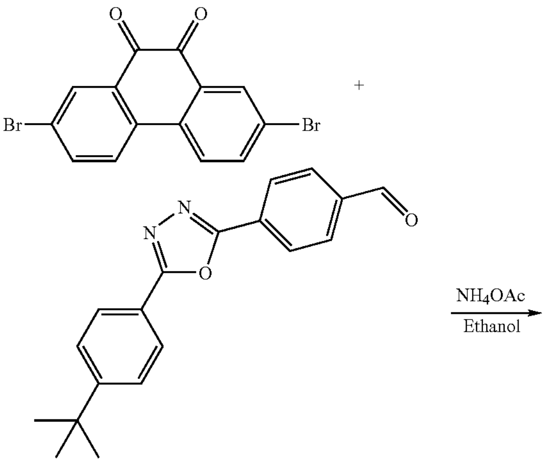

-continued

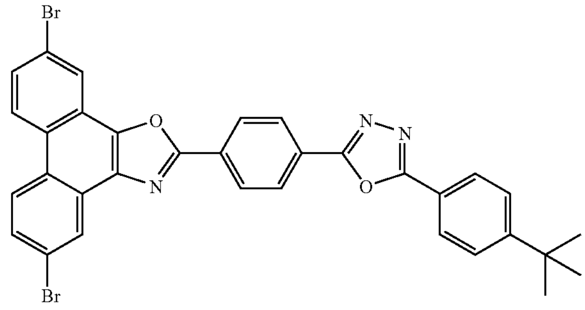

Example 5

To 500 mg (1.37 mmol) 2,7-dibromo-phenanthrene-9,10-dione, 500 mg (1.64 mmol) of the product of example 3a and 530 mg (6.83 mmol) ammonium acetate 40 ml ethanol are added. The reaction mixture is refluxed for 5 h under nitrogen. The reaction mixture is cooled to 25° C. and the product is filtered off and washed with acetic acid, water, sodium hydrogen carbon at solution and methanol (yield: 700 mg (78%)).

Example 6

Example 2 is repeated, except that instead the product of example 1d the product of example 5 is used.

The invention claimed is:

1. A polymer comprising a repeating unit(s) of the formula (X)

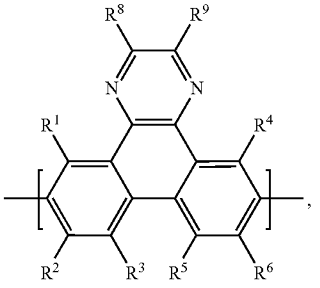

(XI)

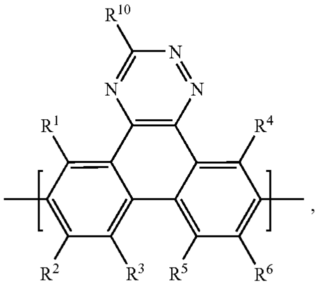

-continued (XII)

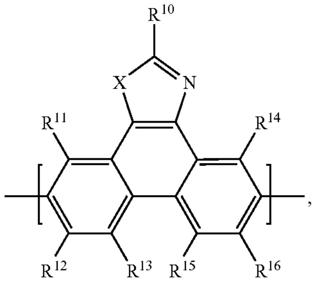

(XVI)

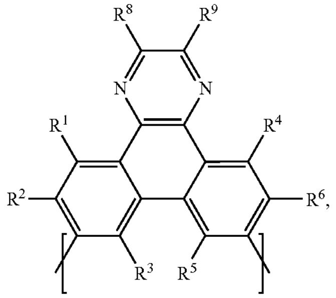

(XVII)

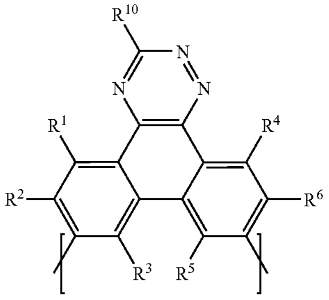

and/or (XVIII)

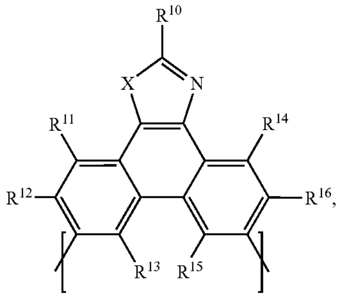

wherein $R^1$ and $R^4$ are independently of each other hydrogen, halogen, $C_1$-$C_{18}$alkyl, $C_1$-$C_{18}$alkyl which is substituted by E and/or interrupted by D, $C_1$-$C_{18}$perfluoroalkyl, $C_2$-$C_{18}$alkenyl, $C_2$-$C_{18}$alkynyl, $C_1$-$C_{18}$alkoxy, $C_1$-$C_{18}$alkoxy which is substituted by E and/or interrupted by D, CN, or —CO—$R^{28}$, $R^2$, $R^3$, $R^5$ and $R^6$ are independently of each other H, halogen, $C_1$-$C_{18}$alkyl, $C_1$-$C_{18}$alkyl which is substituted by E and/or interrupted by D, $C_1$-$C_{18}$perfluoroalkyl, $C_6$-$C_{24}$aryl, $C_6$-$C_{24}$aryl which is substituted by G, $C_2$-$C_{20}$heteroaryl, $C_2$-$C_{20}$heteroaryl which is substituted by G, $C_2$-$C_{18}$alkenyl, $C_2$-$C_{18}$alkynyl, $C_1$-$C_{18}$alkoxy, $C_1$-$C_{18}$alkoxy which is substituted by E and/or interrupted by D, $C_7$-$C_{25}$aralkyl, CN, or —CO—$R^{28}$, $R^8$ and $R^9$ are independently of each other H, $C_1$-$C_{18}$alkyl, $C_1$-$C_{18}$alkyl which is substituted by E and/or interrupted by D, $C_1$-$C_{18}$perfluoroalkyl, $C_6$-$C_{24}$aryl, $C_6$-$C_{24}$aryl which is substituted by G, $C_2$-$C_{20}$heteroaryl, $C_2$-$C_{20}$heteroaryl which is substituted by G, $C_2$-$C_{18}$alkenyl, $C_2$-$C_{18}$alkynyl, $C_1$-$C_{18}$alkoxy, $C_1$-$C_{18}$alkoxy which is substituted by E and/or interrupted by D, $C_7$-$C_{25}$aralkyl, CN, or —CO—$R^{28}$, or $R^8$ and $R^9$ together form a group

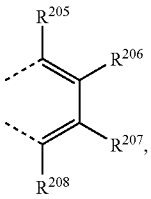,

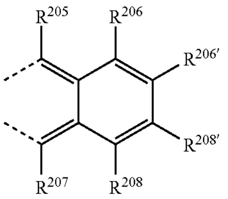 or

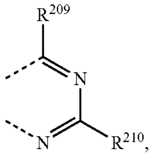, wherein $R^{206'}$, $R^{208'}$, $R^{205}$, $R^{206}$, $R^{207}$, $R^{208}$, $R^{209}$ and $R^{210}$ are independently of each other H, $C_1$-$C_{18}$alkyl, $C_1$-$C_{18}$alkyl which is substituted by E and/or interrupted by D, $C_1$-$C_{18}$alkoxy, or $C_1$-$C_{18}$alkoxy which is substituted by E and/or interrupted by D, $C_1$-$C_{18}$perfluoroalkyl, $C_6$-$C_{24}$aryl, $C_6$-$C_{24}$aryl which is substituted by G, $C_2$-$C_{20}$heteroaryl, $C_2$-$C_{20}$heteroaryl which is substituted by G, $C_2$-$C_{18}$alkenyl, $C_2$-$C_{18}$alkynyl, $C_7$-$C_{25}$aralkyl, CN, or —CO—$R^{28}$, $R^{10}$ is H, $C_1$-$C_{18}$alkyl, $C_1$-$C_{18}$alkyl which is substituted by E and/or interrupted by D, $C_1$-$C_{18}$perfluoroalkyl, $C_6$-$C_{24}$aryl, $C_6$-$C_{24}$aryl which is substituted by G, $C_2$-$C_{20}$heteroaryl, $C_2$-$C_{20}$heteroaryl which is substituted by G, $C_2$-$C_{18}$alkenyl, $C_2$-$C_{18}$alkynyl, $C_1$-$C_{18}$alkoxy, $C_1$-$C_{18}$alkoxy which is substituted by E and/or interrupted by D, $C_7$-$C_{25}$aralkyl, or —CO—$R^{28}$, $R^{11}$ and $R^{14}$ are independently of each other hydrogen, halogen, $C_1$-$C_{18}$alkyl, $C_1$-$C_{18}$alkyl which is substituted by E and/or interrupted by D, $C_1$-$C_{18}$perfluoroalkyl, $C_2$-$C_{18}$alkenyl, $C_2$-$C_{18}$alkynyl, $C_1$-$C_{18}$alkoxy, $C_1$-$C_{18}$alkoxy which is substituted by E and/or interrupted by D, CN, or —CO—$R^{28}$, $R^{12}$, $R^{13}$, $R^{15}$ and $R^{16}$ are independently of each other H, halogen, $C_1$-$C_{18}$alkyl, $C_1$-$C_{18}$alkyl which is substituted by E and/or interrupted by D, $C_1$-$C_{18}$perfluoroalkyl, $C_6$-$C_{24}$aryl, $C_6$-$C_{24}$aryl which is substituted by G, $C_2$-$C_{20}$heteroaryl, $C_2$-$C_{20}$heteroaryl which is substituted by G, $C_2$-$C_{18}$alkenyl, $C_2$-$C_{18}$alkynyl, $C_1$-$C_{18}$alkoxy, $C_1$-$C_{18}$alkoxy which is substituted by E and/or interrupted by D, $C_7$-$C_{25}$aralkyl, CN or —CO—$R^{28}$, X is O, S, or $NR^{17}$, wherein $R^{17}$ is H; $C_6$-$C_{18}$aryl; $C_2$-$C_{20}$heteroaryl; $C_6$-$C_{18}$aryl, or $C_2$-$C_{20}$heteroaryl, which are substituted by $C_1$-$C_{18}$alkyl, $C_1$-$C_{18}$perfluoroalkyl, or $C_1$-$C_{18}$alkoxy; $C_1$-$C_{18}$alkyl; or $C_1$-$C_{18}$alkyl which is interrupted by —O—;

or two substituents $R^1$ and $R^2$, $R^4$ and $R^6$, $R^{11}$ and $R^{12}$, and/or $R^{14}$ and $R^{16}$, $R^2$ and $R^3$, $R^5$ and $R^6$, $R^{12}$ and $R^{13}$ and/or $R^{15}$ and $R^{16}$, which are adjacent to each other, together form a group

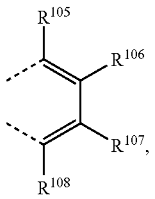, or

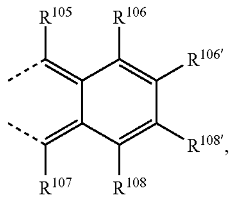, or two substituents $R^{15}$ and $R^{13}$, and/or $R^5$ and $R^3$, which are adjacent to each other, together form a group

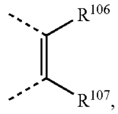, or

, wherein $X^3$ is O, S, $C(R^{119})(R^{120})$, or $NR^{17}$, wherein $R^{17}$ is as defined above, $R^{105}$, $R^{106}$, $R^{107}$, $R^{108}$, $R^{106'}$ and $R^{108'}$ are independently of each other H, $C_1$-$C_{18}$alkyl, $C_1$-$C_{18}$alkyl which is substituted by E and/or interrupted by D, $C_1$-$C_{18}$alkoxy, or $C_1$-$C_{18}$alkoxy which is substituted by E and/or interrupted by D, $R^{119}$ and $R^{120}$ together form a group of formula $=CR^{121}R^{122}$, wherein $R^{121}$ and $R^{122}$ are independently of each other H, $C_1$-$C_{18}$alkyl, $C_1$-$C_{18}$alkyl which is substituted by E and/or interrupted by D, $C_6$-$C_{24}$aryl, $C_6$-$C_{24}$aryl which is substituted by G, or $C_2$-$C_{20}$heteroaryl, or $C_2$-$C_{20}$heteroaryl which is substituted by G, or $R^{119}$ and $R^{120}$ together form a five or six membered ring, which optionally can be substituted by $C_1$-$C_{18}$alkyl, $C_1$-$C_{18}$alkyl which is substituted by E and/or interrupted by D, $C_6$-$C_{24}$aryl, $C_6$-$C_{24}$aryl which is substituted by G, $C_2$-$C_{20}$heteroaryl, $C_2$-$C_{20}$heteroaryl which is substituted by G, $C_2$-$C_{18}$alkenyl, $C_2$-$C_{18}$alkynyl, $C_1$-$C_{18}$alkoxy, $C_1$-$C_{18}$alkoxy which is substituted by E and/or interrupted by D, $C_7$-$C_{25}$aralkyl, or —C(=O)—$R^{127}$, and $R^{127}$ is H; $C_6$-$C_{18}$aryl; $C_6$-$C_{18}$aryl which is substituted by $C_1$-$C_{18}$alkyl, or $C_1$-$C_{18}$alkoxy; $C_1$-$C_{18}$alkyl; or $C_1$-$C_{18}$alkyl which is interrupted by —O—, D is —CO—; —COO—; —S—; —SO—; —$SO_2$—; —O—; —$NR^{25}$—; —$SiR^{30}R^{31}$—; —$POR^{32}$—; —$CR^{23}$=$CR^{24}$—; or —C≡C—; and E is —$OR^{29}$; —$SR^{29}$; —$NR^{25}R^{26}$; —$COR^{28}$; —$COOR^{27}$; —$CONR^{25}R^{26}$; —CN; or halogen; G is E, $C_1$-$C_{18}$alkyl, $C_1$-$C_{18}$alkyl which is interrupted by D, $C_1$-$C_{18}$perfluoroalkyl, $C_1$-$C_{18}$alkoxy, or $C_1$-$C_{18}$alkoxy which is substituted by E and/or interrupted by D, wherein $R^{23}$, $R^{24}$, $R^{25}$ and $R^{26}$ are independently of each other H; $C_6$-$C_{18}$aryl; $C_6$-$C_{18}$aryl which is substituted by $C_1$-$C_{18}$alkyl, or $C_1$-$C_{18}$alkoxy; $C_1$-$C_{18}$alkyl; or $C_1$-$C_{18}$alkyl which is interrupted by —O—; or $R^{25}$ and $R^{26}$ together form a five or six membered ring, $R^{27}$ and $R^{28}$ are independently of each other H; $C_6$-$C_{18}$aryl; $C_6$-$C_{18}$aryl which is substituted by $C_1$-$C_{18}$alkyl, or $C_1$-$C_{18}$alkoxy; $C_1$-$C_{18}$alkyl; or $C_1$-$C_{18}$alkyl which is interrupted by —O—, $R^{29}$ is H; $C_6$-$C_{18}$aryl; $C_6$-$C_{18}$aryl, which is substituted by $C_1$-$C_{18}$alkyl, or $C_1$-$C_{18}$alkoxy; $C_1$-$C_{18}$alkyl; or $C_1$-$C_{18}$alkyl which is interrupted by —O—, $R^{30}$ and $R^{31}$ are independently of each other $C_1$-$C_{18}$alkyl, $C_6$-$C_{18}$aryl, or $C_6$-$C_{18}$aryl, which is substituted by $C_1$-$C_{18}$alkyl, and $R^{32}$ is $C_1$-$C_{18}$alkyl, $C_6$-$C_{18}$aryl, or $C_6$-$C_{18}$aryl, which is substituted by $C_1$-$C_{18}$alkyl, or $R^1$, $R^2$, $R^3$, $R^4$, $R^5$, $R^6$, $R^{11}$, $R^{12}$, $R^{13}$, $R^{14}$, $R^{15}$, $R^{16}$, $R^{206'}$, $R^{208'}$, $R^{205}$, $R^{206}$, $R^{207}$, $R^{208}$, $R^{209}$, $R^{210}$, $R^{105}$, $R^{106}$, $R^{107}$, $R^{108}$, $R^{106'}$, $R^{108'}$, $R^8$, $R^9$, $R^{10}$, and/or $R^{17}$ are a group -$(Sp)_{x1}$-HEI, with the proviso that at least one of the substituents $R^1$, $R^2$, $R^3$, $R^4$, $R^5$, $R^6$, $R^{11}$, $R^{12}$, $R^{13}$, $R^{14}$, $R^{15}$, $R^{16}$, $R^{206'}$, $R^{208'}$, $R^{205}$, $R^{206}$, $R^{207}$, $R^{208}$, $R^{209}$, $R^{210}$, $R^{105}$, $R^{106}$, $R^{107}$, $R^{108}$, $R^{106'}$, $R^{108'}$, $R^8$, $R^9$, $R^{10}$, and/or $R^{17}$is a group -$(SP)_{x1}$-HEI;

wherein Sp is a spacer unit,

HEI is a group ($HEI^I$), which increases the hole-injection and/or hole-transport properties of the polymers; or a group ($HEI^{II}$), which increases the electron-injection and/or electron-transport properties of the polymers, or a group ($HEI^{III}$), which increases the hole-injection and/or hole-transport properties of the polymers and the electron-injection and/or electron-transport properties of the polymers, $HEI^I$ is a group of formula (IIa)

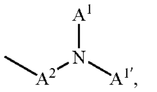

(IIb)

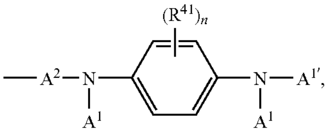

(IIc)

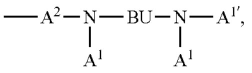

wherein BU is a bridging unit selected from

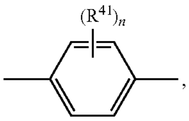

,

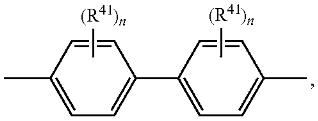

, or

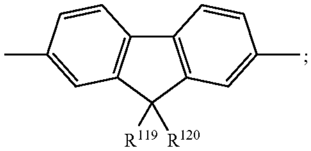

;

(IId)

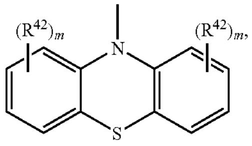

(IIe)

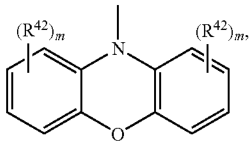

-continued (IIf)

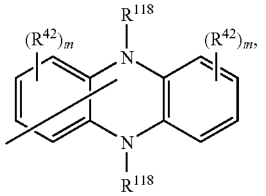

(IIg)

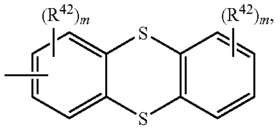

(IIh)

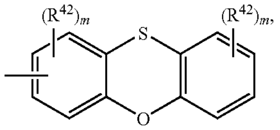

(IIi)

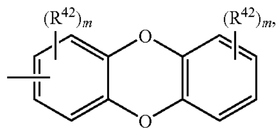

(IIj)

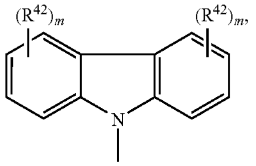

(IIk)

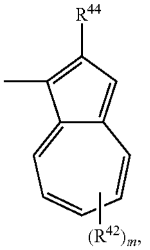

or (IIk)

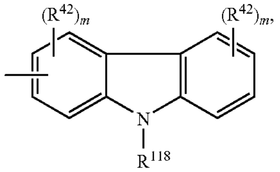

wherein $R^{41}$ can be the same or different at each occurence and is Cl, F, CN, $N(R^{45})_2$, a $C_1$-$C_{25}$alkyl group, a $C_4$-$C_{18}$cycloalkyl group, a $C_1$-$C_{25}$alkoxy group, in which one or more carbon atoms which are not in neighbourhood to each other could be replaced by —$NR^{45}$—, —O—, —S—, —C(═O)—O—, or —O—C(═O)—O—, and/or wherein one or more hydrogen atoms can be replaced by F, a $C_6$-$C_{24}$aryl group, or a $C_6$-$C_{24}$aryloxy group, wherein one or more carbon atoms can be replaced by O, S, or N, and/or which can be substituted by one or more non-aromatic groups $R^{41}$, or two or more groups $R^{41}$ form a ring system;

$R^{42}$ can be the same or different at each occurence and is CN, a $C_1$-$C_{25}$alkyl group, a $C_4$-$C_{18}$cycloalkyl group, a $C_1$-$C_{25}$alkoxy group, in which one or more carbon atoms which are not in neighbourhood to each other could be replaced by —$NR^{45}$—, —O—, —S—, —C(═O)—O—, or —O—C(═O)—O—, and/or wherein one or more hydrogen atoms can be replaced b F, a $C_6$-$C_{24}$aryl group, or a $C_6$-$C_{24}$aryloxy group, wherein one or more carbon atoms can be replaced by O, S, or N, and/or which can be substituted by one or more non-aromatic groups $R^{41}$, or two or more groups $R^{42}$ form a ring system;

$R^{44}$ can be the same or different at each occurence and are a hydrogen atom, a $C_1$-$C_{25}$alkyl group, a $C_4$-$C_{18}$cycloalkyl group, $C_1$-$C_{25}$alkoxy group in which one or more carbon atoms which are not in neighbourhood to each other could be replaced by —$NR^{45}$—, —O—, —S—, —C(═O)—O—, or, —O—C(═O)—O—, and/or wherein one or more hydrogen atoms can be replaced by F, a $C_6$-$C_{24}$aryl group, or a $C_6$-$C_{24}$aryloxy group, wherein one or more carbon atoms can be replaced by O, S, or N, and/or which can be substituted by one or more non-aromatic groups $R^{41}$, or CN, or two or more groups $R^{44}$, which are in neighbourhood to each other, form a ring;

$R^{118}$ is H, a $C_1$-$C_{25}$alkyl group, a $C_1$-$C_{25}$alkoxy group, a $C_4$-$C_{18}$cycloalkyl group, a $C_1$-$C_{25}$alkoxy group, in which one or more carbon atoms which are not in neighbourhood to each other could be replaced by —$NR^{45}$—, —O—, —S—, —C(═O)—O—, or, —O—C(═O)—O—, and/or wherein one or more hydrogen atoms can be replaced b F, a $C_6$-$C_{24}$aryl group, or a $C_6$-$C_{24}$aryloxy group, wherein one or more carbon atoms can be replaced by O, S, or N, and/or which can be substituted by one or more non-aromatic groups $R^{41}$;

m can be the same or different at each occurence and is 0, 1, 2, or 3;

n can be the same or different at each occurence and is 0, 1, 2, or 3;

$A^1$ and $A^{1'}$ are independently of each other

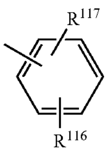,
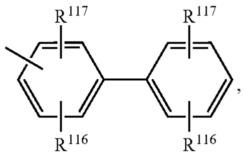,
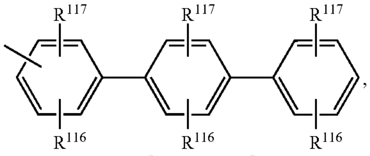,
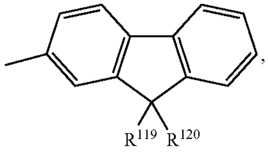,
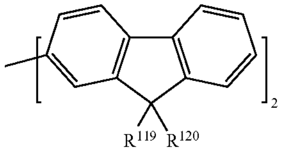, 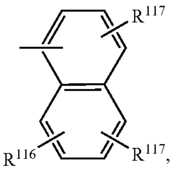

-continued

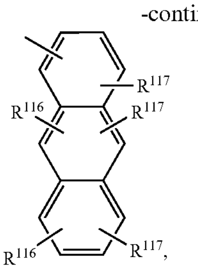
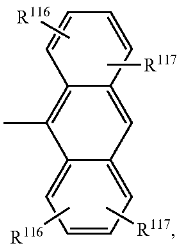
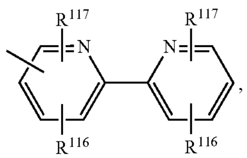,
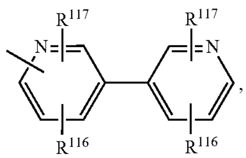,
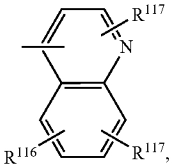
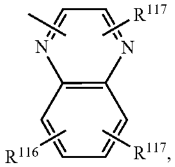
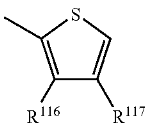,
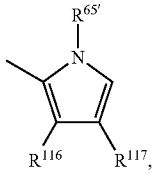 or 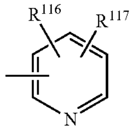, $A^2$ is

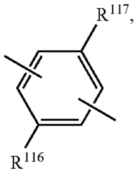
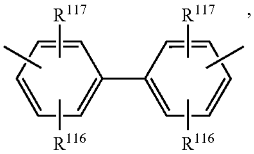,
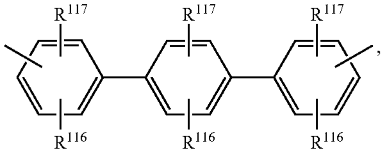,
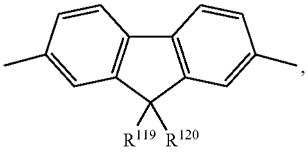,
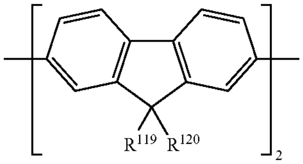;
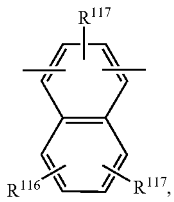

-continued

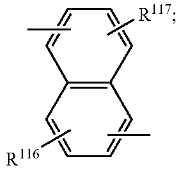

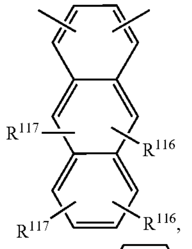

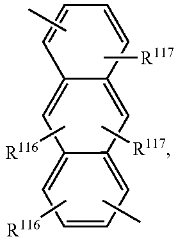

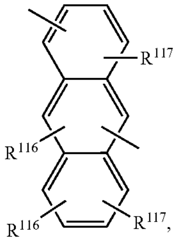

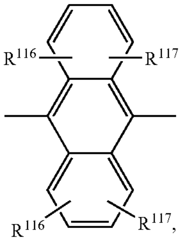

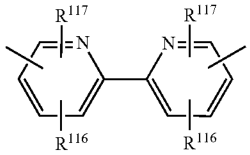

,

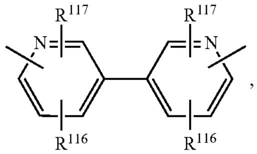

,

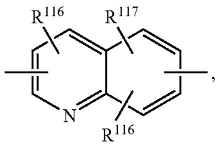

,

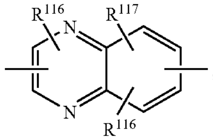

,

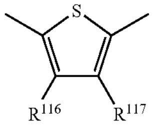

,

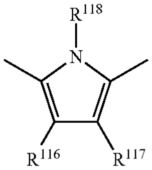

, or

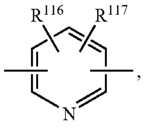

or $A^1$ and $A^{1'}$ together with the nitrogen atom to which they are bonded form a heteroaromatic ring, or ring system, or $A^1$ and $A^2$ together with the nitrogen atom to which they are bonded form a heteroaromatic ring, or ring system, wherein $R^{116}$ and $R^{117}$ are independently of each other H, halogen, —CN, $C_1$-$C_{18}$alkyl, $C_1$-$C_{18}$alkyl which is substituted by E and/or interrupted by D, $C_6$-$C_{24}$aryl, $C_6$-$C_{24}$aryl which is substituted by G, $C_2$-$C_{20}$heteroaryl, $C_2$-$C_{20}$heteroaryl which is substituted by G, $C_2$-$C_{18}$alkynyl, $C_1$-$C_{18}$alkoxy, $C_1$-$C_{18}$alkoxy which is substituted by E and/or interrupted by D, $C_7$-$C_{25}$aralkyl, —C(═O)—$R^{127}$, —C(═O)O$R^{127}$, or —C(═O)N$R^{127}R^{126}$, $R^{119}$ and $R^{120}$ are independently of each other $C_1$-$C_{18}$alkyl, $C_1$-$C_{18}$alkyl which is substituted by E and/or interrupted by D, $C_6$-$C_{24}$aryl, $C_6$-$C_{24}$aryl which is substituted by G, $C_2$-$C_{20}$heteroaryl, $C_2$-$C_{20}$heteroaryl which is substituted by G, $C_2$-$C_{18}$alkenyl, $C_2$-$C_{18}$alkynyl, $C_1$-$C_{18}$alkoxy, $C_1$-$C_{18}$alkoxy which is substituted b E and/or interrupted by D, or $C_7$-$C_{25}$aralkyl, or $R^{119}$ and $R^{120}$ together form a group of formula ═C$R^{121}R^{122}$, wherein $R^{121}$ and $R^{122}$ are independently of each other H, $C_1$-$C_{18}$alkyl, $C_1$-$C_{18}$alkyl which is substituted by E and/or interrupted by D, $C_6$-$C_{24}$aryl, $C_6$-$C_{24}$aryl which is substituted by G, or $C_2$-$C_{20}$heteroaryl, or, $C_2$-$C_{20}$heteroaryl which is substituted by G, or $R^{119}$ and $R^{120}$ together form a five or six membered ring, which optionally can be substituted by $C_1$-$C_{18}$alkyl, $C_1$-$C_{18}$alkyl which is substituted by E and/or interrupted by D, $C_6$-$C_{24}$aryl, $C_6$-$C_{24}$aryl which is substituted by G, $C_2$-$C_{20}$heteroaryl, $C_2$-$C_{20}$heteroaryl which is substituted by G, $C_2$-$C_{18}$alkenyl, $C_2$-$C_{18}$alknyl, $C_1$-$C_{18}$alkoxy, $C_1$-$C_{18}$alkoxy which is substituted by E and/or interrupted by D, $C_7$-$C_{25}$aralkyl, or —C(═O)—$R^{127}$, and $R^{126}$ and $R^{127}$ are independently of each other H; $C_6$-$C_{18}$aryl; $C_6$-$C_{18}$aryl which is substituted by $C_1$-$C_{18}$alkyl, or $C_1$-$C_{18}$alkoxy; $C_1$-$C_{18}$alkyl; or $C_1$-$C_{18}$alkyl which is interrupted by —O—, D is —CO—, —COO—, —S—, —SO—, —$SO_2$—, —O—, —N$R^{65}$—, —Si$R^{70}R^{71}$—, —PO$R^{72}$—, —C$R^{63}$═C$R^{64}$—, or —C≡C—, and E is —O$R^{69}$, —S$R^{69}$, —N$R^{65}R^{66}$, —CO$R^{68}$, —COO$R^{67}$, —CON$R^{65}R^{66}$, —CN, or halogen, G is E, or $C_1$-$C_{18}$alkyl, $R^{63}$, $R^{64}$, $R^{65}$ and $R^{66}$ are independently of each other H; $C_6$-$C_{18}$aryl; $C_6$-$C_{18}$aryl which is substituted by $C_1$-$C_{18}$alkyl, $C_1$-$C_{18}$alkoxy, $C_1$-$C_{18}$alkyl; or $C_1$-$C_{18}$alkyl which is interrupted by —O—; or $R^{65}$ and $R^{66}$ together form a five or six membered ring, $R^{65'}$ is $R^{65}$, $R^{67}$ and $R^{68}$ are independently of each other H; $C_6$-$C_{18}$aryl; $C_6$-$C_{18}$aryl which is substituted by $C_1$-$C_{18}$alkyl, or $C_1$-$C_{18}$alkoxy; $C_1$-$C_{18}$alkyl; or $C_1$-$C_{18}$alkyl which is interrupted by —O—, $R^{69}$ is H; $C_6$-$C_{18}$aryl; $C_6$-$C_{18}$aryl, which is substituted by $C_1$-$C_{18}$alkyl, $C_1$-$C_{18}$alkoxy; $C_1$-$C_{18}$alkyl; or $C_1$-$C_{18}$alkyl which is interrupted by —O—, $R^{70}$ and $R^{71}$ are independently of each other $C_1$-$C_{18}$alkyl, $C_6$-$C_{18}$aryl or $C_6$-$C_{18}$aryl, which is substituted by $C_1$-$C_{18}$alkyl, and $R^{72}$ is $C_1$-$C_{18}$alkyl, $C_6$-$C_{18}$aryl, or $C_6$-$C_{18}$aryl, which is substituted by $C_1$-$C_{18}$alkyl;

$HEI^{II}$ is a group of formula (IIIa)

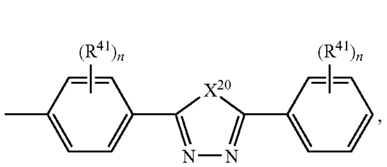

(IIIb)

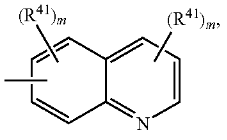

(IIIc)

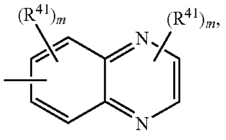

-continued
(IIId)
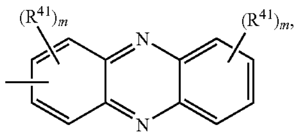
(IIIe)
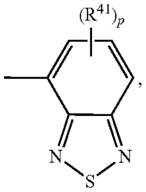
(IIIf)
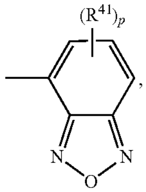
(IIIg)
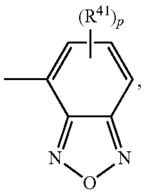
(IIIh)
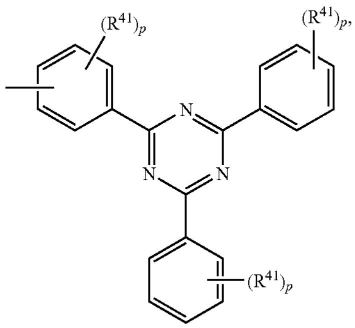
(IIIi)
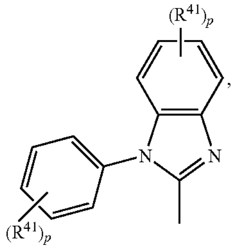
(IIIj)
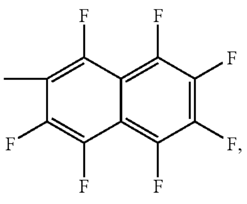
-continued
(IIIk)
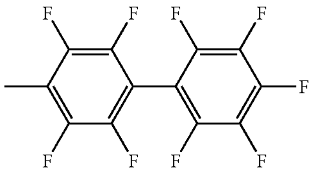
or
(IIIl)
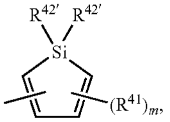
wherein $X^{20}$ is O, S, or $NR^{118}$; $R^{118}$, $R^{41}$ and m and n are as defined above and p is 0, 1, or 2 $R^{42'}$ is H, or $R^{42}$; and $HEI^{III}$ is a group of formula
(IVa)
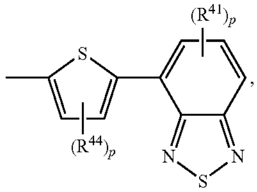
(IVb)
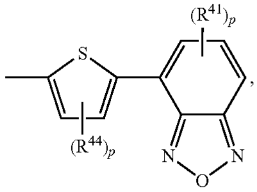
(IVc)
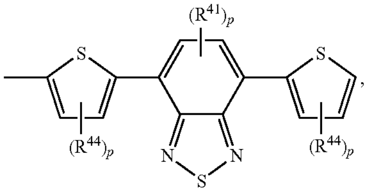
(IVd)
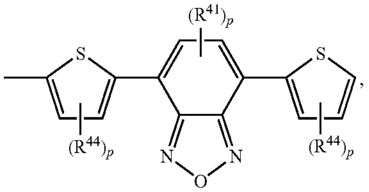
(IVe)
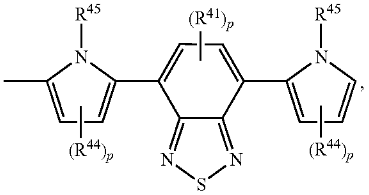

-continued
(IVf)
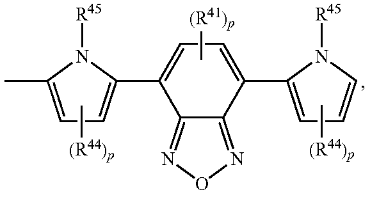
(IVg)
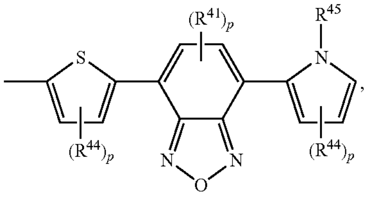
(IVh)
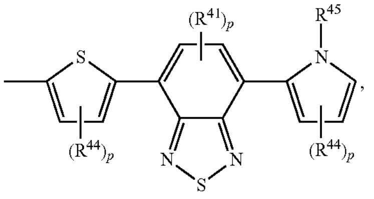
(IVi)
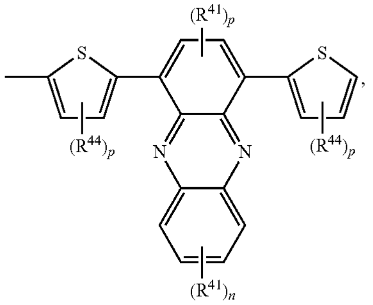
(IVj)
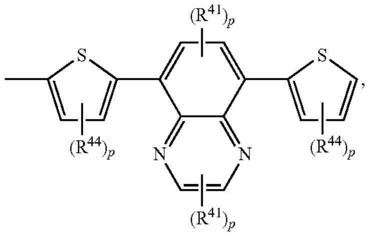
(IVk)
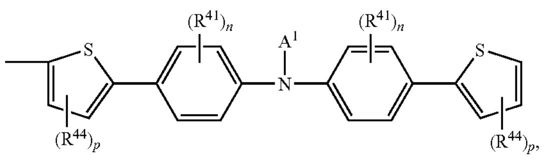
(IVl)
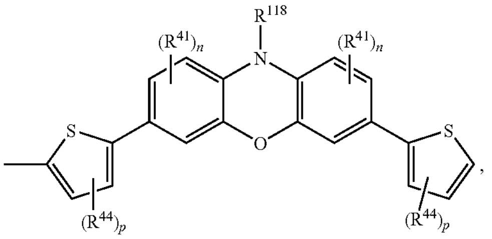
-continued
(IVm)
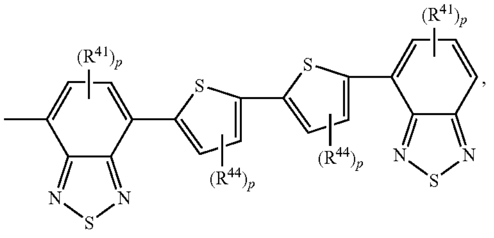
(IVn)
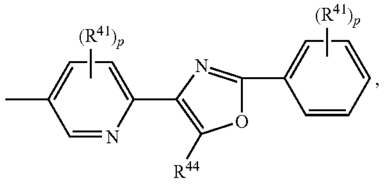
(IVo)
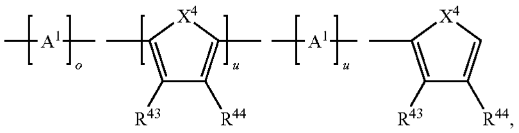
(IVp)
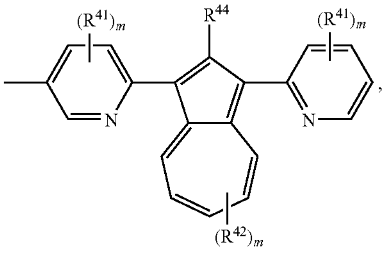
(IVq)
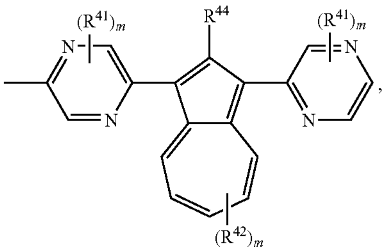
(IVr)
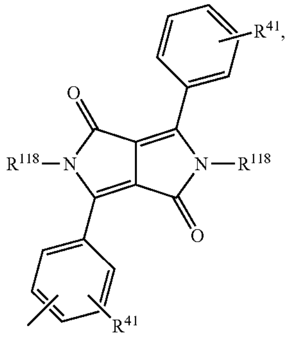
or -continued (IVs)

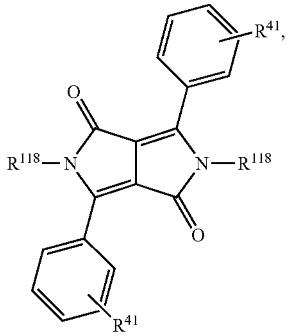

wherein $X^4$ is O, S, or $NR^{45}$, $R^{43}$ is a hydrogen atom a $C_1$-$C_{25}$alkyl group, a $C_4$-$C_{18}$cycloalkyl group, a $C_1$-$C_{25}$alkoxy group, in which one or more carbon atoms which are not in neighbourhood to each other could be replaced by —$NR^{45}$—, —O—, —S—, —C(═O)—O—, or, —O—C(═O)—O—, and/or wherein one or more hydrogen atoms can replaced by F, a $C_6$-$C_{24}$aryl group, a $C_6$-$C_{24}$aryloxy group, wherein one or more carbon atoms can be replaced by O, S, or N, and/or which can be substituted by one or more non-aromatic groups $R^{41}$, or CN, or two or more groups $R^{43}$ and/or $R^{44}$, which are in neighbourhood to each other, form a ring;

o is 1, 2, or 3, u is 1, 2, 3, or 4, $A^1$, $R^{41}$, $R^{42}$, $R^{44}$, $R^{45}$, $R^{118}$, m, n and p are as defined above; and $R^{45}$ is H, a $C_1$-$C_{25}$alkyl group, a $C_4$-$C_{18}$cycloalkyl group, in which one or more carbon atoms which are not in neighbourhood to each other could be replaced by —$NR^{45'}$—, —O—, —S—, —C(═O)—O—, or, —O—C(═O)—O—, and/or wherein one or more hydrogen atoms can be replaced b F, a $C_6$-$C_{24}$aryl group, or a $C_6$-$C_{24}$aryloxy group, wherein one or more carbon atoms can be replaced by O, S, or N, and/or which can be substituted by one or more non-aromatic groups $R^{41}$;

$R^{45'}$ is H, a $C_1$-$C_{25}$alkyl group, or a $C_4$-$C_{18}$cycloalkyl group;

x1 is 0, or 1, with the proviso that the polymers

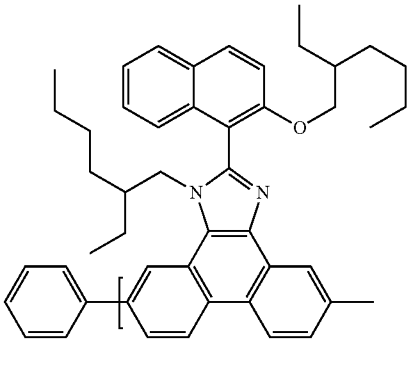

-continued

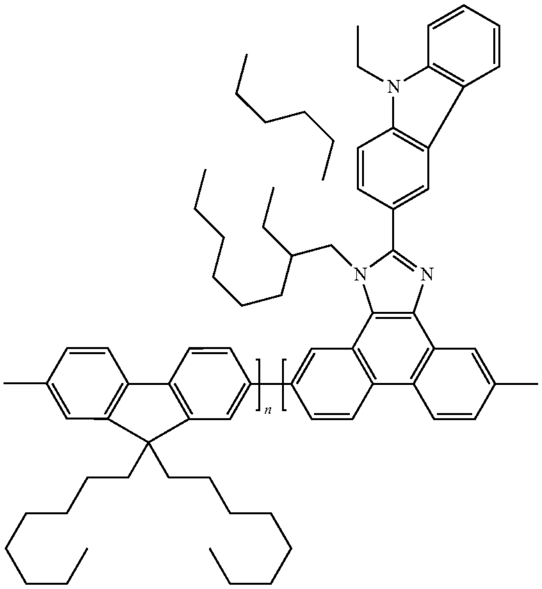

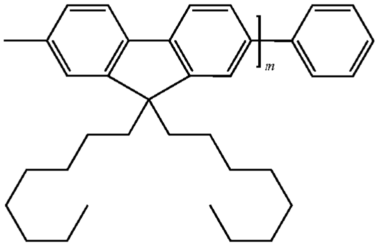

with a $M_w$ = 84 101, PD = 3.38,

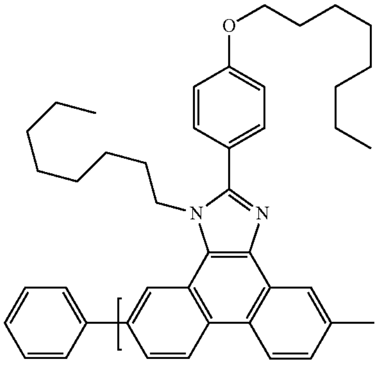

-continued
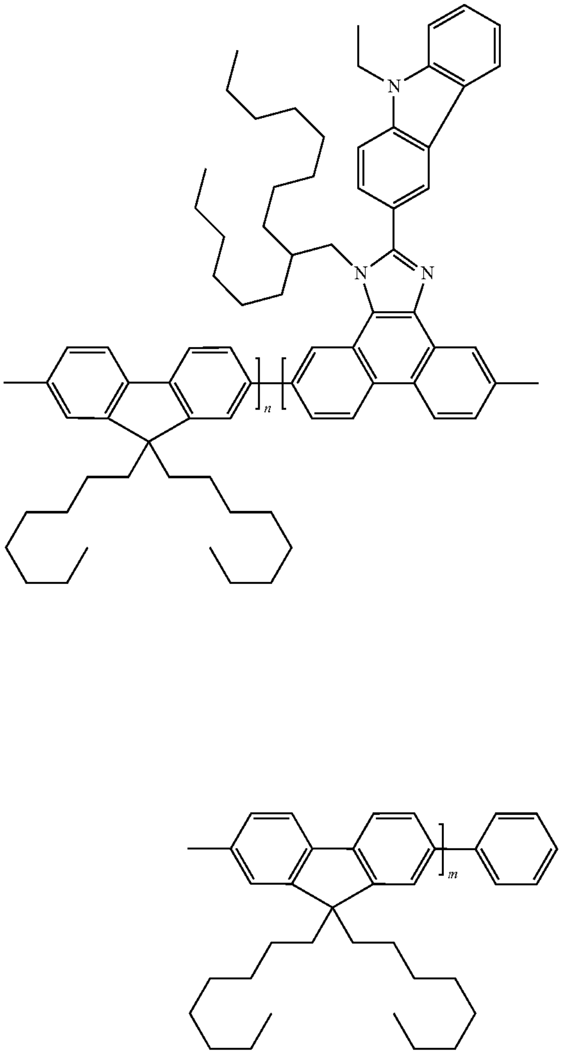
with a $M_w$ = 49 177, PD = 3.10
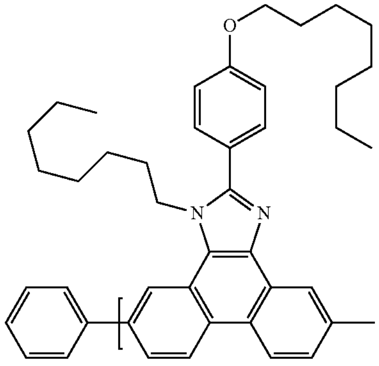
-continued
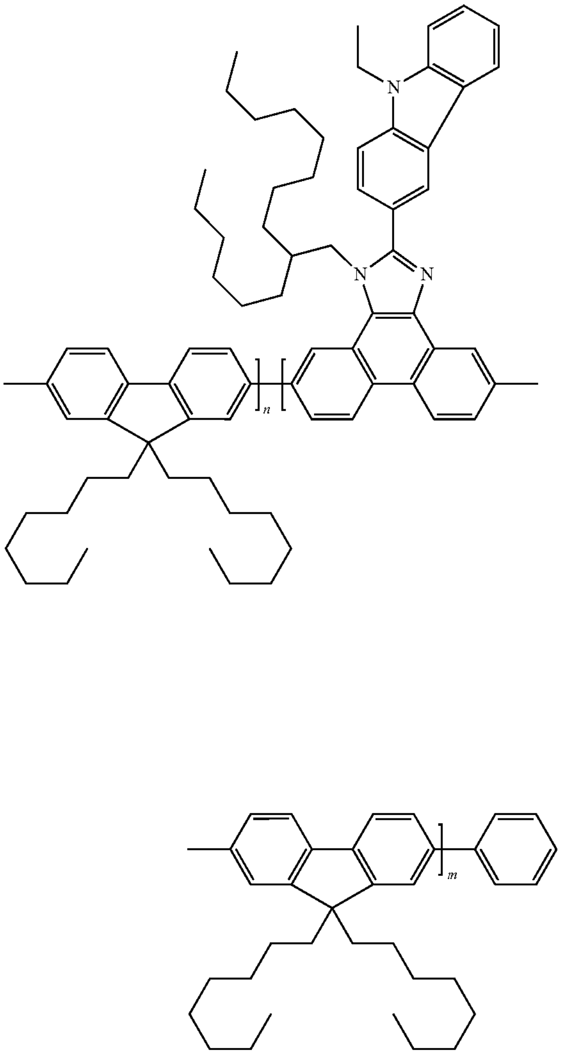
with a $M_w$ = 77 760, PD = 3.41.
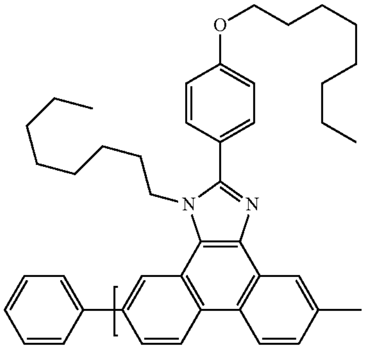

-continued

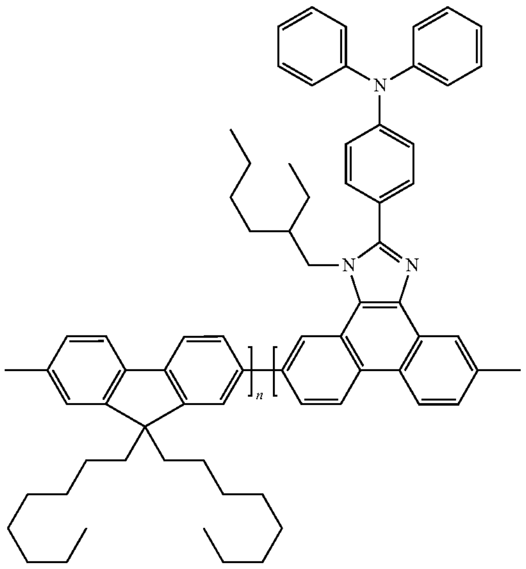

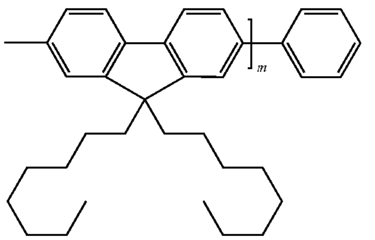

and with a $M_w$ = 143 595, PD = 3.42.

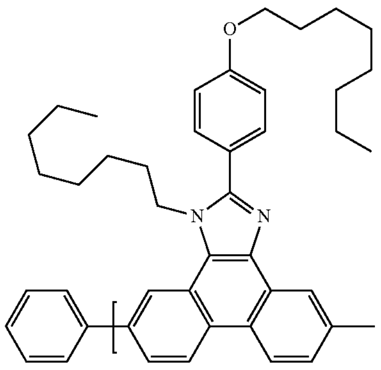

-continued

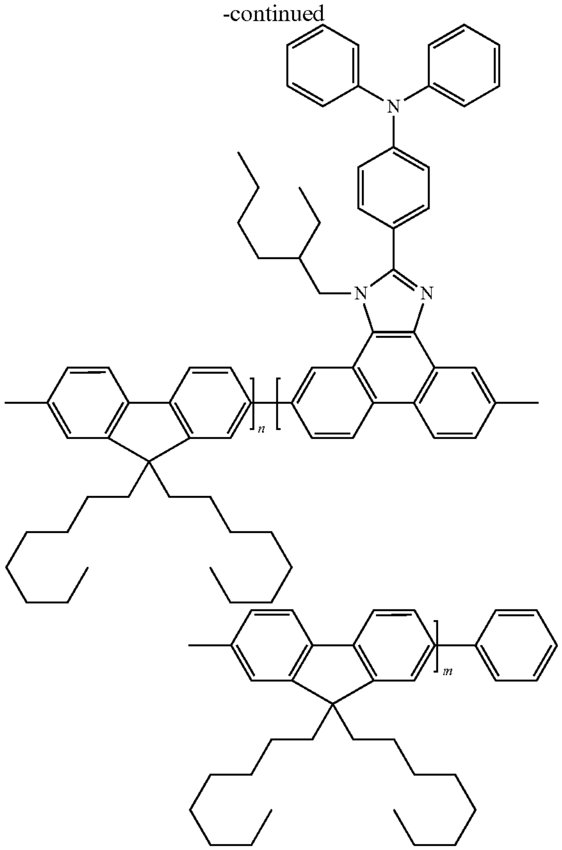

with a $M_w$ = 87 924, PD = 3.23 are excluded.

2. A polymer according to claim 1, comprising repeating units of the formula X, or XI, wherein $R^1$ and $R^4$ are hydrogen, $R^2$, $R^3$, $R^5$ and $R^6$ are independently of each other H, $C_1$-$C_{18}$alkyl, $C_1$-$C_{18}$alkyl which is interrupted by D, $C_1$-$C_{18}$perfluoroalkyl, $C_1$-$C_{18}$alkoxy, $C_1$-$C_{18}$alkoxy which is interrupted by D, $C_7$-$C_{25}$aralkyl, or a group —$X^2$—$R^{18}$, $R^8$ and $R^9$ are independently of each other H, $C_1$-$C_{18}$alkyl, $C_1$-$C_{18}$alkyl which is interrupted by D, $C_1$-$C_{18}$perfluoroalkyl, $C_1$-$C_{18}$alkoxy, $C_1$-$C_{18}$alkoxy which is interrupted by D, or a group —$X^2$—$R^{18}$, or two substituents $R^2$ and $R^3$ and/or $R^5$ and $R^6$, which are adjacent to each other, together form a group

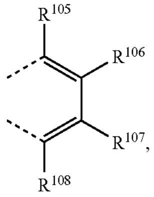

or two substituents $R^5$ and $R^3$, which are adjacent to each other, together form a group

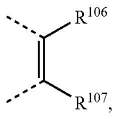

wherein $R^{105}$, $R^{106}$, $R^{107}$ and —$R^{108}$ are independently of each other H, or $C_1$-$C_8$alkyl, or $R^8$ and $R^9$ together form a group

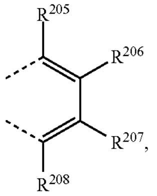

or

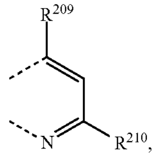

wherein $R^{205}$, $R^{206}$, $R^{207}$, $R^{208}$, $R^{209}$ and $R^{210}$ are independently of each other H, $C_1$-$C_{18}$alkyl, $C_1$-$C_{18}$alkyl which is substituted by E and/or interrupted by D, $C_1$-$C_{18}$alkoxy, or $C_1$-$C_{18}$alkoxy which is substituted by E and/or interrupted by D, $C_1$-$C_{18}$perfluoroalkyl, $R^{10}$ is H, $C_6$-$C_{18}$aryl, which can be substituted by G, $C_2$-$C_{18}$heteroaryl, which can be substituted by G, $C_1$-$C_{18}$alkyl, $C_1$-$C_{18}$alkyl which is interrupted by D, $C_1$-$C_{18}$perfluoroalkyl, $C_1$-$C_{18}$alkoxy, $C_1$-$C_{18}$alkoxy which is substituted by E and/or interrupted by D, or a group wherein —$X^2$—$R^{18}$, $X^2$ is a spacerselected from $C_6$-$C_{12}$aryl, or $C_6$-$C_{12}$heteroaryl, which can be substituted one, or more times with $C_1$-$C_{18}$alkyl, $C_1$-$C_{18}$alkyl which is interrupted by D, $C_1$-$C_{18}$perfluoroalkyl, $C_1$-$C_{18}$alkoxy, or $C_1$-$C_{18}$alkoxy which is substituted by E and/or interrupted by D, and $R^{18}$ is H, $C_1$-$C_{18}$alkyl, $C_1$-$C_{18}$alkyl which is interrupted by D, $C_1$-$C_{18}$perfluoroalkyl, $C_1$-$C_{18}$alkoxy, $C_1$-$C_{18}$alkoxy which is interrupted by D, or —$NR^{25}R^{26}$;

D is —CO—; —COO—; —S—; —SO—; —$SO_2$—; —O—; —$NR^{25}$—; —$CR^{23}$=$CR^{24}$—; or —C≡C—; wherein $R^{23}$; $R^{24}$, $R^{25}$ and $R^{26}$ are independently of each other H; $C_6$-$C_{18}$aryl; $C_6$-$C_{18}$aryl which is substituted by $C_1$-$C_8$alkyl, or $C_1$-$C_8$alkoxy; $C_1$-$C_8$alkyl; or $C_1$-$C_8$alkyl which is interrupted by —O—, or $R^{25}$ and $R^{26}$ together form a five or six membered ring, or $R^{105}$, $R^{106}$, $R^{107}$, $R^{108}$, $R^{205}$, $R^{206}$, $R^{207}$, $R^{208}$, $R^{209}$, $R^{210}$, $R^8$, $R^9$, and/or $R^{10}$ is a group -$(Sp)_{x1}$-HEI, with the proviso that at least one of the substituents $R^{105}$, $R^{106}$, $R^{107}$, $R^{108}$, $R^{205}$, $R^{206}$, $R^{207}$, $R^{208}$, $R^{209}$, $R^{210}$, $R^8$, $R^9$, or $R^{10}$ is a group -$(Sp)_{x1}$-HEI.

3. A polymer according to claim 1, comprising repeating units of the formula (XIIa)

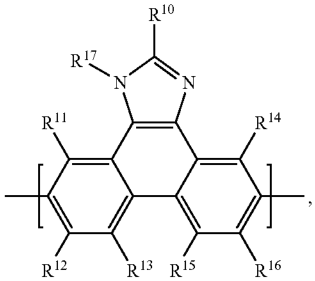

, and/or (XIIb)

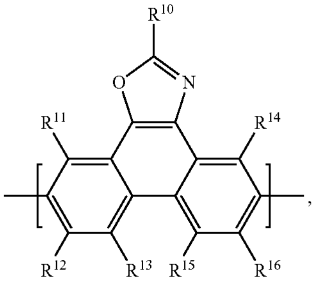

, wherein $R^{10}$ is H, $C_6$-$C_{18}$aryl, which can be substituted by G, $C_2$-$C_{18}$heteroaryl, which can be substituted by G, $C_1$-$C_{18}$alkyl, $C_1$-$C_{18}$alkyl which is interrupted by D, $C_1$-$C_{18}$perfluoroalkyl, $C_1$-$C_{18}$alkoxy, $C_1$-$C_{18}$alkoxy which is substituted by E and/or interrupted by D, or a group —$X^2$—$R^{18}$, wherein $X^2$ is a spacer selected from $C_6$-$C_{12}$aryl, or $C_6$-$C_{12}$heteroaryl, which can be substituted one to two times with $C_1$-$C_{18}$alkyl, $C_1$-$C_{18}$alkyl which is interrupted by D, $C_1$-$C_{18}$perfluoroalkyl, $C_1$-$C_{18}$alkoxy, or $C_1$-$C_{18}$alkoxy which is substituted by E and/or interrupted by D, and $R^{18}$ is H, $C_1$-$C_{18}$alkyl, $C_1$-$C_{18}$alkyl which is interrupted by D, $C_1$-$C_{18}$perfluoroalkyl, $C_1$-$C_{18}$alkoxy, $C_1$-$C_{18}$alkoxy which is interrupted by D, or —$NR^{25}R^{26}$—;

$R^{11}$ and $R^{14}$ are hydrogen, $R^{12}$, $R^{13}$, $R^{15}$ and $R^{16}$ are hydrogen, $R^{17}$ is $C_6$-$C_{18}$aryl; $C_6$-$C_{18}$aryl which is substituted by $C_1$-$C_{18}$alkyl, $C_1$-$C_{18}$perfluoroalkyl, or $C_1$-$C_{18}$alkoxy; $C_1$-$C_{18}$alkyl; or $C_1$-$C_{18}$alkyl which is interrupted by —O—; or two substituents $R^{12}$ and $R^{13}$, and/or $R^{15}$ and $R^{16}$, which are adjacent to each other, together form a group

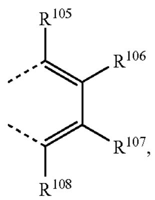

or two substituents $R^{15}$ and $R^{13}$, which are adjacent to each other, together form a group

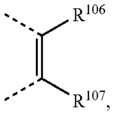

wherein $R^{105}$, $R^{106}$, $R^{107}$ and $R^{108}$ are independently of each other H, or $C_1$-$C_8$alkyl, D is —S—; —O—; or —$NR^{25}$—;

E is —$OR^{29}$; —$SR^{29}$; —$NR^{25}R^{26}$; —CN; or F; G is E, $C_1$-$C_{18}$alkyl, $C_1$-$C_{18}$alkyl which is interrupted by D, $C_1$-$C_{18}$perfluoroalkyl, $C_1$-$C_{18}$alkoxy, or $C_1$-$C_{18}$alkoxy which is substituted by E and/or interrupted by D, wherein $R^{25}$ and $R^{26}$ are independently of each other H; $C_6$-$C_{18}$aryl; $C_6$-$C_{18}$aryl which is substituted by $C_1$-$C_8$alkyl, or $C_1$-$C_8$alkoxy; $C_1$-$C_8$alkyl; or $C_1$-$C_8$alkyl which is interrupted by —O—, or $R^{25}$ and $R^{26}$ together form a five or six membered ring, and $R^{29}$ is $C_6$-$C_{18}$aryl; $C_6$-$C_{18}$aryl, which is substituted by $C_1$-$C_{18}$alkyl, or $C_1$-$C_{18}$alkoxy; $C_1$-$C_{18}$alkyl; or $C_1$-$C_{18}$alkyl which is interrupted by —O—; or $R^{10}$, and/or $R^{17}$ is a group -$(Sp)_{x1}$-HEI, with the proviso that at least one of the substituents $R^{10}$, or $R^{17}$ is a group -$(Sp)_{x1}$-HEI.

4. The polymer according to claim 1, wherein Sp is selected from —$(CR^{147}R^{148})_{n20}$—, —$(Y(CR^{147}R^{148})_{n21})_{n20}$—, or —$((CR^{147}R^{148})_{n21}Y)_{n20}$—, -Ar-Alk-, -Alk-Ar-, or -Alk-Ar-Alk-, wherein Y is $NR^{149}$, O, S, C═O, C(═O)O, wherein $R^{149}$ is H; $C_6$-$C_{18}$aryl; $C_6$-$C_{18}$aryl which is substituted by $C_1$-$C_{18}$alkyl, or $C_1$-$C_{18}$alkoxy; $C_1$-$C_{18}$alkyl; or $C_1$-$C_{18}$alkyl which is interrupted by —O—;

$R^{147}$ and $R^{148}$ are independently of each other hydrogen, fluorine, or $C_1$-$C_{20}$alkyl, n20 is an integer of 1 to 20, n21 is 1, 2, or 3;

Ar is cycloalkylen, arylen, aralkylene, or heteroarylen, which can optionally be substituted, Alk is selected from the group consisting of

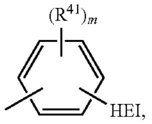

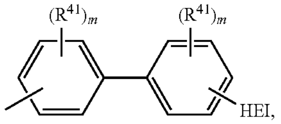

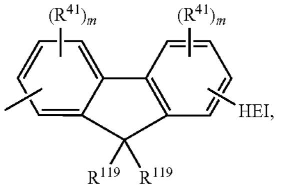

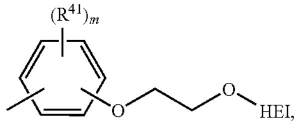

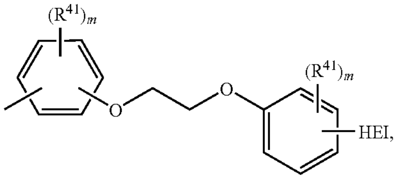

—$OCH_2CH_2O$-HEI, —$O(CH_2CH_2O)_2$-HEI, —$O(CH_2CH_2O)_3$-HEI, and —$OCH_2CH(OR^{69})CH_2O$-HEI, wherein $R^{69}$ is $C_1$-$C_{18}$alkoxy.

5. An electronic device or a component therefore, comprising the polymer according claim 1.

6. An electronic device or a component according to claim 5 which is a polymer light emitting diode, organic integrated circuit, organic field effect transistor, organic thin film transistor, organic solar cell, thermoelectric device, electrochromic device, or organic laser diode.

7. Polymer light emitting diodes, comprising one or more of the polymers according to claim 1 as electroluminescent material.

* * * * *